United States Patent [19]
Komarek et al.

[11] Patent Number: 5,907,517
[45] Date of Patent: May 25, 1999

[54] MEMORY CIRCUIT YIELD GENERATOR AND TIMING ADJUSTOR

[75] Inventors: James A. Komarek, Newport Beach; Clarence W. Padgett, Westminster, both of Calif.

[73] Assignee: Creative Integrated Systems, Inc., Santa Ana, Calif.

[21] Appl. No.: 08/967,878

[22] Filed: Nov. 12, 1997

Related U.S. Application Data

[60] Division of application No. 08/721,342, Sep. 26, 1996, Pat. No. 5,732,035, which is a continuation-in-part of application No. 07/538,185, Jun. 14, 1990, abandoned.

[51] Int. Cl.⁶ .................................................. G11C 7/02
[52] U.S. Cl. .................... 365/210; 365/205; 365/189.07; 365/225.7
[58] Field of Search .................................... 365/210, 205, 365/203, 104, 189.07, 225.7

[56] References Cited

U.S. PATENT DOCUMENTS 4,658,382  4/1987  Tran et al. ............................ 365/203

*Primary Examiner*—Huan Hoang
*Attorney, Agent, or Firm*—Daniel L. Dawes

[57] ABSTRACT

Incremental values of a plurality of capacitors are programmably coupled through ROM core FETs with selective threshold voltages, EPROM core FETs, RAM cells, ROM fuse links or antifuse ROM links to a dummy bit line. The dummy bit line carries a bit line voltage to simulate either the worst case logical one or worst case logical zero within a read-only memory array of memory cells. The dummy bit line voltage is used as a control signal to a trigger circuit. The trigger circuit generates at the appropriate threshold a triggering signal used to control sense amplifiers coupled to the memory circuit. Therefore, by programmably altering the delay time on the dummy bit line, the read cycle of the memory can be programmably altered to either minimize the read time cycle to provide a fast, high quality memory product, or to maximize the read time cycle to provide for a slower but higher yield memory product at less expense.

4 Claims, 35 Drawing Sheets

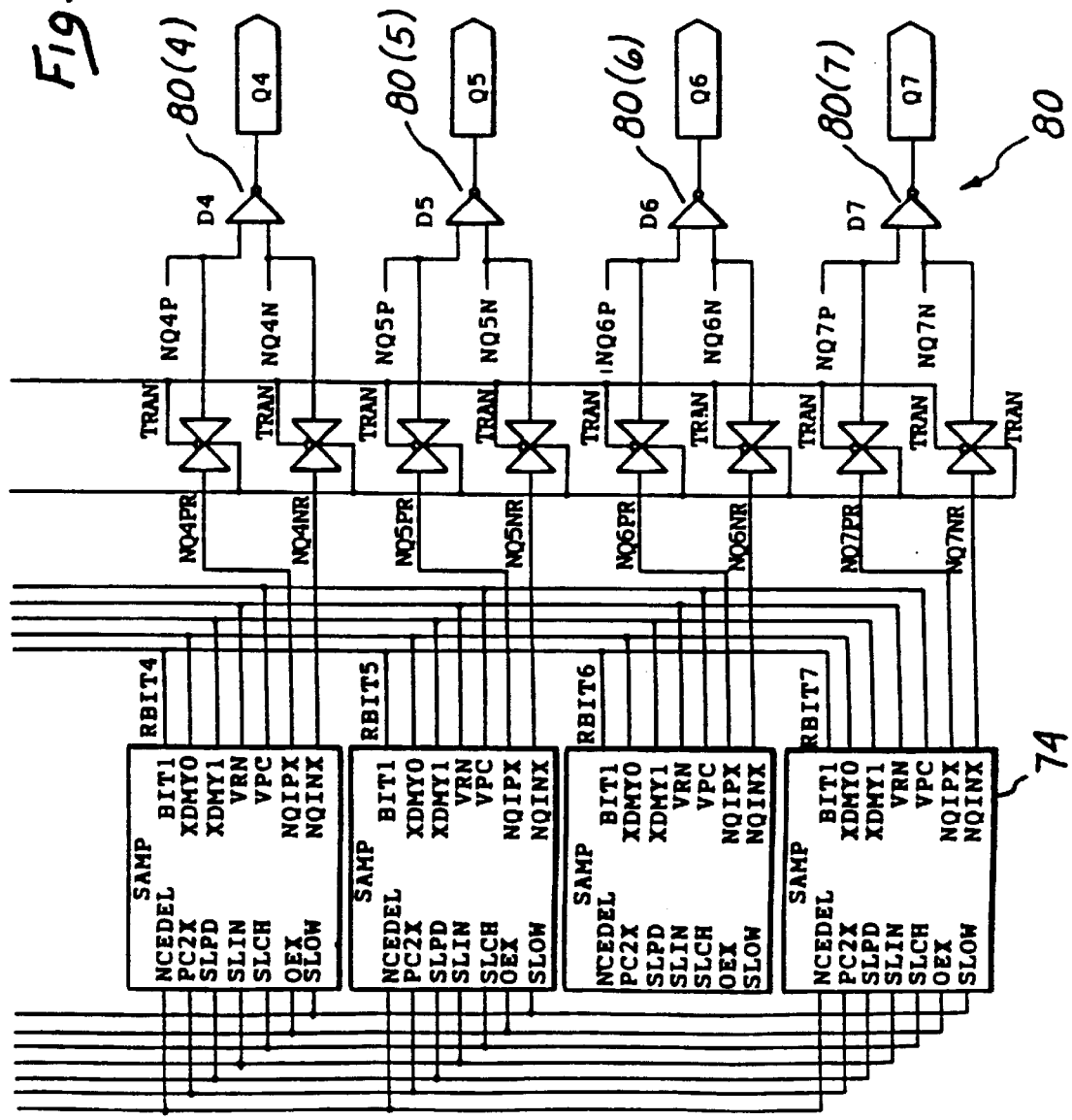

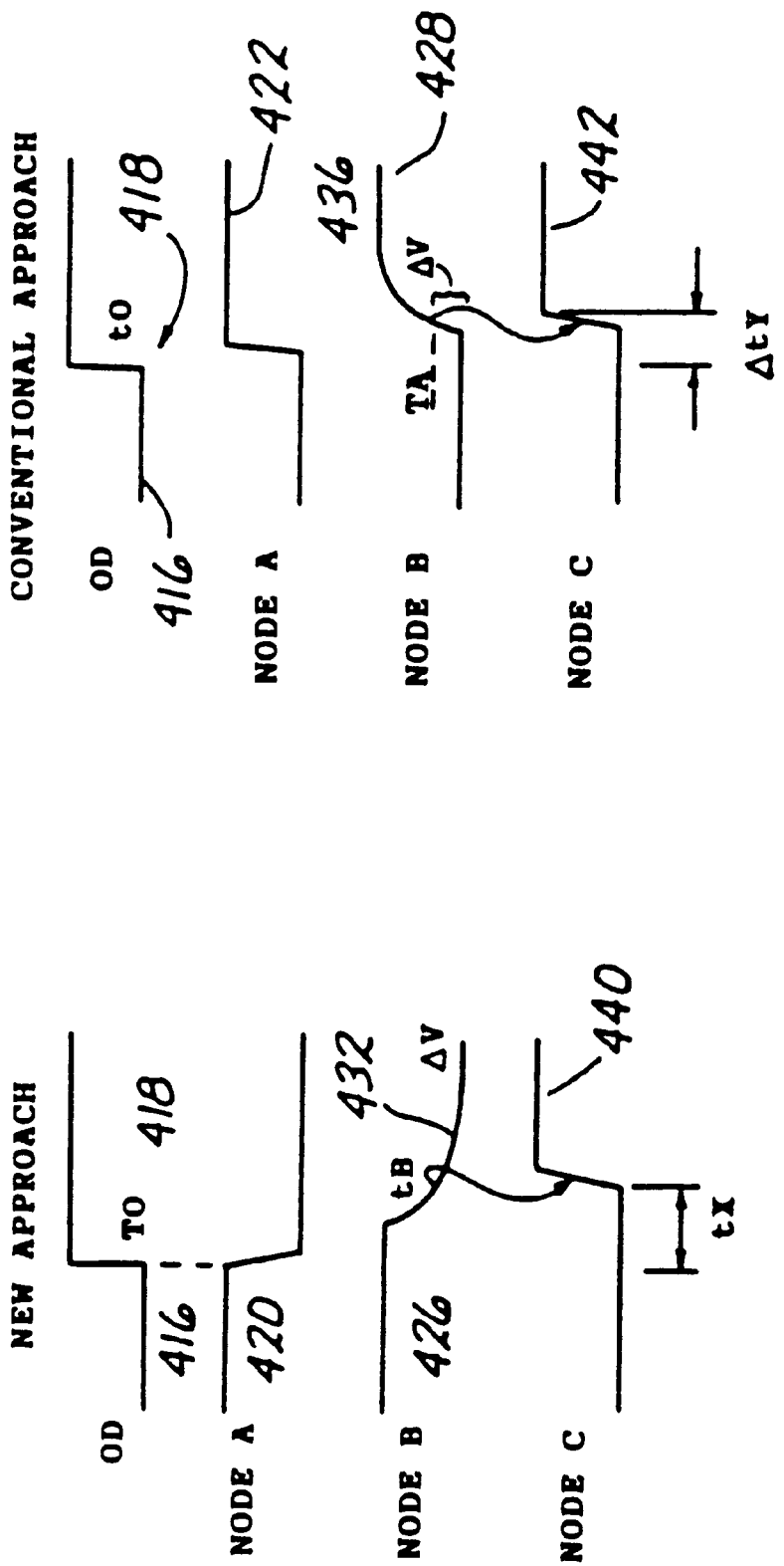

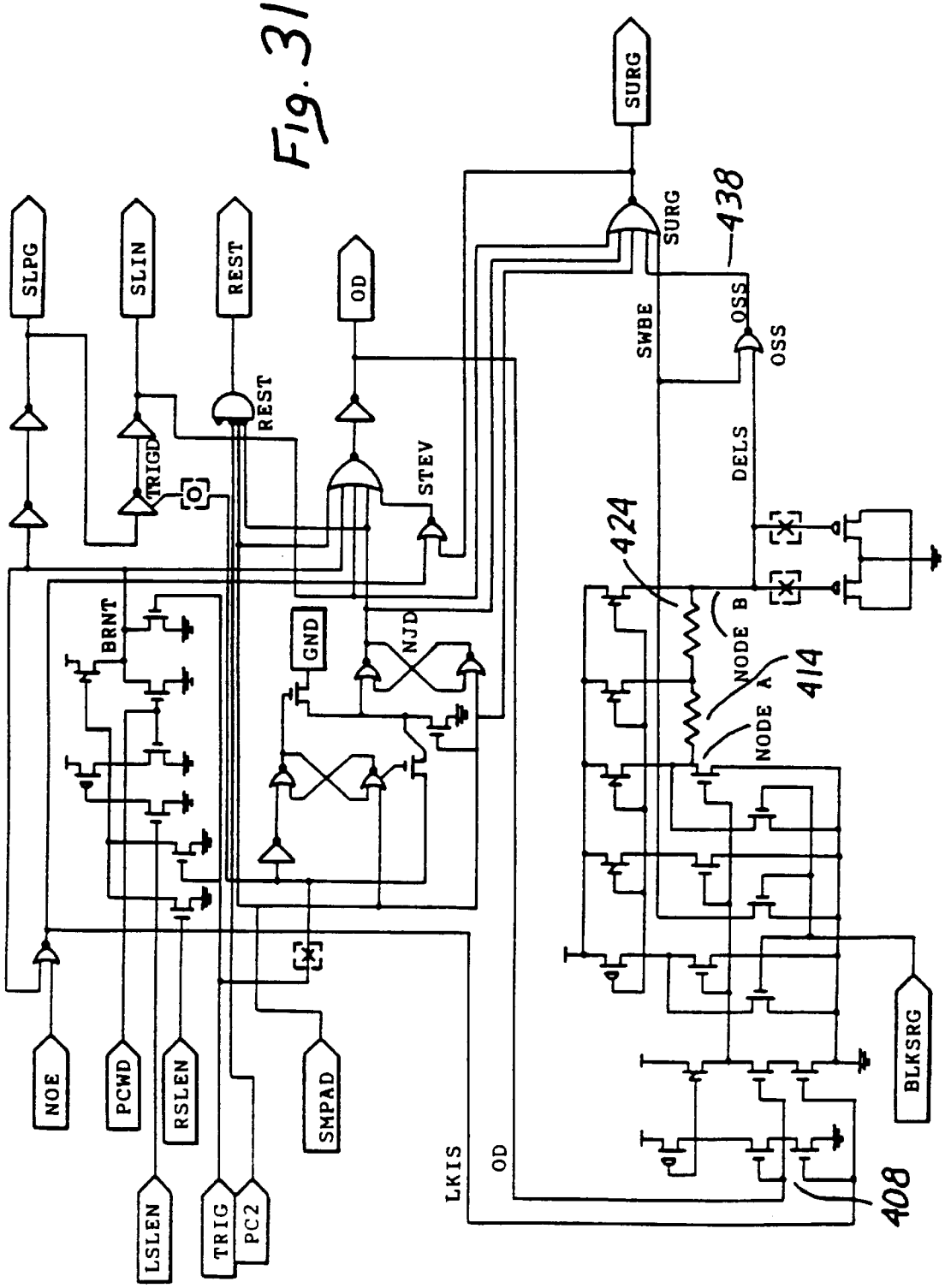

5,907,517

MEMORY CIRCUIT YIELD GENERATOR AND TIMING ADJUSTOR

RELATED CASES

This application is a division of application Ser. No. 08/721,342 filed Sep. 26,1996 which application is now; U.S. Pat. No. 5,732,035, which application is a continuation-in-part of U.S. patent application, Ser. No. 07/538,185, filed Jun. 14, 1990, now abandoned, entitled Improved Semiconductor Read-Only VLSI Memory, which is incorporated herein by reference.

BACKGROUND OF THE INVENTION

1. Field of the Invention

The invention relates to improvements in a read-only memory. In particular the invention relates to a VLSI memory array precharge improvement, a latch circuit improvement to minimize metastability in dynamic digital circuits,

2. Description of the Prior Art

Memory Array Precharge

FIG. 19 of the parent application referenced above shows a precharged circuit whose operation is illustrated in the timing diagram of FIG. 20 of that same application. The architecture of this memory array is comprised of four blocks: (1) a Y-decoder block for the high address portion; (2) a Y-decoder block for the low address portion; (3) a memory cell block; and (4) a precharge block. The memory array is provided with a precharge voltage, VPC. Charging and discharging the bit lines are controlled by the signals, SELV, PCO, PC1 and PC2.

PC2 serves to precharge the bit line from the memory array itself. PC2 provides a bit charge which charges only selected bit lines which are connected to a sense amplifier to a certain precharge level.

PC1 is then coupled in common to the gates of a plurality of precharged transistors which are coupled in series with each virtual ground line and bit line within the memory cell block. PC1 is therefore used as a blanket precharge and charges all bit lines and source side select lines to a predetermined charge level.

PC0 is coupled in common to the gates of the precharged transistors within the memory array, which transistors are coupled between adjacent bit lines in the array similar to that as shown in FIG. 18 of the parent application incorporated above. The precharged transistors short each of the bit lines together to allow a precharge to be coupled through the transistors to all the bit lines within the memory block. PC0 is therefore a bank precharge signal. PC0 charges all the bit lines in a selected bank which are precharged and shorted together so that the previous charge from any previously selected memory cell access within the block is eliminated. The bit lines are precharged equally with a predetermined precharged level.

The control signal, SELV, is a select virtual ground command which pulls the source side of a selected memory cell bit to ground level.

The address lines YDLi and YDUi, corresponding to the lower and upper address bits, are typically low during precharge. Only one address line YDUi and one address line YDUi are driven high during the evaluate or read cycle.

Metastable Latch Circuit

In memory circuits or other dynamic digital circuits, latches are used to accepts various signals, such as addresses to implement the read or write signal with proper timing. In some cases the latch is likely to fall into a metastable state which can cause a dynamic ROM, for example, not to accept any new address transitions or to cause a dynamic ROM to output incorrect data. To avoid latch contentions design modifications of the latches are used which introduce time delays. These delays then must be accommodated by the logic design of the architecture. What is needed is a latch design which is not susceptible to failure in latch contentions and which is transparent insofar as the timing of the circuitry is concerned.

Data Multiplexing in Very Large Scale Integrated Memories with Optimum Operating Speed FIG. 6 illustrates a typical prior art, read-only memory in which the memory core is divided into a left core half 62 and right core half 64. Each core half 62 and 64 produces eight bits or one byte of the output word. The bytes are multiplexed through a multiplexer 66 whose output is coupled to a sense amplifier 68. The output of the sense amplifier in turn is provided as an input to a driver circuit 70 whose output is connected to the output pads 72 to communicate the left and right bytes in sequence to the outside environment, typically a bus.

The disadvantages of the prior art approach as shown in FIG. 6 is that both halves of the memory core 62 and 64 must be powered up and coupled through multiplexer 66 to sense amplifier 68. The chip layout for this coupling is geometrically complex and generally introduces opportunities for undesirable parasitic effects. The generation of internal noise voltages within the two memory core halves 62 and 64 also creates an inherent limitation to circuit speed.

Therefore, what is needed is a memory organization and supporting sense amplifier and multiplexer circuitry which overcomes these defects.

A One Shot Pulse Generator for a Very Large Scale Integrated Memory Precharge Time Control The parent application upon which this depends shows the advantages of dynamic precharge and blanket precharge of all the core elements within a very large scale integrated read only memory. A typical approach to generate the timing signals is depicted in FIG. 12. The logic circuitry of FIG. 12 determines when to switch the precharge clock PC0 to a logical zero as measured from the start of the memory cycle by means of several cascaded logic gates. The propagation delay time through the cascaded gates determines when PC0 will be switched low. The prior art design of FIG. 12 is, however, ill adapted for a CMOS circuitry and more generally is difficult to provide an optimum precharge time for the ROM core because timing control, which is subject to process variations, temperature and supply voltage variations, is very approximate.

Therefore, what is needed is a circuit which will overcome each of the defects of a memory precharge timing circuit as exemplified by the prior art of FIG. 12.

CMOS Trigger Circuit

A typical NMOS ROM trigger circuit is shown in FIG. 24 of the parent application and uses two inputs and has one output which switches or triggers from a logical zero to a logical one when the input ramps downwardly relatively slowly to about 0.2 volts less than the second input.

What is needed is a CMOS sense circuit which includes an automatic quick power-down to zero after the output switches have switched to a logical one. Further, also what is need is a trigger circuit which can trigger on less than 0.2 voltage difference in the inputs.

One-shot Pulse Generator for VLSI Memory Timing Control

FIG. 21 in the copending parent application shows NMOS ROM timing control circuit which determines by means of a word dummy line and associated control logic gates the time at which to switch the precharge clock, PC0, to 0 as measured from the start of a memory cycle. The precharge clock, PC0, is not switched to 0 until the output of the dummy word line delay circuit, OWUP, has switched low.

This design is not compatible with CMOS processing and requires the use of two dummy word lines. The prior art circuit also has no means for powering-down when inactive and therefore continues to use power even when inactive. Therefore, what is needed is a timing control circuit which is not subject to each of these limitations of the prior art.

RC Delay Circuit To Block Address Transition Detection

Means have previously been described in the parent copending application for blocking address transition detection at the time that output buffers are changing through the use of a timing circuit whose output is SURG. However, the circuitry there described in connection with FIG. 35 of the copending parent application is not adapted to a CMOS process, and is based upon logic gates and inherent delays in those gates. These delays are subject to variations in process parameters and operating voltages. Therefore, what is needed is a delay circuit which can block address transition detection in a controlled manner without being subject to these process and operating voltage variations.

CMOS Sense Amplifier/Latch Circuit for a Single Data Input Signal

The NMOS read-only memory sense amplifier described in the parent application upon which this application copends used four inputs and had a latch function. This design is ill adapted to the CMOS environment. Further, improved data latch operation would be desired to provide some type of means for increasing immunity to bit line noise. Still further, it would be advantageous to power-down the sense amplifier to zero power dissipation while retaining the latched data.

A Low Noise X Decoder Circuit for Use in a Semiconductor Memory

X decoders used in addressing memories provide a selection function by which a particular polysilicon or polycide word line is moved from a lower, offvoltage state to a higher on-voltage state with all word lines held low. The particular word line which is selected is determined according to the voltages or signals on the multiple address input lines. Each unique combination or configuration of addresses selects one unique word line. Conventional read-only memories, random access memories or programmable read-only memories have X decoders which are designed using stages of logic gates, NAND and NOR gates followed by buffers. In the case of NMOS technology, voltage pumps are used to insure full scale voltage expressions.

This prior art approach is particularly susceptible to noise of a type which the present invention suppresses. Noise in the X decoder is a product of the decoder design and becomes apparent in very large memories which are now beginning to be built.

Therefore, what is needed is a means for suppressing the unique type of electrical noise which occurs in these types of X decoders.

Improved Tune Constant Generation Circuit

The accurate control of circuits used in semiconductor memories is based upon the availability of a stable time reference. Typically, for the sake of simplicity and cost, an RC time circuit is provided using integrated resistive and capacitive elements. Typical prior art approaches for creating time delays have used: (1) pair delay integrated circuit logic elements; (2) RC time delay using integrated elements; (3) RC time delays using hand-selected resistive and/or capacitive external element; and (4) crystal based tuning elements using external crystals and connectors. Each of these supposes varying cost and accuracy proportionately with the first approach being the least costly and accurate and the last being the most costly and accurate.

What is needed is a means for utilizing low cost timing approaches such as described in the first and second options above, but to do so with accurate results not typical of those prior art approaches.

Memory Circuit Yield Generator and Timing Adjustor

The use of a dummy decoder in a semiconductor memory to obtain an optimum sense time and to provide adjustment for device leakage, capacitance loading, transistor characteristics and the like is well known. However, no means has been devised to provide for higher production yields in such dummy decoders when the circuit being produced had a slower speed requirement.

BRIEF SUMMARY OF THE INVENTION

Memory Array Precharge

The invention is an improvement in a read only memory comprising a memory core having a plurality of memory cells. The memory cells are accessed at least in part by selection of corresponding bit lines and virtual ground lines. The improvement comprises a top precharging circuit for precharging the ROM core as controlled by a first precharge clock. The top precharging circuit is physically disposed at a first end of the bit lines and of virtual ground lines disposed in the ROM core. The bottom precharging circuit is coupled to the ROM core for precharging the bit lines and virtual ground lines and is controlled by a second precharge clock. The bottom precharge circuit is disposed in the ROM core at an opposing end of the bit lines and ground lines opposite from the first end of the bit lines and virtual ground lines. As a result, precharging time for the ROM core is significantly reduced.

The improvement further comprises a predecoder circuit. The predecoder circuit is controlled by the second precharge clock. A second clock signal is generated by the second precharge clock causing the predecoder to precharge the ROM core through the bottom precharge circuit. The predecoder circuit further provides decoded bit line and virtual ground line select signals for reading the ROM core when the second clock signal is inactive.

The predecoder circuit is comprised of a lower address predecoder circuit and an upper address predecoder circuit. Precharging of the ROM core is performed in both the upper address predecoder circuit and the lower address predecoder circuit.

The lower address predecoder circuit selects bit lines and adjacent virtual ground lines in the ROM core for precharging through the upper address predecoder circuit.

The invention is also characterized as an improvement in a method performed in a read only memory comprising a memory core having a plurality of memory cells. As before the memory cells are accessed at least in part by selection of corresponding bit lines and virtual ground lines. The improvement comprises the steps of precharging the ROM core as controlled by a first precharge clock at a first end of the bit lines and of virtual ground lines disposed in the ROM core. The bit lines and virtual ground lines are precharged as controlled by a second precharge clock at an opposing end of the bit lines and ground lines opposite from the first end of the bit lines and virtual ground lines. As a result, precharging time for the ROM core is significantly reduced.

The improvement further comprises the step of providing decoded bit line and virtual ground line select signals for reading the ROM core when the second clock signal is inactive. The step of providing decoded bit line and virtual ground line select signals for reading the ROM core comprises the steps of precharging of the ROM core by circuit of an upper address predecoder and the lower address predecoder.

The improvement further comprises the step of selecting a bit line and adjacent virtual ground lines in the ROM core for precharging through the upper address predecoder circuit A Latch Circuit Improvement to Minimize Metastability in Dynamic Digital Circuits The invention is an improvement in a digital dynamic circuit comprising a first circuit for receiving an address transition detection (ATD) signal and selectively outputting its inverse (NSMPA). A second circuit generates an address sample signal (SMPA) in response to receipt of output of the first circuit (NSMPA). A third circuit disables the first circuit in response to a ground surge control signal (SURG) so that the sample address signal (SMPA) is held logically false regardless of the logic value of the address transition detection signal (ATD). Otherwise the third circuit for selectively disabling the sample address signal permits the second circuit to be operative according to the address transition detection signal (ATD) received by the first circuit. As a result, noise generated during output driver transitions does not affect addressing within the circuit.

The first circuit for receiving the address detection signal (ATD) has a trigger point. The trigger point is defined as a signal level of the input at which the output of the first circuit will begin to change. The third circuit and the second circuit also each have corresponding trigger points. The trigger points of the first circuit and the second circuit are lower than the trigger point of the third circuit so that the first circuit and the third circuit may enter a metastable output state without triggering the second circuit which therefore does not have a metastable output condition.

The third circuit for selectively disabling the sample address signal (SMPA) and the first circuit for receiving the address transition detection signal (ATD) have unbalanced trigger points such that the first circuit is favored so that, when input signals are simultaneously received by the first circuit and the third circuit, the output of the first circuit is the ultimately prevailing output condition so that the third circuit is no longer responsive to the ground surge control signal (SURG) received by the third circuit.

The sample address signal (SMPA) is fed back to the third circuit so that metastability of the output of the third circuit is minimized.

The first circuit for receiving the address transition detection signal (ATD), and the third circuit for selectively disabling the sample address signal (SMPA) comprise a latch having as a latched input the address transition detection signal (ATD). The latch is selectively disabled by the ground surge control signal (SURG) and by a precharge okay signal, (PCOK), indicative of an appropriate memory precharge. An inverter is coupled to the output (NSMPA) of the latch to generate the sample address signal (SMPA). A disabling gate has the sample address signal (SMPA) fed back as an input to it. The disabling gate selectively passes or generates the precharge okay signal (PCOK). The disabling gate is disabled by the sample address signal (SMPA) fed back as an input thereto.

The input coupled to the address detection signal (ATD) of the latch and the input connected to the ground surge control signal (SURG) of the latch have input trigger points. The inverter also has an input trigger point. The input trigger point of the SURG input to the latch is higher than the input trigger point of the inverter or the input trigger point of the ATD input to the latch.

The trigger point of the input coupled to the address transition detection signal (ATD) is favored compared to the trigger point of the input coupled to the ground surge control signal (SURG) so that simultaneous receipt of the address detection signal (ATD) and the ground surge control signal (SURG) are always resolved within the latch to follow control of the address transition detection signal (ATD).

The invention is also an improvement in the method of operation in a digital dynamic circuit comprising the steps of: receiving an address transition detection (ATD) signal; selectively generating an address sample signal (SMPA) in response to receipt of the address transition detection signal (ATD); and disabling generation of the address sample signal (SMPA) in response to a ground surge control signal (SURG) so that the sample address signal (SMPA) is held logically false regardless of the logic value of the address transition detection signal (ATD). Otherwise the sample address signal is selectively disabled according to whether the address transition detection signal (ATD) is received. As a result, noise generated during ROM data output transitions does not affect addressing within the circuit.

In the step of selectively generating the address sample signal (SMPA) in response to receipt of the address transition detection signal (ATD), a trigger point is defined as a signal level of the input at which the address sample signal (SMPA) will begin to change. The step of disabling also has a corresponding trigger point defined. The trigger point of the step of disabling is higher than the trigger point of the step of selectively generating SMPA. However, a metastable output state may be entered in response to receipt of the address transition detection signal (ATD) and the address sample signal (SMPA) when these two signals are skewed such that they reach the respective trigger points simultaneously. The unbalanced trigger points result in the metastable voltage level of NSMPA being higher than the metastable level of PASS. Having the trigger point of the second circuit less than the metastable voltage level of NSMPA means that the output of the second circuit (SMPA) does not have a metastable output condition.

The step of selectively disabling the sample address signal (SMPA) and the step of receiving the address transition detection signal (ATD) have unbalanced trigger points such that the step of generating is favored so that, when input signals are simultaneously received to caused an address transition detection (ATD) and to disable generation of the sample address signal (SMPA), the step of generating is the ultimately prevailing step and output condition so that receipt of the transition detection signal (ATD) is allowed to cause an output (SMPA).

The improvement further comprises the step of feeding back the sample address signal (SMPA) to selectively enable the step of disabling so that metastability of the step of disabling is minimized.

The steps of receiving the address transition detection signal (ATD), selectively generating the sample address signal (SMPA), and selectively disabling the sample address signal (SMPA) comprise the step of latching the address transition detection signal (ATD) as a latched input. The latch being selectively disabled by the ground surge control signal (SURG) and by a precharge okay signal (PCOK), indicative of an appropriate memory precharge. The output of the latch is inverted to generate the sample address signal (SMPA). The sample address signal (SMPA) is selectively fed back to selectively pass the precharge okay signal (PCOK) to thus selectively disable the step of latching.

The step of latching in response to the address detection signal (ATD) as controlled by the ground surge control signal (SURG) has input trigger points defined in the address detection signal (ATD) and the ground surge control signal (SURG). The step of inverting also has an input trigger point. The input trigger points of the step of latching have one higher (SURG) and one equal (ATD) to the input trigger point of the step of inverting.

Data Multiplexing in Very Large Scale Integrated Memories with Optimum Operating Speed The invention is an improvement in a read only memory having a left and right core portion comprising a first plurality of sense amplifiers coupled to the left core portion of the read only memory. A second plurality of sense amplifiers are coupled to the right core portion of the read only memory. A multiplexer is coupled to the outputs of the first and second plurality of sense amplifiers for selecting only the left or the right core portions of the read only memory data for coupling through the multiplexer. A plurality of output drivers are coupled to the multiplexer for providing output signals from corresponding multiplexed ones of the sense amplifiers coupled to the left or right core portions of the read only memory. As a result, power dissipation within the read only memory is reduced, and internal noise voltages within the read only memory are reduced.

The first and second plurality of sense amplifiers are physically coupled in close proximity to the left and right core portions of the read only memory to reduce parasitic capacitance in the coupling between the core portions and the first and second plurality of sense amplifiers.

The multiplexer comprises a corresponding first and second plurality of transfer gates coupled respectively to the first and second plurality of sense amplifiers. The first and second plurality of transfer gates are selectively disabled according to whether the left or right core portion of the read only memory is selected.

Each of the transfer gates of the first and second plurality of transfer gates is a CMOS gate comprising an NFET and PFET. The NFET and PFET are selectively controlled to permit transfer of logic signals through the transfer gate according to the selection of the left or right core portion of the read only memory. The plurality of output circuit are CMOS output drivers comprising a PFET and NFET. The NFET and PFET in the output driver are controlled by a corresponding gate signal from one of the plurality of transfer gates.

The multiplexer has a predetermined rise time and fall time relative to its switching. The predetermined rise time and fall time of the multiplexer are selected so that the plurality of output drivers driven by the multiplexer have a reduced ground bounce and voltage source bounce.

The invention is also an improvement in a method for reading a read only memory comprising the steps of selecting one of a left and right core portion of the read only memory, and coupling the selected core portion directly to a corresponding sense amplifier in close physical proximity to the selected core portion to reduce parasitic capacitance and thereby increase operational speeds. The method further comprises the steps of multiplexing the outputs of the sense amplifiers to a plurality of output drivers to read out the contents of the selected core portion of the read only memory. The method still further comprises the step of controlling rise times and fall times of the sense amplifiers multiplexed to the output drivers so that ground bounce and supply voltage bounce caused by the output drivers, by virtue of switching during the step of multiplexing, is minimized.

A One Shot Pulse Generator for a Very Large Scale Integrated Memory Precharge Time Control The invention is an improvement in a precharge timing circuit for a read only memory core for generating a precharge signal PCOK, comprising a circuit element for generating a delayed trigger signal, DMYSECPC, in response to initiation of a memory cycle within the ROM core in a manner simulative of precharging of the main core ROM to compensate for process variations, temperature and supply voltage variations. Another circuit element detects when the delayed trigger signal reaches a predetermined voltage difference from a reference precharge voltage, VPC, and for switching the PCOK signal to logical one.

The element for generating the delayed trigger signal selectively generates the delayed trigger signal to simulate precharging of at least that portion of the main core ROM coupled to a single bit line.

The element for selectively generating the delayed trigger signal in simulation of main core precharging comprises a dummy array of memory cells of that portion of the main core ROM coupled to a single bit line.

The dummy array of memory cells are programmed to delay the rise of the trigger signal DMYSECPC to approximately match precharging delays actually experienced within the main core ROM.

The predetermined voltage difference from the VPC signal which the slowly rising delayed trigger signal reaches, is approximately 0.3 volts less than the precharge voltage VPC when the delayed trigger signal is generated.

The element for detecting and switching comprises a first CMOS differential amplifier and a second CMOS differential amplifier. The first and second differential amplifiers are cascaded together. The first differential CMOS amplifier is a complementary design to that of the second CMOS differential amplifier. Complementary design is defined to mean a circuit design adapted to allow each of the principal NFETs within one CMOS differential amplifier to be replaced with a PFET and vice-versa for each corresponding circuit element within the first and second CMOS differential amplifiers without affecting operability of the design The first differential amplifier has outputs coupled directly to inputs of the second differential amplifier. The improvement further comprises a CMOS inverter. The CMOS inverter has inputs directly coupled to the outputs of the second CMOS differential amplifier.

The first and second differential amplifiers have input trigger level voltages. The trigger level voltages are adapted for presetting at predetermined levels by varying channel sizes within input FETs within the first and second differential amplifiers. The trigger level voltage of the first and second amplifiers is defined as having that magnitude which switches the output of the inverter to one-half of the supply voltage, VDD.

The trigger level voltage can be set at an increased value. The first and second differential amplifiers each have a high gain The high gain of the differential amplifiers is selected to produce the increased trigger level voltage within the inverter. In one embodiment the predetermined voltage is equal to or less than 0.1 volts below the precharge voltage of VPC.

The improvement further comprises a circuit element for powering down the dummy ROM memory core array in response to an inverted chip enable signal, NCE, by driving the precharge signal PCOK to VDD. The element for powering down operates with zero power dissipation once the PCOK signal is driven to VDD.

The invention is also an improvement in a method for generating a precharge signal for a ROM memory core comprising the steps of discharging a delayed trigger signal in a dummy memory array simulative of at least that portion of the main ROM core coupled to a single bit line; presetting the precharge signal PCOK, to a logical zero; precharging the delayed trigger signal DMYSECPC, toward a voltage precharge signal, VPC, with a time delay simulative of the portion of the main ROM core; and triggering the PCOK signal high with a fast rise time when the delayed trigger signal DMYSECPC, has reached a predetermined trigger level below the precharge signal VPC. As a result, the precharge signal PCOK is generated with a time delay simulative of the portion of the main ROM core with optimal tracking for process variations, temperature and supply voltage variations.

The step of precharging the delay trigger signal DMYSECPC, is at a rate depending upon preprogramming of the dummy memory array.

The step of triggering PCOK signal high is comprised of the steps of driving two complementary CMOS differential amplifiers cascaded together in response to the delayed trigger signal DMYSECPC, to generate an output from the cascaded pair of CMOS differential amplifiers and triggering a CMOS inverter directly coupled to the differential pair of CMOS differential amplifiers to generate the PCOK signal.

The step of triggering the cascaded CMOS differential amplifiers further comprises the step of selecting relative channel sizes of input FETs to each of the differential amplifiers to set the point of triggering to a predetermined voltage below a precharge voltage VPC.

The step of triggering comprises the steps of increasing the trigger level of the CMOS inverter and setting the gain of the CMOS differential amplifiers at a high level to match the increased level of the CMOS inverter and to trigger the CMOS inverter at a predetermined voltage below the precharge voltage VPC.

CMOS Trigger Circuit

The invention is an improvement in a trigger circuit for a read-only memory core for generating a trigger signal, TRIG. The read-only memory core includes bit lines and dummy bit lines with memory cells coupled to the bit lines and dummy bit lines. The improvement comprises a circuit for detecting when a memory signal DMY1, reaches a predetermined voltage difference from a logical zero voltage level defined by a memory signal DMY0. The memory signals DMY1 and DMY0 are generated on the corresponding dummy bit lines in the read-only memory core. The corresponding dummy bit lines are coupled to the memory cells which have been programmed to prevent DMY0 from discharging during a read cycle of the read-only memory core and to discharge DMY1 to a voltage level approximately 0.2 volt or less below a precharge voltage, VPC. The DMY1 signal defines a logical one voltage level. A circuit is provided for switching the trigger signal TRIG, to a logical one. The memory signal, DMY1, has PN junction leakage current and coupled noise voltages similar to one of the bit lines in the read-only memory core.

The circuit for detecting comprises a first CMOS differential amplifier and a second CMOS differential amplifier. The first and second differential amplifiers are cascaded together. The first differential CMOS amplifier is a complementary design to that of the second CMOS differential amplifier. Complementary design is defined as a circuit design adapted to allow each of the principal NFETs within one CMOS differential amplifier to be replaced with a PFET and vice-versa for each corresponding circuit element within the first and second CMOS differential amplifiers without affecting operability of the design.

The first differential amplifier has outputs coupled directly to inputs of the second differential amplifier. The circuit for switching comprises a CMOS inverter. The CMOS inverter has inputs directly coupled to the outputs of the second CMOS differential amplifier. The first and second differential amplifiers have input trigger level voltages. The trigger level voltages are adapted for presetting at predetermined levels by varying channel sizes within input FETs within the first and second differential amplifiers.

The circuit for switching comprises a CMOS inverter. The CMOS inverter has inputs directly coupled to the outputs of the second CMOS differential amplifier. The trigger level voltage of the first and second amplifiers is defined as having that magnitude which switches the output of the inverter to one-half of the supply voltage, VDD. The trigger level voltage is set at an increased value. The first and second differential amplifiers each have a high gain. The high gain of the differential amplifiers are selected to produce the increased trigger level voltage within the inverter. The predetermined voltage is equal to or less than 0.1 volts below the logical zero voltage of DMY0 and in fact may be as small as 50 mv.

The improvement further comprises a circuit for powering down the trigger circuit in response to an inverted chip enable signal NCEDEL The circuit also operates with zero power dissipation once the trigger signal, TRIG, is generated and until the end of a memory cycle. This is accomplished by the signal Sense Latch Power Down (SLPD).

The invention is also characterized as an improvement in a method for generating a trigger signal, TRIG, comprising the steps of precharging memory signals, DMY1 and DMY0, toward a voltage precharge signal VPC, with a time delay simulative the portion of the main ROM core coupled to a bit line. The trigger signal, TRIG, is preset to a logical zero. A predetermined voltage difference is differentially detected between the memory signals, DMY1 and DMY0. The trigger signal TRIG, is triggered high with a fast rise time when the difference between the memory signals, DMY1 and DMY0 has been differentially detected.

The step of differentially detecting is comprised of the steps of driving two complementary CMOS differential amplifiers cascaded together in response to the memory signals, DMY1 and DMY0, to generate an output from the cascaded pair of CMOS differential amplifiers. The step of triggering comprises the step of triggering a CMOS inverter directly coupled to the differential pair of CMOS differential amplifiers to generate the trigger signal, TRIG.

The step of differentially detecting in the cascaded CMOS differential amplifiers further comprises the step of selecting relative channel sizes of input FETs to each of the differential amplifiers to set the point of triggering on the memory signal DMY1, at a predetermined voltage below the memory signal DMY0.

The step of triggering comprises the steps of increasing the trigger level of the CMOS inverter and setting the gain of the CMOS differential amplifiers at a high level to match the increased level of the CMOS inverter and to trigger the CMOS inverter as a predetermined voltage below the memory signal DMY0.

One-shot Pulse Generator for VLSI Memory Timing Control

The invention is an improved memory timing control circuit having a plurality of sequentially triggered precharged signals including PC0 and PC1. The circuit comprises in turn a circuit for defining a memory precharge time for the ROM core for fast process parameters, and a circuit for defining a precharge time sufficient to permit discharge of an end of a previously selected word line.

The circuit for defining the precharge time sufficient to discharge the end of a previously selected word line comprises a single dummy word line for generating a delay time for triggering the precharge signals within the memory. The dummy word line is coupled to the first one of the sequential timing signals PC0 thereby providing good performance with the fast process parameters.

The circuit for defining the precharge time for fast process parameters comprises coupling the output of the circuit for providing sufficient time to discharge the end of the previously selected word line to the first one of the sequential timing signals PC0.

The improvement further comprises a circuit for deactivating the memory timing control circuit so that zero power dissipation occurs when the output OWDN is high.

In the illustrated embodiment the single dummy line is comprised of a plurality of dummy line segments and further comprises a circuit for charging each of the plurality of segments simultaneously and a circuit for discharging the plurality of segments collectively as a series coupled delay line of the plurality of segments.

The circuit for serially discharging the segments of the dummy memory discharges the last of the plurality of segments below a predetermined threshold trigger voltage. The timing signal OWDN is driven high by the circuit for defining sufficient time to discharge the end of a previously selected word line.

The invention is also an improvement in a method for generating a delayed precharging signal in a memory having word lines which are selectively discharged comprising the steps of precharging a dummy word line high; presetting a timing control signal OWDN low; discharging the dummy word line low; and switching the timing control signal OWDN high when the dummy word line has been discharged low. The dummy word line is discharged sufficiently to allow an end of the selected word line to discharge to ground. Thereafter a precharge clock signal PC0, is terminated.

The step of terminating the precharge clock PC0 is the first one of a series of sequentially trigger precharge clock signals including PC0 and PC1 which were used to precharge the read only memory.

The improvement further comprises the step of preventing power dissipation in the memory timing control circuit after the timing control signal OWDN is switched high.

RC Delay Circuit To Block Address Transition Detection

The invention is an improvement in a circuit for blocking spurious address transition detections. A delay circuit, depicted in FIG. 19, delays an enable address transition detection blocking signal ENSURG to produce ENSURGD. An RC circuit varies the amount of delay added to ENSURGD to generate a selectively timed address transition detection blocking signal, SURG, with a selectively determined pulse width. The circuit timing is shown in FIG. 20.

The delay circuit comprises a plurality of logic gate delays having as an output the delayed enable address transition detection blocking signal ENSURGD. A logic gate for generating a selectively gated address transition blocking signal NSURG, is also provided. The RC circuit comprises a resistive element coupled to a capacitive element. A circuit is provided for precharging the resistive and capacitive elements. Another circuit is provided for discharging the resistive and capacitive elements in response to the delayed enable address transition detection blocking signal, ENSURGD. The resistive and capacitive elements are coupled to the logic gate for generating NSURG. The logic gate is inhibited until discharge of the resistive and capacitive elements has reached a predetermined trigger point after which the logic gate generates the rising edge of the NSURG signal.

The RC circuit delays the falling edge of the SURG signal until after the occurrence of false address transition detection signals spuriously caused by noise.

The capacitive elements are adjustable through masking options to vary the pulse width of the address transition detection blocking signal, SURG.

The invention is also an improvement in a method for generating a selectively timed address transition detection blocking signal, SURG, in order to disable address detection circuitry in a read-only memory from falsely triggering on noise caused by the switching of output drivers. The method comprises the steps of generating an address detection blocking signal SURG, when the output drivers are switched. The address transition detection blocking signal, SURG, is delayed by an enable address transition detection blocking signal, ENSURGD, through delay circuitry. SURG disables the address detection circuits and is timed to block false address detection signals caused by noise from the output drivers. This blocking signal, SURG, has a controlled pulse width such that process variations and voltage supply variations tend to cancel one another to produce a stable SURG pulse width across these variations.

The step of selectively delaying the enable address transition detection blocking signal, ENSURGD, comprises the step of generating a delay with a gate delay circuit.

The step of selectively delaying ENSURGD comprises the step of discharging gate capacitance through the resistive FETs to generate a delayed gate control signal and generating an address transition detection blocking signal SURG as controlled by the delayed gate control signal. The step of delaying ENSURGD matches the inherent delay of the output drivers. Both these delays are gate delays and so these delays match for a wide range of operating and process conditions. In this way the signal SURG may block spurious address transition detection signals over a wide range of operating and process conditions.

The improvement further comprises the step of selectively varying the capacitive and resistive portion of the gate delay circuit by mask options in order to vary the rising edge of the address transition detection block signal SURG.

CMOS Sense Amplifier/Latch Circuit for a Single Data Input Signal

The invention is an improvement in the sense amplifier comprising a differential amplifier having four inputs. Two of the four inputs are coupled to an input signal, BIT. A third one of the four inputs is coupled to a signal defining a logical one, DMY1. A fourth one of the four inputs is coupled to a signal signifying a logical zero, DMY0. The differential amplifier is arranged and configured to differentially amplify with high gain the BIT signal in reference to an effective reference voltage defined between the voltage level of the DMY0 and DMY1 signals. As a result of this combination of elements the sense amplifier has a single data input relatively immune from noise. A latch circuit is provided for latching the BIT signal at the output of the differential amplifier.

The improvement further comprises a precharge circuit for precharging the differential amplifier outputs to an equalized voltage level to minimize response time to the inputs of the differential amplifier.

The improvement further comprises a noise isolation circuit for isolating the differential outputs of the differential amplifier from the inputs until such time as the inputs are substantially free of noise. The noise isolation circuit isolates the differential outputs of the differential amplifier from the inputs until the inputs have reached predetermined sensing levels.

The precharge circuit also isolates the outputs of the differential amplifier from the inputs until the inputs are substantially free of noise. The precharge circuit isolates the outputs of the differential amplifier from the inputs until the inputs have reached a predetermined sensing level.

The inputs of the differential amplifier include field effect transistors, each having a width-to-length ratio, and wherein the inputs of the field effect transistors coupled to the signal BIT have width-to-length ratio in combination greater than the inputs coupled to the signals DMY0 and DMY1 to permit negative noise voltage on the BIT signal without imbalancing the differential amplifier.

The DMY1 input coupled to the input of the differential amplifier has substantially the same PN junction leakage current and coupled noise voltages as the signal BIT coupled to a bit line within the read only memory.

The latch circuit latches the voltage level of the signal BIT within the differential amplifier when a predetermined voltage difference is detected between the DMY1 and DMY0 signals.

The improvement further comprises a circuit for configuring the sense amplifier circuit in a condition of zero power dissipation after the BIT signal has been latched by the latch circuit without losing the value of the bit signal within the sense amplifier.

The invention can also be characterized as an improvement in a method for sensing a data signal BIT, in a read only memory comprising the steps of precharging the sense amplifier along with the precharge of the ROM core data bit lines and virtual bit lines. The data bit signal BIT, is sensed and latched within the sense amplifier.

The improvement further comprises the step of powering-down the sense amplifier after the step of latching to retain the data value of the data signal BIT, while consuming no power in the sense amplifier and while maintaining the data value of the signal BIT.

In the step of precharging the sense amplifier, the outputs of the sense amplifier are precharged to a predetermined equalized voltage to permit fast response of the outputs in response to input signals later coupled to the sense amplifier during the step of sensing.

In the step of sensing at differential inputs to the sense amplifier, the signal BIT is sensed at two inputs on one side of a differential amplifier within the sense amplifier, while the other side of the differential amplifier has an input coupled to a signal DMY0 and an input coupled to a signal DMY1. The signal DMY0 is derived from a dummy bit line within the read only memory wherein the dummy bit line is programmed within the memory to prevent discharging of the DMY0 during a read cycle. The DMY0 signal has a logical value of zero. The DMY1 signal is coupled to a dummy bit line and is programmed within the read only memory to discharge DMY1 to a voltage level defined as a logical one within the read-only memory.

In the step of sensing at the two inputs coupled to the single data signal BIT, sensing is at a lower conductance than the combination of the sensing at the inputs coupled to the DMY0 and DMY1 signals so that negative noise voltage on the data bit signal, BIT, does not imbalance the inputs to the differential amplifier.

The improvement further comprises the step of isolating the inputs of the sense amplifier from the outputs of the sense amplifier after the step of latching the data signal BIT, in the sense amplifier so that inputs to the sense amplifier may thereafter change while the latched data in the sense amplifier remains unchanged.

The two inputs coupled to the signals DMY0 and DMY1 provide a latching threshold voltage at a predetermined effective reference voltage between the voltage of the DMY0 and DMY1 signals. The gain of the differential amplifier is arranged and configured to amplify differences from the effective reference voltage as small as 50 millivolts.

A Low Noise X Decoder Circuit for Use in a Semiconductor Memory

The invention is an improvement in an X decoder circuit in a very large scale semiconductor memory comprising a plurality of clocked devices in the X decoder. Each of the devices having a dynamic node which is sensitive to capacitive coupling. Noise on the dynamic node from this capacitive coupling may cause some FETs to turn on and load the clocks even when the devices are unselected. The plurality of devices are coupled in parallel and small amounts of leakage from the devices may be of sufficient magnitude to affect the clock signals coupled thereto. A noise clamping circuit is coupled to the dynamic node for discharging the dynamic node on all unselected devices for each read cycle of the memory.

The noise clamping circuit comprises a switching circuit for selectively discharging the dynamic node to ground on each read cycle through control of a precharge control signal, PCWD and a circuit for maintaining these discharged levels for the unselected devices.

The switching circuit comprises a plurality of devices for selectively discharging capacitively coupled noise from all unselected devices in the X decoder to ground.

The X decoder comprises field effect transistors and the stray capacitance that exists between the source and gate of each of the field effect transistors. The devices for discharging comprise a field effect transistor coupled between the gates of the field effect transistors having the stray capacitance and ground. The field effect transistor for discharging has a gate controlled by the control signal PCWD. One of the FETs for discharging is provided for at least each of every four of the FETs having the stray capacitance in the X decoder.

The invention is also characterized as an improvement in a method of suppressing noise in an address decoder in a very large scale memory having a multiplicity of devices with stray capacitance coupled to clock signals. The multiplicity of devices are coupled in parallel to the clock signals. The dynamic node of each of the devices couples to the clock signals through the stray capacitance. The improvement comprises the steps of discharging the dynamic node to ground at the beginning of each memory read cycle to discharge the stray capacitance and the step of clamping this node to ground for all unselected devices. The dynamic node is unclamped from ground when selected and allowed to be driven high. One of the decoder lines coupled to one of the dynamic nodes is charged according to the memory address combination. The remaining dynamic nodes are clamped to logical zero voltage, even when each of the clock signals are coupled to the multiplicity of dynamic nodes. The step of clamping is repeated on the next memory cycle of the memory to eliminate small but repeated charge accumulation through the multiplicity devices on the plurality of dynamic nodes.

The step of clamping comprises the step of shorting each of the plurality of dynamic nodes to ground through a field effect transistor driven by a precharge control signal, PCWD and the step of clamping these nodes to ground for unselected devices.

Improved Time Constant Generation Circuit

The invention is an improvement in the method for generating a stable timing signal using an integrated circuit RC timing delay element in a semiconductor memory comprising the steps of inputting an initial trigger signal, OD, discharging the RC delay element to a predetermined trigger point, outputting a timing control signal delayed from the initial trigger signal by the RC delay element after the trigger point has been reached so that temperature and process variations in the timing control circuit and semiconductor memory tend to cancel supply voltage variations in the timing control circuit and in semiconductor memory to render the output timing control signal stable in the face of voltage supply, temperature and process variations.

The step of discharging the RC delay element is performed at a rate. The change of the rate of discharge varies inversely to the change of circuit speed of corresponding basic nodes within the timing control circuit as the basic integrated circuit device parameters and operating conditions vary.

The change of the rate of the discharge of the RC element approximately equals the time change within the timing control circuits as the device parameters and operating conditions vary. The rates are algebraically added to cancel variations in the two changes.

The invention is also an improvement in an apparatus for generating a stable timing control signal comprising an input circuit for receiving a trigger signal OD. An integrated circuit RC delay element is coupled to the input circuit. The input circuit discharges the RC delay element. The RC delay element has an output. The output comprises a basic timing node within the timing circuit. The input circuit discharges the RC delay element so that as the voltage supply increases, the time delay also increases. An output circuit generates an output signal when a predetermined trigger voltage is achieved at the basic timing node.

The input circuit further reduces the voltage supply range to the RC delay circuit by the negative algebraic addition of at least one device threshold voltage within the timing circuit.

The trigger voltage is the voltage supply range on the basic timing node reduced by the algebraic negative addition of at least two transistor threshold voltages.

The input circuit varies the delay time on the basic timing node to offset time varying components within the circuit to produce the stable timing signal.

The input circuit offsets time varying components within the timing circuit to substantially cancel time variations due to temperature, process and voltage supply variations. The timing circuit is an NMOS circuit or a CMOS circuit.

Memory Circuit Yield Generator and Timing Adjustor

The invention is an improvement in a semiconductor memory having a dummy bit line, DMY1, simulating the worst case within the memory for reading a logical one comprising a circuit for providing a plurality of selectable capacitors. A programmable circuit selectively couples at least one of the capacitors to the dummy bit line DMY1 so that sense time within the memory circuit is programmably varied. The dummy bit line, DMY1, is coupled to circuitry within the semiconductor memory to determine sense time when memory cells within the memory will be read.

The programmable circuit comprises a plurality of field effect transistors. One of the field effect transistors corresponds to each one of the plurality of capacitors. The field effect transistors couple the corresponding capacitor to the dummy bit line, DMY1. The field effect transistors have a threshold voltage. The threshold voltage of each field effect transistor is programmably set to configure the field effect transistor in either an ON or OFF condition.

In one embodiment the programmable circuit comprises a plurality of links. The links have a programmably determined conductivity. One of the programmable links is coupled to each one of the capacitors to selectively couple the corresponding capacitor to the dummy bit line, DMY1.

The improvement further comprises a plurality of precharge transistors for precharging the capacitors to a precharge voltage, VPC, prior to operation of the memory.

The memory further comprises a second dummy bit line, DMY0, having an operation similar to the worst case of a bit line with a logical zero comprising a circuit for providing a plurality of selectable capacitors. A programmable circuit selectively couples the capacitors to the dummy bit line DMY0 so that sense time within the memory circuit is programmably varied. The dummy bit line, DMY0, is coupled to circuitry within the semiconductor memory to determine sense time when memory cells within the memory will be read.

The invention is also an improvement in a memory circuit to adjust time allotted to a memory cycle performed within the memory circuit relating to bit line voltage drive coupled to a memory element within the memory circuit in order to selectively allow user determined programmability of read times of the memory circuit. The improvement comprises a programmable circuit for selectively generating a variable dummy bit line voltage drive. A trigger circuit is coupled to the programmable circuit for determining when the bit line voltage drive reaches a predetermined trigger point to generate a trigger sense signal. A sense amplifier reads the memory element within the memory circuit in response to the trigger signal from the trigger circuit. The sense amplifier is coupled to the memory circuit and to the trigger circuit. As a result, critical timing functions of the memory circuit are programmably controlled by the user.

In one embodiment the programmable circuit comprises ROM core FETs having a predetermined threshold voltage defined therein according to specification of the user and a corresponding plurality of capacitive elements coupled thereto. Selected capacitive elements are coupled through corresponding ROM core FETs to generate a delay time of the bit line voltage drive from the memory circuit coupled to the trigger circuit.

In another embodiment the programmable circuit comprises EPROM core FETs having a predetermined threshold voltage defined therein according to specification of the user and a corresponding plurality of capacitive elements coupled thereto. Selected capacitive elements are coupled through corresponding EPROM core FETs to generate a delay time of the bit line voltage drive from the memory circuit coupled to the trigger circuit.

In still another embodiment the programmable circuit comprises random access memory cells having a predetermined threshold voltage defined therein according to specification of the user and a corresponding plurality of capacitive elements coupled thereto. Selected capacitive elements are coupled through corresponding random access memory cells to generate a delay time of the bit line voltage drive from the memory circuit coupled to the trigger circuit.

In yet another embodiment the programmable circuit comprises read-only memory fuse links according to specification of the user and a corresponding plurality of capacitive elements coupled thereto. Selected capacitive elements are coupled through corresponding read-only memory fuse links to generate a delay time of the bit line voltage drive from the memory circuit coupled to the trigger circuit.

Still further the programmable circuit comprises read-only memory antifuse links according to specification of the user and a corresponding plurality of capacitive elements coupled thereto. Selected capacitive elements are coupled through corresponding read-only memory antifuse links to generate a delay time of the bit line voltage drive from the memory circuit coupled to the trigger circuit.

The invention can better be visualized by now turning to the following drawings.

BRIEF DESCRIPTION OF THE DRAWINGS

FIG. 29 is a timing diagram corresponding to the prior art circuit of FIG. 27.

FIG. 30 is a timing diagram corresponding to the circuit of FIG. 28.

FIG. 31 is a schematic for a circuit for producing SURG as described above with the methodology of the timing diagram of FIG. 30.

The invention and its various embodiments are described in more specific and illustrative detail below in the detailed description.

DETAILED DESCRIPTION OF THE PREFERRED EMBODIMENTS

Memory Array Precharge

A very large scale, read-only memory, which is read by selectively discharging bit lines and virtual ground lines, is read at substantially higher speeds by precharging the bit lines and virtual ground lines of the memory core at both the top and bottom of the memory core at opposing ends of the bit lines and virtual ground lines. The memory core is precharged using a precharge decoder which provides upper and lower address precharging signals timed on sequential clocks. The precharge decoder is selected to precharge sectors of the memory core by the address signals of the memory core. A precharge decoder is provided for each sector of the memory core so that the entire memory core is precharged in this manner.

A Latch Circuit Improvement to Minimize Metastability in Dynamic Digital Circuits Operation of an address latch circuit in a memory is conditioned on first receiving a ground surge control logic signal SURG, which is generated only after the data output drivers start switching. This prevents noise from these same drivers from falsely addressing the memory. Metastability is prevented by selecting the trigger points of the gates which make up the latch such that an output is not generated until input or intermediate circuitry has stabilized and by providing a favored output condition in the input or intermediate circuitry when conflict between simultaneous inputs occur. Feedback of the output of the latch to its input further reduces metastability.

Details of Memory Array Precharge

Figure 1:
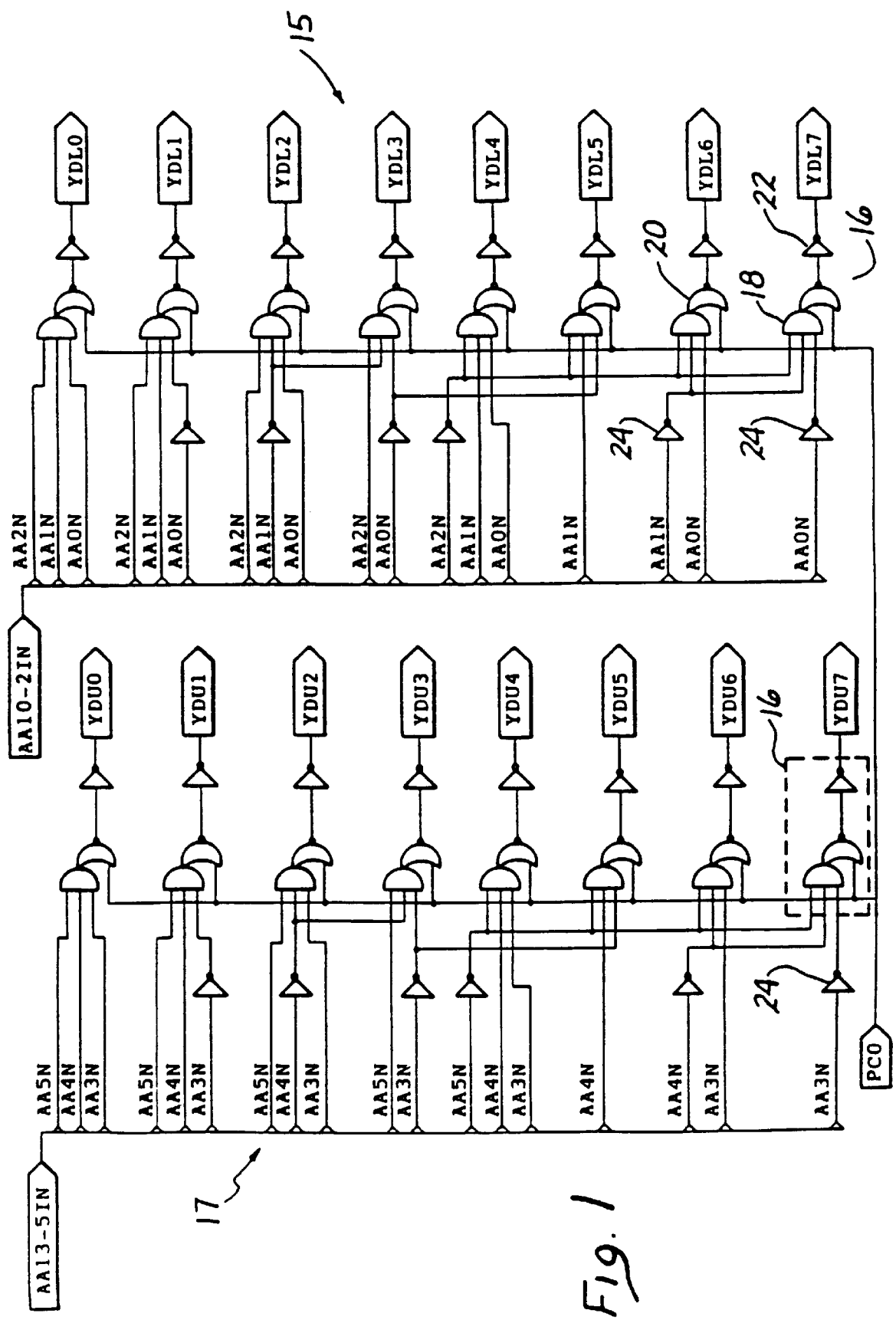
FIG. 1 is a schematic diagram of a Y-precharge decoder used in conjunction with the memory core of FIG. 2.
Figure 2:
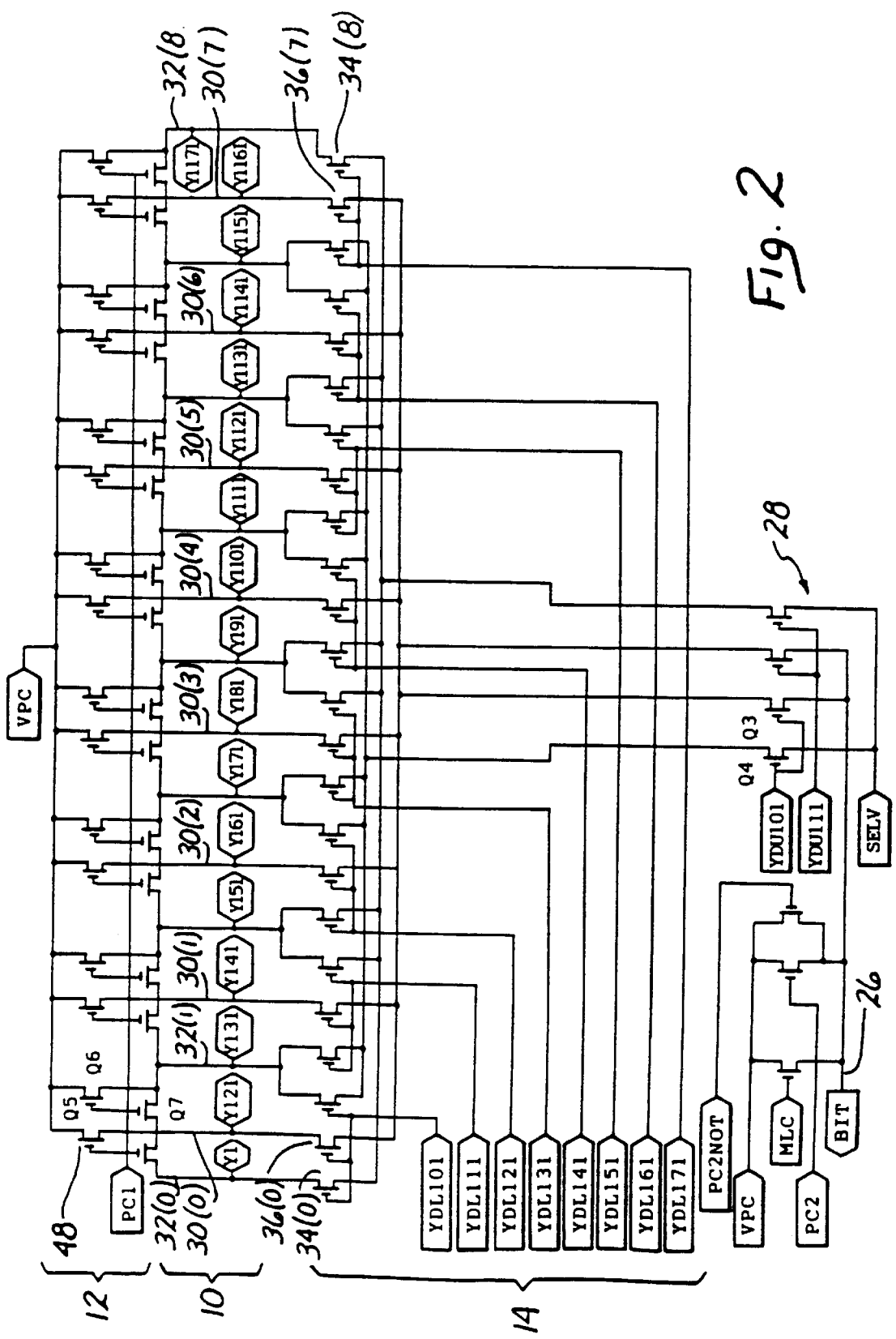
FIG. 2 is a schematic diagram of a Y-bit decoder coupled to a memory core.
Figure 3:
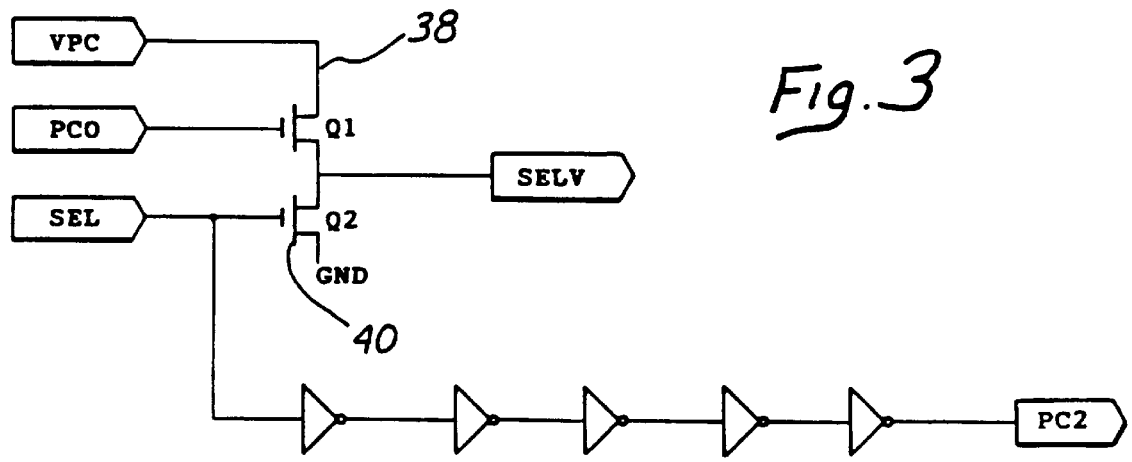
FIG. 3 is a schematic diagram of a timing circuit for the generation of PC2-SELV used in the memory core of FIG. 2.

An improved memory array precharge is depicted in the circuitry shown in schematic in FIGS. 1–3. FIG. 1 shows a Y-precharge decoder, YPREDEC; FIG. 2, a Y-bit decoder coupled to the memory core; and FIG. 3, a timing circuit for the generation of PC2-SELV. Turn to FIG. 2 wherein the precharging of the ROM core, generally denoted by reference numeral 10, is accomplished by a precharge circuit, generally denoted by reference numeral 12, and controlled by clock signal, PC1. Precharge circuit 12 is illustrated in the schematic at and physically positioned on the chip at the top of ROM core 10. A bit line decoder, YDEC, generally denoted by reference numeral 14, is illustrated in the schematic of FIG. 2 and is physically positioned on the chip at the bottom of core 10. Bit line decoder 14 is also controlled to precharge ROM core 10 as described below.

Another difference between the circuitry of FIGS. 1–3 and that described in connection with the parent application is the use of a 3-to-8 line predecoder with a clocked input to each of the eight logic gates of the predecoder as will be described in connection with FIG. 1. When the clock is high, all eight output lines are forced high. When the clock is low, three inputs are decoded to determine which one of the eight outputs is to be high. Again, this is described in greater detail below as well.

The improvement has the advantage that by precharging ROM core 10 with a precharge clock PC1 at the top of core 10 and with a bit line decoder 14, YDEC, at the bottom of core 10; the precharge time is significantly reduced. For example, in the illustrated embodiment, the precharge time is reduced by approximately 30 percent from that which was realized in the parent application. The eight output lines of the 3-to-8 line predecoder in FIG. 1 are clocked all high. With all the inputs to bit line decoder 14 in FIG. 2 high, the necessary precharge paths for ROM core 10 are provided. When the clock, PC0, is low, three inputs to the predecoder in FIG. 1 determine which one of the eight outputs is to remain high for sensing or reading core 10.

Consider first the Y predecoder circuit as depicted in FIG. 1. The eight YDLi outputs are generated by the 3-to-8 predecoder, generally denoted by reference numeral 15, shown in FIG. 1 in the right hand portion of the Figure with the exception that the clock, PCO, is an input to each of the eight logic gates 16 which comprise predecoder 15. Each gate 16 in turn is schematically comprised of a three-input AND gate 18 having its output connected to one input of a NOR gate 20, whose output in turn is inverted by buffer 22.

The inputs to AND gate 18 of logic gates 16 are various ones of the logical combinations of the address signals AA0N–AA2N as directly provided to predecoder 15 from other circuitry on the chip and as may be appropriately inverted by logic inverters 24 depicted in FIG. 1. The other input to NOR gate 20 is the clock signal PC0. When PCO is high, the outputs of all the logic gates 16 YDLi are forced high. When PC0 is low, the three inputs AA0N–AA2N will be decoded and a selected one of the eight YDLi outputs will go high.

The predecoder 17 for the eight YDUi outputs for generating the upper address bits, are similarly provided by gates 16 depicted in the left portion of FIG. 1. The same logical combination of the address inputs AA3N–AA5N are provided to the inputs of logic gates 16, as may be appropriately inverted, to provide the upper address outputs, YDUi. PC0 again is coupled to the NOR gate component of each of the logic gates 16 in predecoder 17 as just described. The field effect transistors (FETs) in the output inverters in logic gates 16 related to the YDUi outputs in decoder 17 are smaller than the corresponding FETs in decoder 15, because the load capacitance on those outputs is less than that for the YDLi outputs.

The YDLi and YDUi outputs are provided as shown in FIG. 2 to the bottom of the memory core 10. In the depiction of FIG. 2, only YDU0 and YDU1 are shown as coupled to the YDUi decoder 28. However, it must be expressly understood that there are three other similarly constituted Y-decoder circuits 28 coupled to three other similar portions of memory core 10 in an identical fashion These circuits have been omitted from the schematic for the purposes of clarity of explanation.

YDLi and YDU0 and YDU1, for example, are used in combination to select one of eight bit lines in ROM core 10 for coupling the signal BIT, to the output line 26. The other three similar Y-decoder circuits like circuit 28 utilizing the signal pairs YDU2/YDU3, YDU4/YDU5, and YDU6/YDU7 are used for each bit. The four circuits in combination allow for the selection of one of 32 bit lines from ROM core 10 for each bit in the output data as will be described below.

Refer now briefly to ROM core 10. ROM core 10 has eight bit lines, 30(0)–30(7). On each side of bits lines 30(0)–30(7) is a pair of virtual ground lines 32(0)–32(8). Because virtual ground lines 32(0)–(8) have more capacitance loading in ROM core 10 than do bits lines 30(0)–(7), the FETs 34(0)–(8) have greater channel widths than the select and precharge FETs corresponding to the bit lines, namely FETs 36(0)–(7). The virtual ground lines 32($i$) in ROM core 10 which are selected by the YDLi and YDUi signals are coupled to a clock signal SELV, which switches between VPC, the high 0 logic signal and ground, the low logic 1 signal.

Turn for a moment to FIG. 3. The signal, SELV, is output from FETs 38 and 40. FET 38 has a source coupled to VPC and its gate driven by PC0. The signal SEL, which is a control signal indicates when the sensing of memory core 10 starts, and is coupled to the gate of FET 40. When SEL is low, memory core 10 is precharged by clocks PC0 and PC1. SELV as shown in FIG. 3 is switched to VPC by PCO during the precharge cycle while FET 40 is off. SELV is driven to ground by SEL when ROM core 10 is read.

Consider now the overall operation of the circuit as described in FIGS. 1–3. Circuit operation is divided into two phases. The first phase is address decoding and precharging of all the YDLi and YDUi lines high. The second phase is comprised of the step of selecting the bit lines 30($i$) and virtual ground lines 32($i$) for sensing ROM core 10.

Consider now the first phase of address decoding. Near the beginning of the ROM cycle, precharge clocks PC0, PC1 and PC2 are the high from the end of the previous cycle or are switched high to precharge ROM core 10. The time duration of the precharge is controlled by conventional circuitry in the memory chip consistent with the present teachings. The address is completed during the precharge phase in order to select: (1) the sector of ROM core 10 to be sensed; (2) the word line within the sector to be sensed; and (3) the bit lines of virtual ground lines within the sector which will be sensed. Bit lines 30($i$) and virtual ground lines 32($i$) are selected by decoding the internal addresses AA0N–AA5N through the predecoder gates 15 and 17 described previously in connection with FIG. 1.

One feature of the present improvement is the use of PC0 in the Y-predecoder gates 15 and 17 of FIG. 1 to force each of the outputs YDLi and YDUi high when PC0 is high. This means that a precharge conductive path will be coupled to each bit line and virtual ground line with SELV, which is held high during the precharge cycle. By this means, all 256 bit lines and 256 virtual ground lines in ROM core 10 are simultaneously precharged through the bottom of ROM core 10. However, precharge clock PC1 is high also during the precharge cycle. All the transistors 42 gated by precharged clock PC1 also precharge the 256 bit lines and 256 virtual ground lines to VPC during the precharge cycle from the top of core 10. By precharging ROM core 10 with PCd from the top and through decoder 28 at the bottom, the precharge time is significantly reduced, for example by as much as 30 percent or more.

The second phase of the operation is in the selection of the bit lines or virtual ground lines for sensing or reading ROM core 10. Upon completion of ROM core precharging, PC0, PC1 and PC2 are sequentially switched low beginning with PC0. After PC1 is switched low, the eight selected virtual ground lines are pulled low by the internal clock SELV operating through decoder 28. The eight selected bit lines which are connected from the Y-decoder circuits 28 to eight sensing circuits elsewhere in the memory chip discharge to the low logic 1 signal or remain at the high logic 0 signal depending upon how the eight selected ROM cells in core 10 are programmed.

Figure 35:
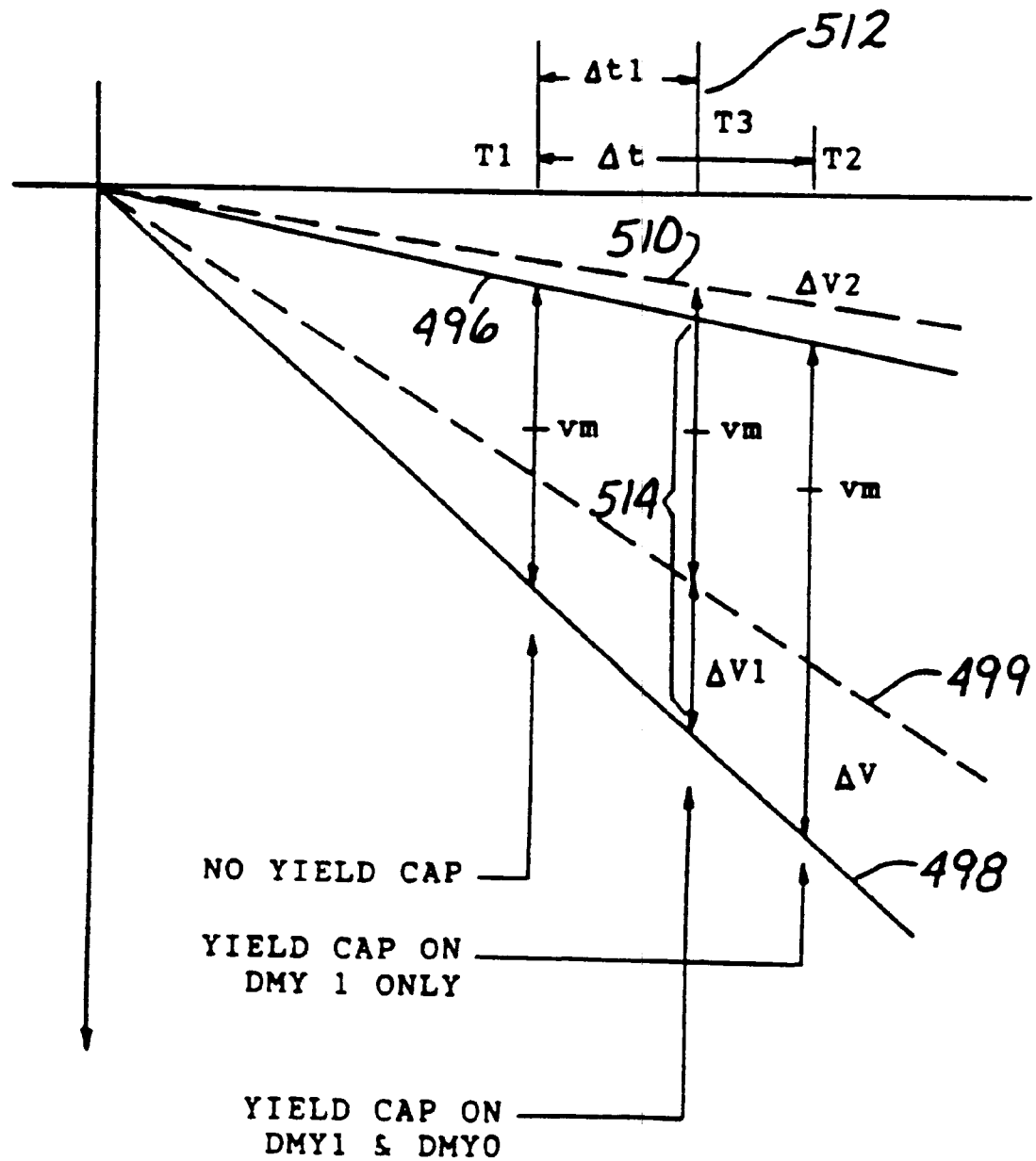
FIG. 35 is a voltage timing diagram showing the effect when capacitance is added to both the dummy lines, DMY1 and DMY0.

Details of a Latch Circuit Improvement to Minimize Metastability in Dynamic Digital Circuits The copending parent application shows in connection with FIG. 35 an NMOS latch circuit using a multistate control scheme and edge triggering techniques. The improvement described here is specifically adapted to CMOS processing and utilizes a single latch state to avoid contention with other latches. The latch of the improvement is small and transparent, but incorporates an input interlock scheme which provides good monostability compatible with a circuit architecture that normally is metastable. Thus, the trigger points of the latch and inverter, as described below, are set to avoid metastability. The latch is transparent in the sense that is does not add time delays during the detection of normal address transitions and signals are inhibited only when a control signal is set high. The output of the latch is used to disable an input to the latch thereby providing feedback which further minimizes metastability.

The utility of the improved latch is particularly useful in dynamic digital circuits and is not limited to read-only memory circuits. The latch is less likely to fall into a metastable state than prior art latches which can cause a dynamic ROM, for example, not to accept any new address transitions or to cause a dynamic ROM to output incorrect data.

Figure 4:
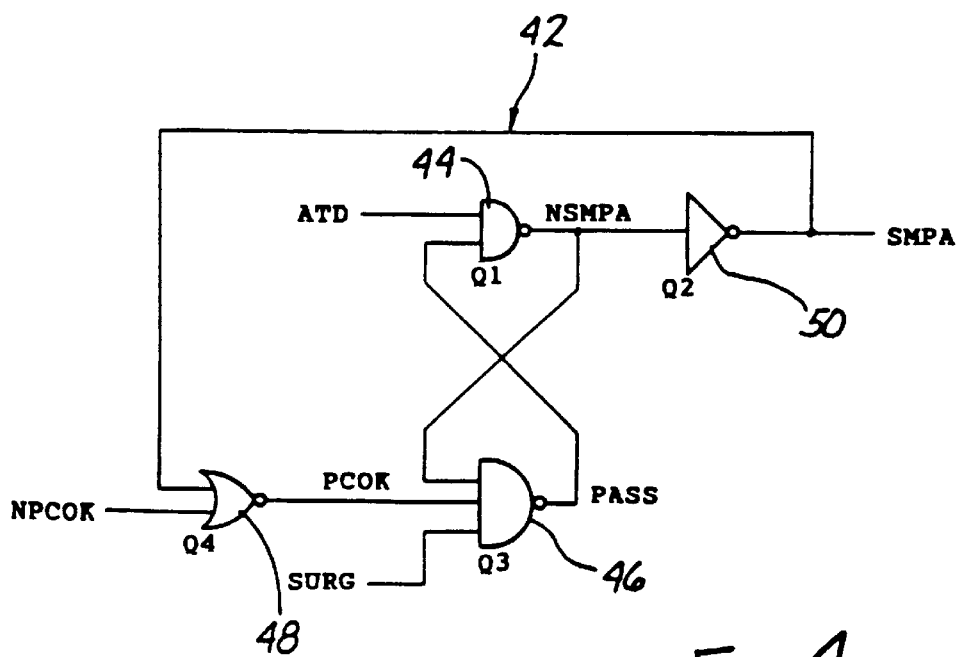
FIG. 4 is a schematic diagram of the address transition detection latch.

Turn to FIG. 4 wherein a schematic diagram of the improved latch is depicted. The latch, generally denoted by reference numeral 42, is comprised of NAND gates 44 and 46 which are cross-coupled to form a latching circuit combination to control the output sample address signal SMPA. Latch 44 has as one input the address transition detection signal ATD and in its other input, the output of NAND gate 46. The output of NAND gate 46 is designated as the signal PASS, since it allows ATD to be passed through the latch. The inputs to NAND gate 46 are the signals, SURG, PCOK and the output from NAND gate 44, which is the logical inverse of SMPA and is denoted in the depiction of FIG. 4 as NSMPA. SMPA latches the new addresses into the address latches when it is high.

SURG is the signal which disables the address transition detection circuitry. When SURG is high, no address transitions will be accepted by the read-only memory. Only when SURG is low will address transitions be accepted and a new read cycle started. SURG is set high as the output drivers switch at the end of the read cycle. These output drivers generate ground noise and the noise may be falsely detected as an address transition if the address transition detection circuitry is not otherwise disabled.

A third input to NAND gate 46 is the precharge signal, PCOK, PCOK is the output of NOR gate 48. PCOK is a precharge OK signal which switches high after the ROM cell array is adequately precharged. PCOK is switched low when SMPA switches high in order to disable the SURG input into the latch until SURG is disabled by other circuits in the ROM. This is effected by the feedback of SMPA from inverter 50 to NOR gate 48. Therefore, ATD will be passed on to cause latching of the new memory addresses as long as PCOK or SURG is low making PASS high.

The inputs to NOR gate 48 are the logical inverse of PCOK, NPCOK, and the output of latch 42, SMPA. Thus, NOR gate 48 acts as an inverting disabling gate so that latch 42 is disabled whenever SMPA or NPCOK is a logical high. When SMPA is a logical low, NOR gate 48 acts as an inverter, passing the input signal NPCOK to NAND gate 46. The output of the latch combination 44 and 46 is inverted by inverter 50 and presented as the output signal SMPA.

PASS allows SMPA to be generated from the address transition. When PASS is low, SMPA is held low and a new read cycle cannot be started. When PASS is high, NAND gate 44 inverts ATD which is then reinverted by inverter 50 to provide SMPA. ATD, address transition detected, goes high when address transition occurs. The address will thus be latched when an address transition is detected as long as PASS is high.

Figure 5A:
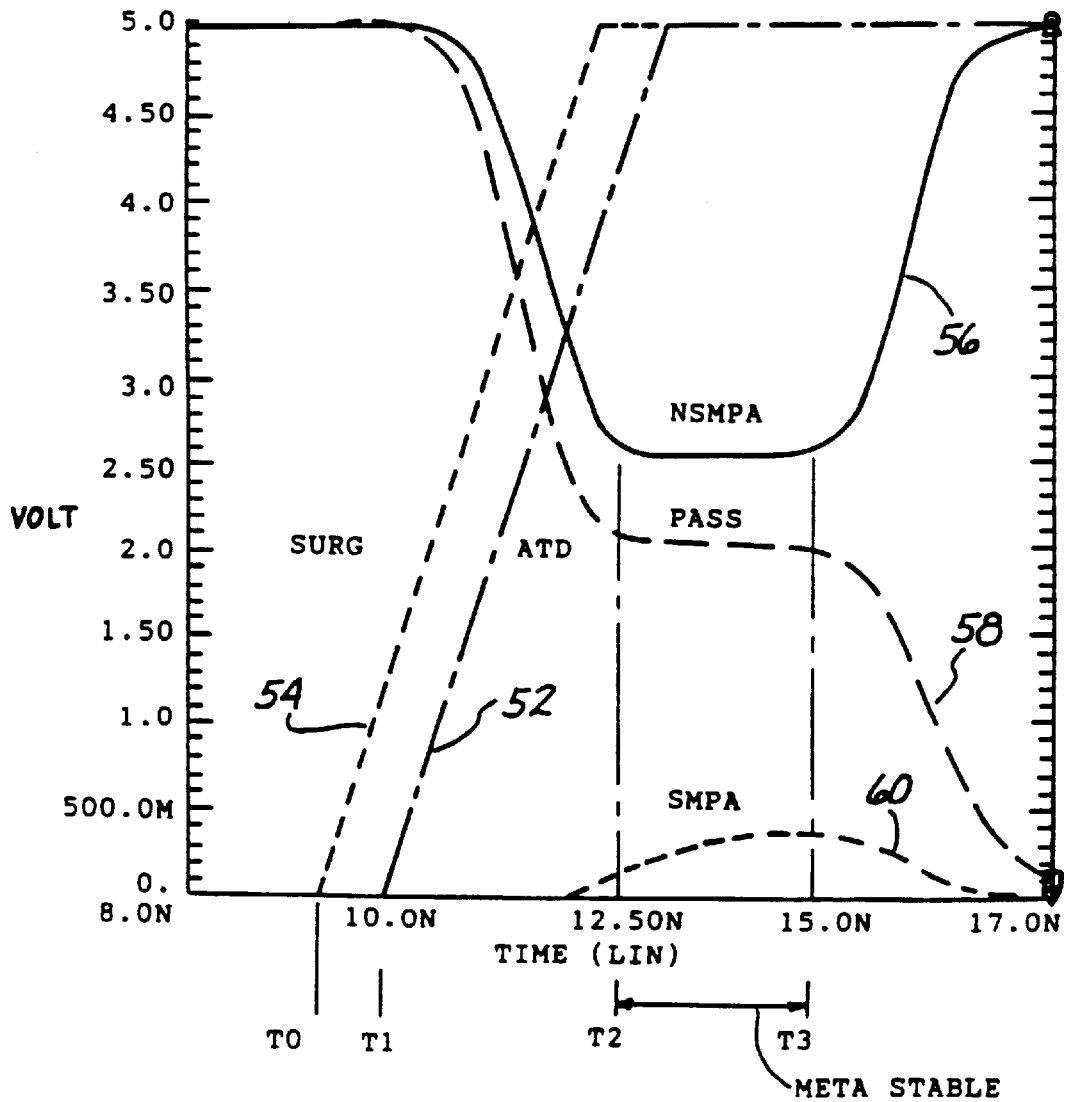
FIG. 5a is a tiring diagram of a latch shown in FIG. 4 where the latch resolves itself to the state where PASS is low and NSMPA is high.

Consider now the operation of latch circuit 42 shown in FIG. 5a. If the address transition detection circuit requests a new address cycle just as the previous address cycle is ending, then the possibility for collision exists between the signals ATD and SURG. In the circuit of FIG. 42, there will then arise a question of which of the signals PASS or NSMPA will go low first. A conflict of collision between ATD and SURG must not result in a half-level of the output signal, SMPA.

The correct response in the event of a collision is:

(a) when SURG switches high, SMPA is inhibited until SURG switches low. After SURG switches low, SMPA is allowed to switch and to initiate a new cycle; and (b) If SMPA switches high, a new read cycle is initiated and SURG from a previous read cycle is not allowed to affect the new read cycle. A new read cycle will disable the SURG input to the latch.

Turn now to FIG. 5a. Assume that the address transition detected circuit requested a new read cycle of the memory just as the previous read cycle is ending. A collision then occurs between ATD and SURG. This is illustrated in FIG. 5a wherein ATD is represented by line 52 and SURG by line 54 which are both rising beginning at the time T0 and T1 and reaching a high state at a later time.

The question arises then as to which NAND gate, gate 44 or 46, will switch low first. The result in abstract is indeterminate and could go either way depending upon uncontrolled parameters. To avoid error signals, a collision between ATD and SURG must not result in a half-level for the output signal SMPA. What is needed is that when SURG switches high as shown in line 54 of FIG. 5*a*, that SMPA remains inhibited as shown in line 60 until SURG again switches low.

Only after SURG switches low, will SMPA be allowed to switch high in order to initiate a new read cycle in the memory. Further, after SMPA does switch high, and a new read cycle is initiated, SURG is not allowed then to affect the new read cycle if it switches high at a later time. Starting a new read cycle must result in the SURG input to the latch being disabled. PCOK is held low by NPCOK until SURG is disabled by other circuits in the ROM . Address transitions must be permitted during the read cycle.

Figure 5B:
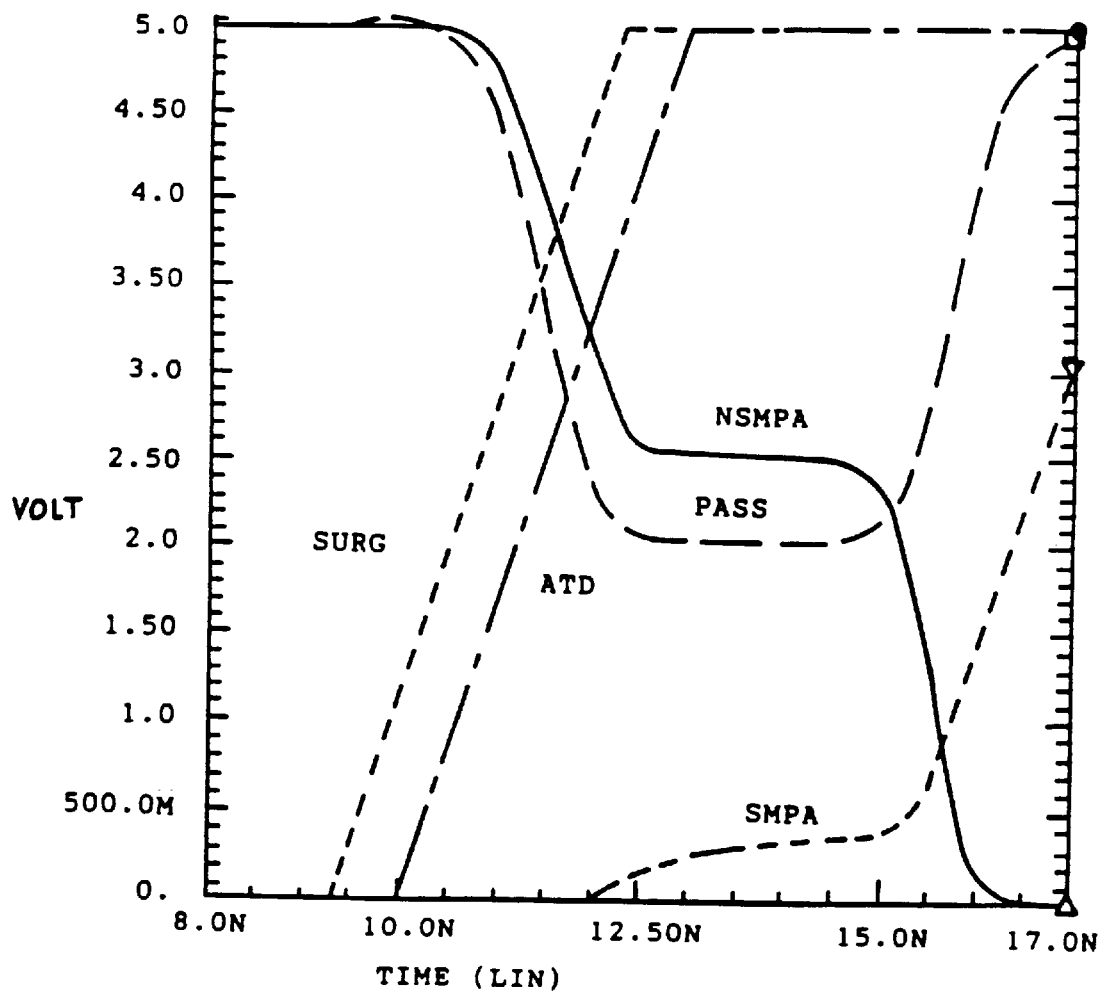
FIG. 5b is a timing diagram similar to that of FIG. 5a, but shows the metastable state of the latch where it resolves itself to the opposite state.

This is accomplished as follows. NAND 46 has a higher trigger point than inverter 50 and NAND 44. The latch is able to resolve the metastable state before switching inverter 50 and thereby effecting the output node for SMPA. Additionally, the trigger points of NAND gates 44 and 46 are unbalanced so that during the brief time of the metastable state, the voltage of PASS is lower than NSMPA. Therefore, as shown in FIG. 5*a*, when between time T2 and T3 the metastable state occurs and NSMPA has a higher value than PASS. This imbalance is important because the higher value of NSMPA causes inverter 50 not to turn on as much. SMPA is thus kept at a low level so that other circuitry is not affected. The metastable state between T2 and T3, therefore, never reaches a trigger point which is sufficient to trigger inverter 50 to cause significant change from the low logic level of SMPA shown on line 60 of FIG. 5*a*. FIG. 5*b* shows the metastable state of the latch but in this case the latch resolves itself to the opposite state. In this case SMPA is held low until the metastable state is resolved and then SMPA is allowed to rise.

Further, NOR gate 48 has a low input trigger voltage. Input trigger voltages of NOR gate 48 and inverter 50 are determined by the ratio of the width of the P-channel and N-channel FETs. For example, increasing the channel width of the NFET within the gate lowers the input trigger voltage. A relatively low amplitude of the SMPA pulse switches the PCOK node, which is the output of NOR gate 48, low. This switching of PCOK to a low logic level prevents SURG from affecting the PASS node at the output of NAND gate 46. Thus, the second condition outlined above is achieved in that when SMPA switches high, PCOK switches low very quickly thereafter, thereby keeping PASS high notwithstanding what SURG does at the input of NAND gate 46.

Data Multiplexing in Very Large Scale Integrated Memories with Optimum Operating Speed A read only memory, divided into a left core and right core halves, is provided with an improved read out architecture by proving separate sense amplifiers to each core half in the immediate physical proximity of the bit lines of the core half to reduce parasitic capacitance. Only one core portion is selected and read out through a multiplexer to output drivers. Power dissipation and noise generation which would normally be created by precharging the entire memory core is thereby reduced by a factor of two. The rise and fall time of the sense amplifiers are adjusted to match the switching characteristics of the output drivers so that ground bounce and voltage source bounce are substantially reduced at the output of the memory.

Figure 7:
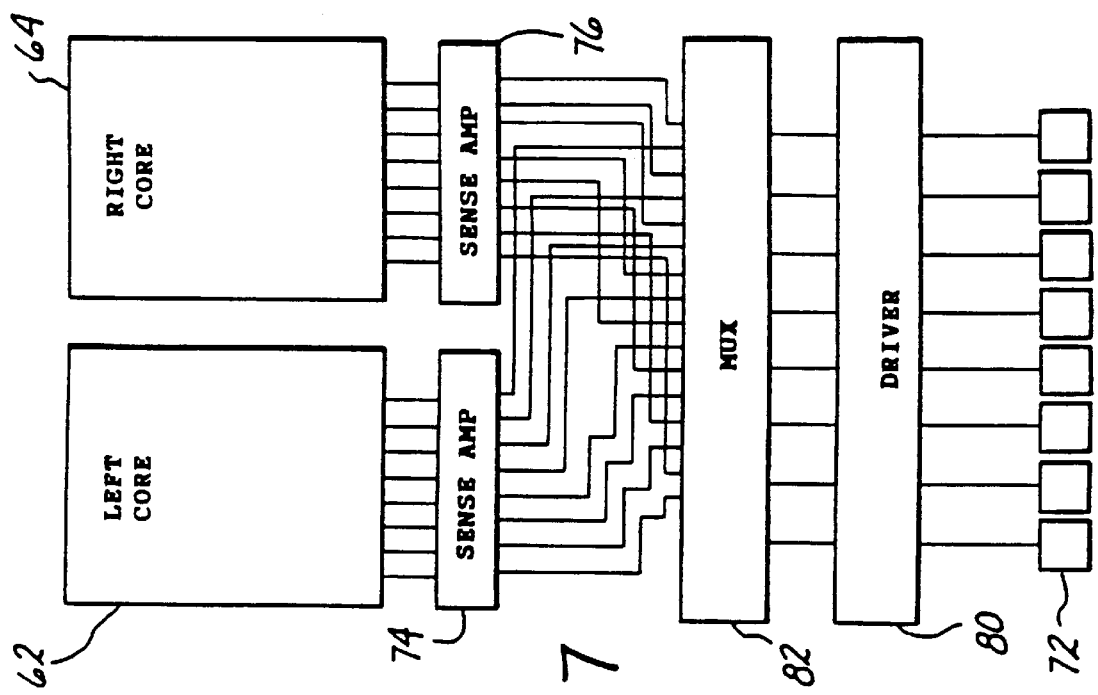
FIG. 7 is a block diagram of the architecture of a read only memory according to the invention.
Figure 6:
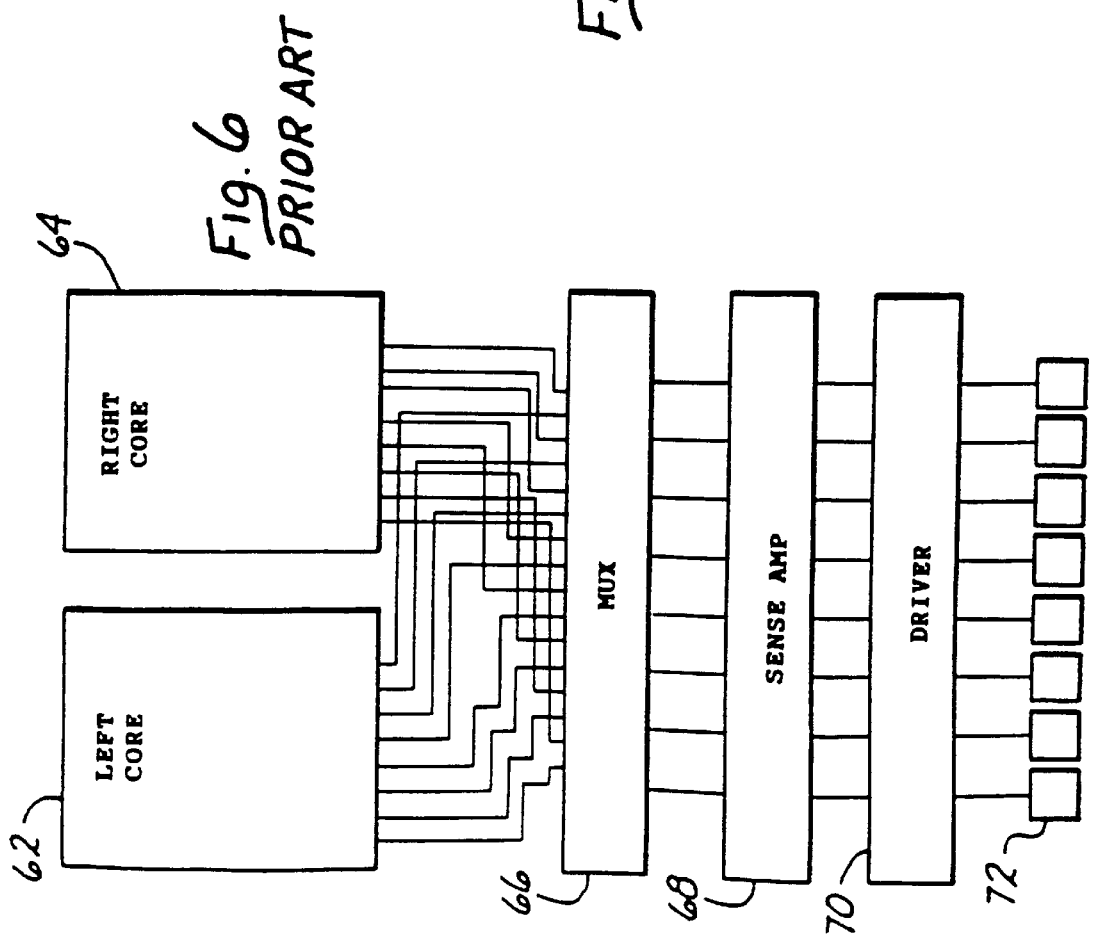
FIG. 6 is a block diagram of a prior art architecture for a read only memory.

Turn to FIG. 7 wherein an organization for a read-only memory in which operating speeds may be optimized is diagrammatically illustrated. Left and right memory core portions or halves 62 and 64 are each directly coupled on their bit line outputs to separate sense amplifiers 74 and 76. Namely, eight sense amplifiers 74 to the left core memory 62 and eight sense amplifiers 76 to the right core memory 64.

Each sense amplifier 74 and 76 includes an output predriver circuit. One address is used to multiplex the sixteen predriver outputs through multiplexer 82 to driver circuits 80. The outputs of driver circuits 80 are coupled to output pads 72.

According to the invention, memory core 62 and 64 are divided in half and only one half 62 or 64 is selected to read the memory. This results in one half the power dissipation in the memory core and reduction of the internal noise voltages caused by the read cycle and subsequent core precharge operations. Reduction of internal noise voltages increases the signal-to-noise ratio at the bit line outputs, which in turn permits higher operational speeds.

As diagrammatically depicted in FIG. 7, left and right memory cores 62 and 64 have a total of sixteen lines which are geometrically distributed approximately equally below the memory cores. Sixteen corresponding sense amplifiers 74 and 76 are geometrically positioned in the chip where the sixteen corresponding bit lines emerge from the Y decoder of the memory core (not shown). The ability to make a close geometric coupling between the bit lines and their corresponding sense amplifiers provides a design with minimum parasitic capacitance at the input of the sense amplifiers, which is a critical input node in a memory circuit. Reduction of parasitic capacitance allows for higher operational speeds in the memory.

As will be discussed below, the output of the predrivers in the sense amplifiers are provided with relatively long rise and fall times, namely approximately 25 nanoseconds. This prevents the large output FETs in the predrivers from switching too quickly and thereby creating either a severe ground bounce or supply voltage, VDD, transient or bounce voltage.

Since the output predriver nodes are relatively slow, multiplexing through multiplexer 82 is effectuated from these nodes to the eight output drivers 80. Because the predriver design is modified according to the invention to compensate for multiplexing at the predriver nodes, there is no reduction in operating speed in the memory by virtue of this design feature.

Figure 8:
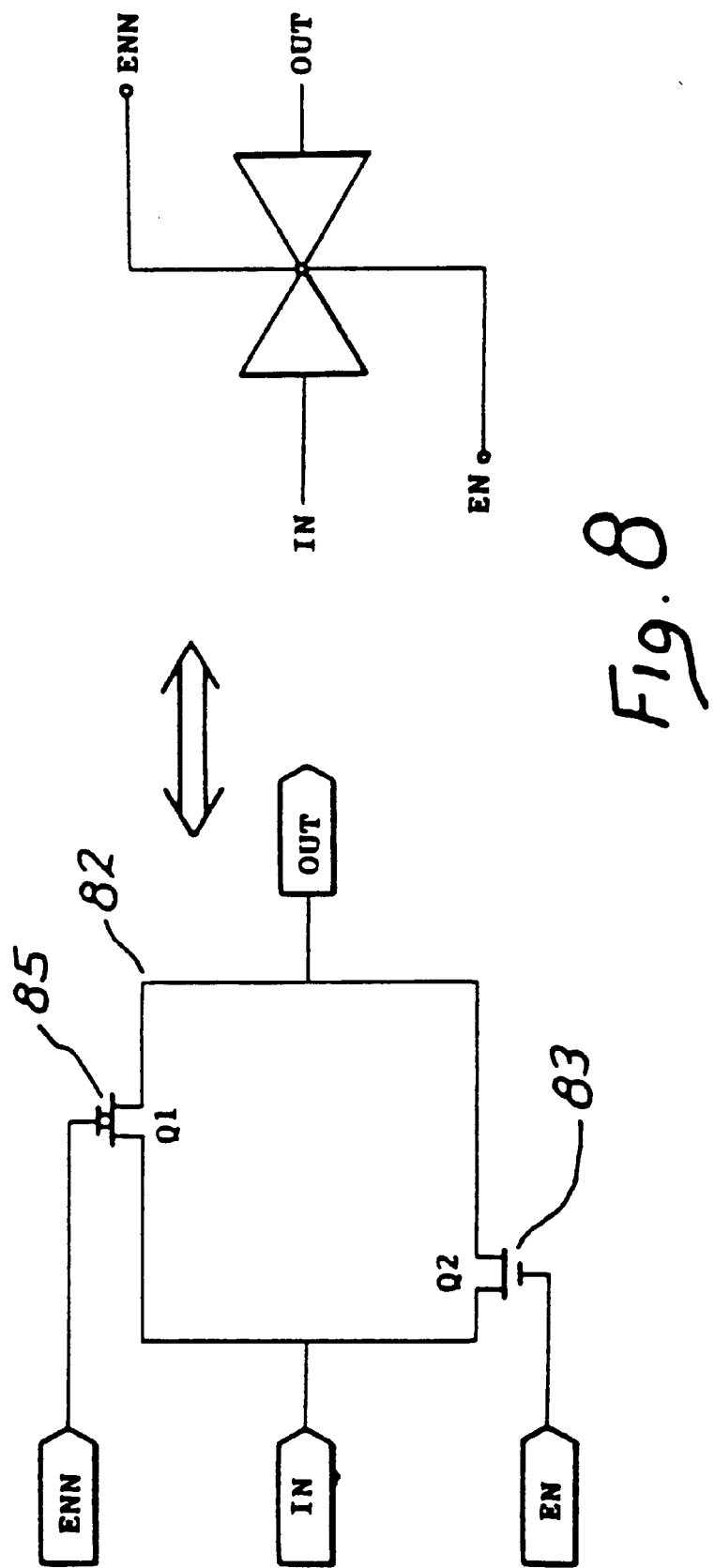
FIG. 8 is a schematic diagram of a CMOS transfer gate used in the multiplexer shown in FIG. 7.

FIG. 8 diagrammatically depicts the basic CMOS transfer gate which comprises multiplexer 82 used for multiplexing the sense data outputs from the sense amplifiers 74 and 76 to the eight output drivers 80. Hereinafter, the reference numeral 82, will be used interchangeably to refer to multiplexer 82 or to the transfer gates 82 which comprise it. The CMOS transfer gate is depicted in the schematic of FIG. 8 and is comprised of an NFET 83 and PFET 85. The gate of NFET 83 is driven by an enabling signal, EN, while the gate of PFET 85 is driven by its complement, ENN. The input signals provided through an input terminal, IN, which is then gated through to the output terminal, OUT.

Figure 9A:
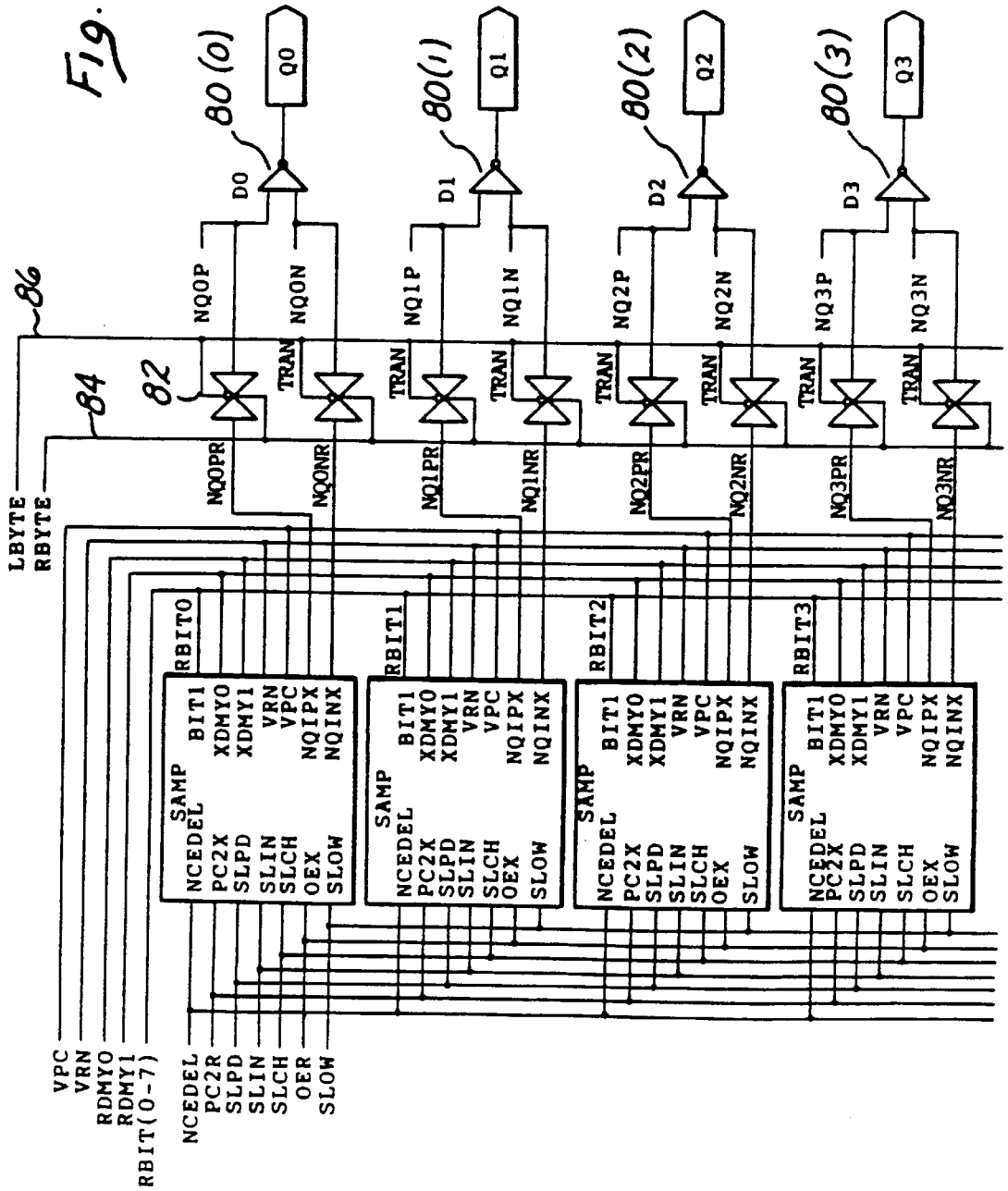
FIGS. 9A and B are a block diagram of the rightside sense amplifiers, a corresponding portion of the multiplexer and the output drivers as shown in FIG. 7.

Output drivers 80 are shown schematically in the diagram of FIG. 9A and B as drivers 80(0)–(7). Each driver 80(*i*) in FIG. 9A and B has two inputs, one connected to a PFET and one connected to an NFET within the driver (not shown). The two logic levels output by the driver, which are derived from the PFET and NFET in combination, are thus provided through the corresponding inputs NQiP or NQiN. By reference to FIG. 9A and B, it may be noted that each driver 80(*i*) is coupled to four gates 82 of the type shown in FIG. 8. Two gates 82 are expressly shown in the schematic of FIG. 9A and B and the remaining two, for generating NQiP or NQiN labeled in FIG. 9A and B, are depicted in the schematic of FIG. 10A and B.

Figure 10A:
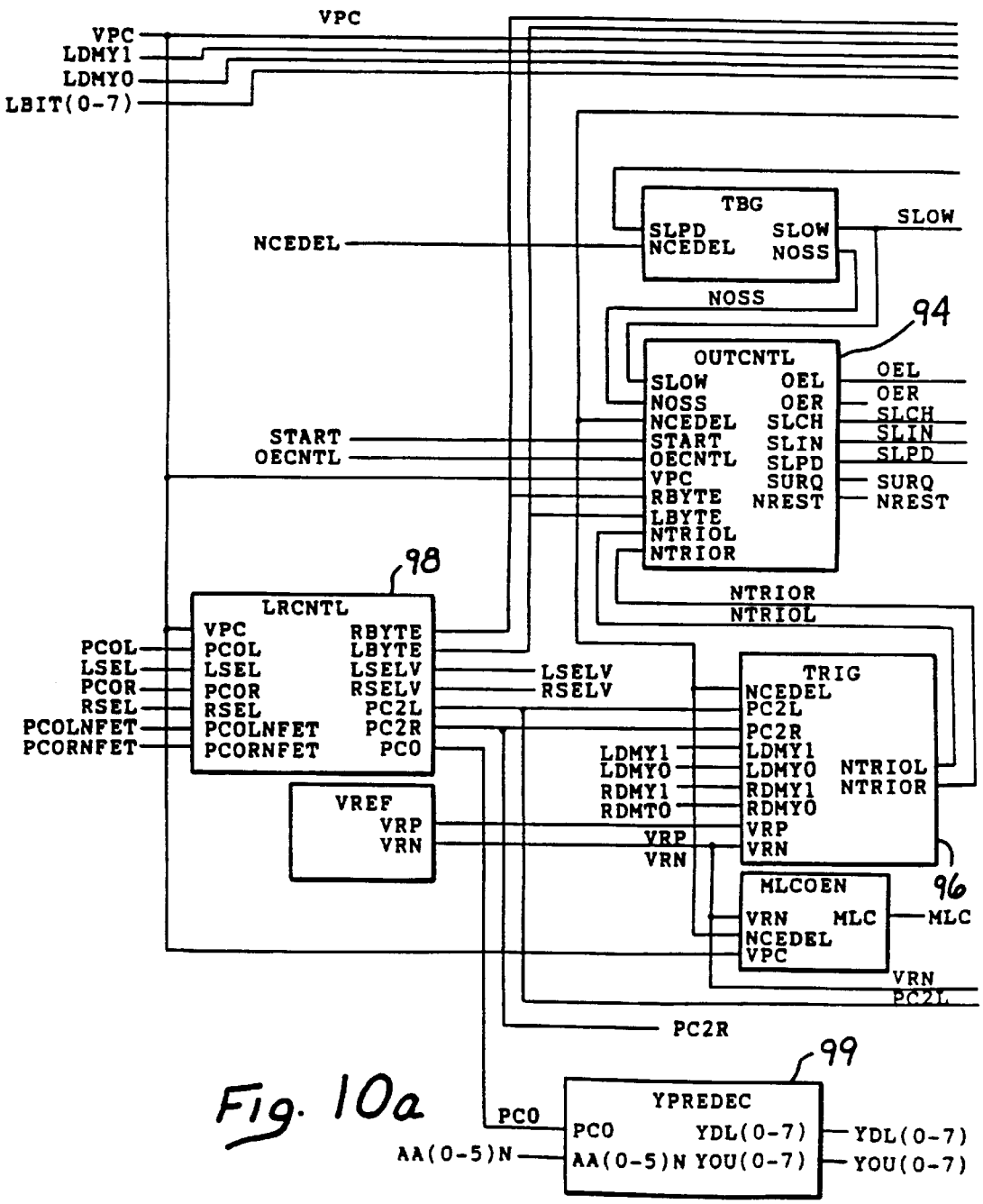
FIGS. 10A and B are a block diagram of the leftside sense amplifiers, a corresponding portion of the multiplexer and some control circuitry used in the circuit of FIG. 7.

Logic control signals right byte, RBYTE, and left byte, LBYTE, shown on lines 84 and 86 in FIG. 9A and B and on lines 88 and 90 in FIG. 10A and B are provided respectively to the transfer gates 82 in each of those figures to switch on transfer gates 82 to transfer NQiPL or NQiNL through gates 82 in FIG. 10A and B to output drivers 80(i) and switch off NQiNR and NQiPR through transfer gates 82 of FIG. 9, or visa versa. The left and right data bytes from core halves 62 and 64 are thus multiplexed to output drivers 80.

Figure 11:
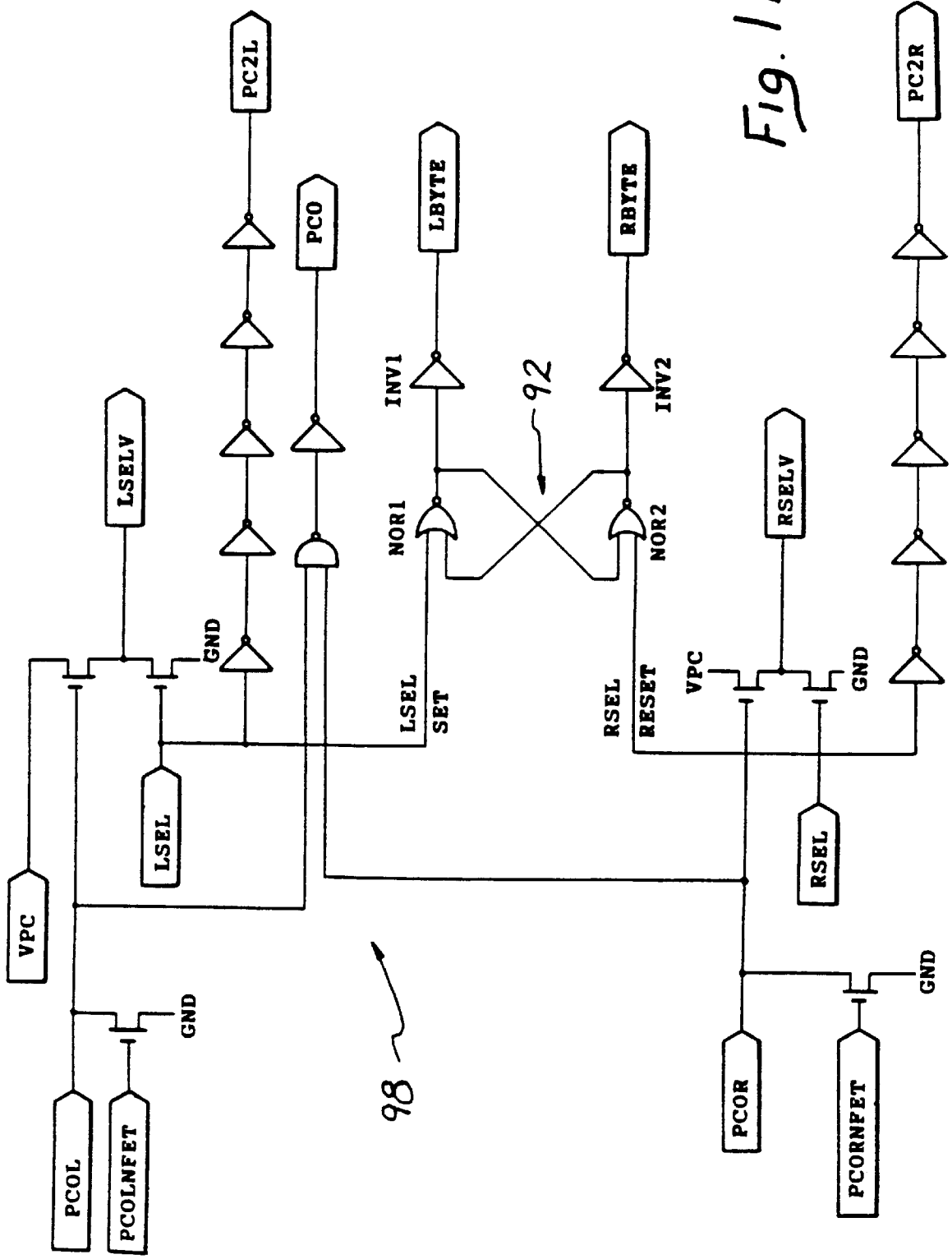
FIG. 11 is a schematic diagram of the circuitry used for the left-right control circuit, LRCNTL, shown in the diagram of FIG. 10.

FIG. 11 is a schematic diagram illustrating logic circuitry for generating some of the logic signals within the memory including LBYTE and RBYTE. This circuit is collectively referenced in FIG. 10A and B as left-right controller 98. In the case of LBYTE and RBYTE, these control signals are the inverted outputs of a latch 92 which is set by the control signal left select, LSEL, or reset by the control signal right select, RSEL, provided by conventional control logic elsewhere in the memory circuit.

Figure 10B:
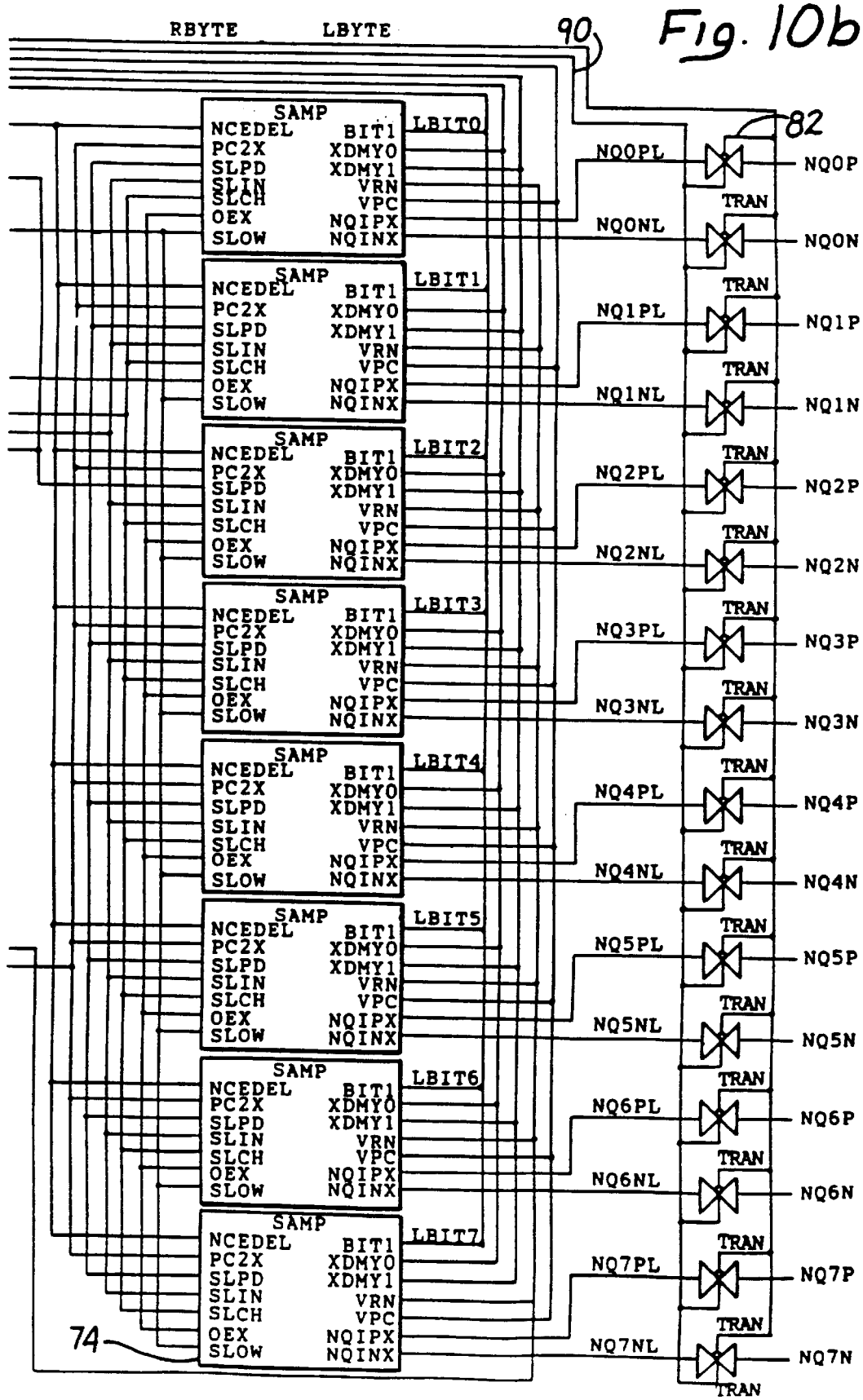

FIG. 11 also receives the precharge signal from the memory cores 62 and 64, PC0R and PC0L and combines them in a single precharge signal PC0, through a NAND gate and inverter. PC0 is then provided to a Y precharge decoder, YPREDEC 99 in FIG. 10 which decodes the address signals AA(i)N to create upper and lower Y decoder control signals, YDL(i) and YDU(i), used to address the memory. Circuit 98 also produces a right and left select voltage, RSELV and LSELV, through inverters driven by RSEL and LSEL and precharged by PC0L and PC0R respectively. RSELV and LSELV are used in memory core selection. Delayed select signals PC2L and PC2R are also generated from LSEL and RSEL respectively. These are used for timing purposes in trigger circuit 96 in FIG. 10 and in sense amplifiers 74 in FIG. 9A and B and FIG. 10A and B.

NQiPL and NQiPR comprise sixteen signals on one hand, and NQiNL and NQiNR comprise sixteen signals on the other. Each of these signals are the outputs of the predrivers in sense amplifiers 74 in FIG. 9A and B FIG. 10A and B. In any one cycle, sixteen of these thirty two signals are multiplexed by means of transfer gates 82 to become eight NQiP signals or eight NQiN signals, namely the left NQiN's and NQiP's or the right NQiN's and NQiP's. The NQiP and the NQiN are eight inputs to the PFETs or NFETs respectively in the eight output driver circuits 80(i).

Consider now the operation of multiplexing circuitry. There are four phases in the multiplex circuit. They are:

(1) precharging ROM core 62 and 64 and switching both the left select, LSEL, and right select, RSEL, to zero;

(2) sensing the selected ROM core half 62 or 64 and latching the data;

(3) transferring the latch data byte to the eight output drivers 80(i); and (4) maintaining the output data valid from the latch in the sense amplifier, SAMP, to the outputs of the drivers, 80(i) until the start of the new ROM cycle.

Consider now the phases in order. Beginning with precharging of ROM core 62 and 64 and switching of the left and right select signals to zero, at the beginning of the ROM cycle, the precharge clocks provided in the memory, PC0, PC1 and PC2, are high from the end of the previous cycle or they have been switched high to precharge ROM core 62 and 64. The time duration of the precharge is controlled by conventional logic circuitry in the memory through the means of a precharge okay signal, PCOK.

During ROM core precharge, the left select, LSEL and the right select, RSEL, must be switched to zero because they are also used to control the precharging and sensing of ROM core 62 and 64. At the beginning of the ROM cycle, all the P sense amplifier outputs, NQiPL and NQiPR, are switched and held high. All the N outputs, NQiNL and NQiNR, are switched and held low. This switching and preconditioning is done by switching output enable left, OEL, or output enable right, OER, to zero and holding both signals OEL and OER as zero until the data is latched. OEL and OER are generated by an output control logic circuit 94, OUTCNTL, illustrated in FIG. 10 and described in greater detail below. By this means the eight output drivers 80(i) are disabled until the new data is latched.

The second phase of sensing the ROM core and latching the data begins with the completion of ROM core precharging wherein PC0, PC1 and PC2 are sequentially switched low by conventional memory circuits. Address decoding was completed during the precharge phase to select: (1) the sector of the ROM core 62 or 64 to be sensed; (2) the word line within the sector to be sensed; and (3) the bit virtual ground lines within the selected core sector which are to be active. The addressing protocol used in the memory again is conventional.

After the precharge signal PC1 is switched low, either the left select, LSEL, or right select, RSEL, signal is switched high to start the sensing of the selected left or right ROM core 62 or 64. The switching of the left select signal LSEL, or right select signal, RSEL, high will set or reset latch 92 shown in FIG. 11 resulting in either decoded control signals, LBYTE or RBYTE as may be appropriate, switching or remaining high. The LBYTE and RBYTE signals then control the thirty two CMOS transfer circuits 82 shown in FIGS. 9A and B and FIG. 10A and B to route the outputs of the selected left or right sample circuits 74 to which they are connected as shown in FIGS. 9A and B and 10 to the output drivers 80(i) as shown in FIG. 9.

Now that the ROM core is sensed and the data latched in sense amplifiers 74, the latched data must be transferred to the output drivers 80(i). The memory circuit has a trigger circuit 96 depicted in FIG. 10A and B which detects when the data from selected core portion 62 or 64 can be latched by the sense amplifier circuits 74. When this occurs, another circuit, the output control circuit 94, outputs and drives either the output enable left, OEL, or output enable right, OER, signal high. As shown in FIG. 10A and B, the output enable left, OEL, controls the leftside sense amplifiers while the output enable right as shown in FIG. 9A and B, controls the rightside sense amplifier 74. If the output enable left signal, OEL, switches high, the eight leftside sense amplifiers 74 shown in FIG. 10A and B output their latched data to the eight output drivers 80(i) via the transfer circuits 82. On the other hand, if the output enable right, OER, signal switch is high, the eight right side sense amplifiers 74 in FIG. 9A and B output their latched data to the eight output drivers 80(i) via their corresponding CMOS transfer circuits 82. The data latched in the selected eight sense amplifier circuits 74 is now transmitted to the selected eight output drivers 80(i).

For the eight unselected sense amplifiers 74, the input to sense amplifier, OEX, remains low, and the sense amplifier output remains at those levels which disable output drivers 80(i). These levels are not transmitted to the output drivers since the transfer gates 82 are switched off for the eight unselected sense circuits 74.

After the latched data is now transferred to the selected output drivers 80(i), it must be held valid during precharge. As soon as the data is latched in sense circuit 74, a ROM core precharge cycle is started. Left select, LSEL, and right select, RSEL, signals are switched to zero during precharge because they are also used to control the precharging and sensing of the ROM core 62 and 64. However, LBYTE and RBYTE remain valid as established early in the ROM cycle.

This requirement is met through the use of the latch circuit 92 shown in FIG. 11. The latch circuit is diagrammatically shown in circuit block 98 in FIG. 10A and B. Switching either left select, LSEL, or right select, RSEL, to zero does not affect the latch outputs of latch circuit 92 in FIG. 11 so that LBYTE and RBYTE remain unchanged. The data latch in sense amplifiers 74 is not affected by precharging and thus the output data remains valid until the start of a new ROM read cycle.

A One Shot Pulse Generator for a Very Large Scale Integrated Memory Precharge Time Control In a very large scale integrated memory core which is precharged by a precharging signal, PCOK, improved timing for the generation of the precharge signal, PCOK, is achieved through the use of a dummy memory array simulating at least that portion of the ROM core coupled to a single bit line to generate a delay trigger signal, DMYSECPC. The delayed trigger signal DMYSECPC is coupled to the inputs of the pair of CMOS differential amplifiers which are directly interconnected and directly coupled to a CMOS inverter from which the PCOK signal is derived. The delay time of the delay trigger signal, DMYSECPC, is manipulated in part by programming the voltage thresholds of the memory cells in the dummy array. The trigger points in the circuit for generating PCOK are set by varying the channel widths of the input FETs to the CMOS differential amplifiers and adjusting the gains of the CMOS differential amplifiers to match the trigger point of the CMOS inverter coupled to it a cascaded output.

Figure 13:
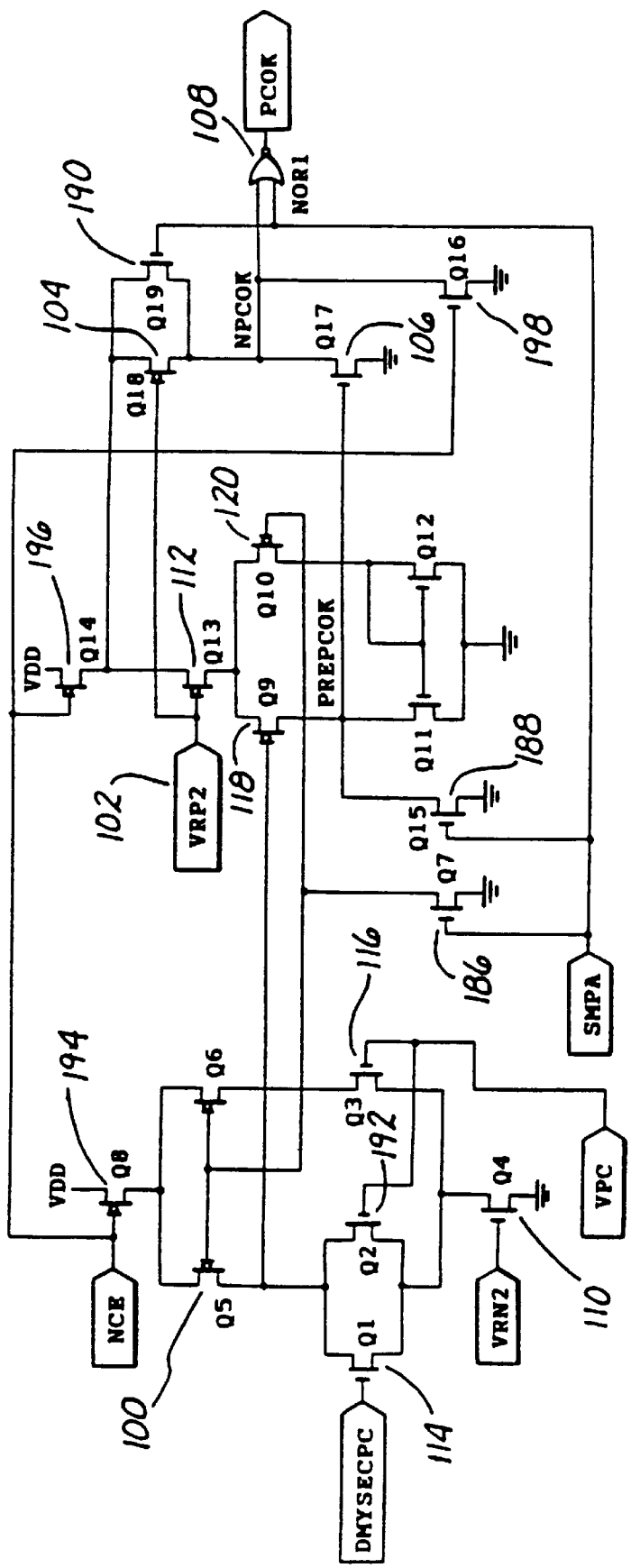
FIG. 13 is a schematic of a CMOS differential cascaded amplifier circuit which is an improvement of the timing circuit of FIG. 12.
Figure 14:
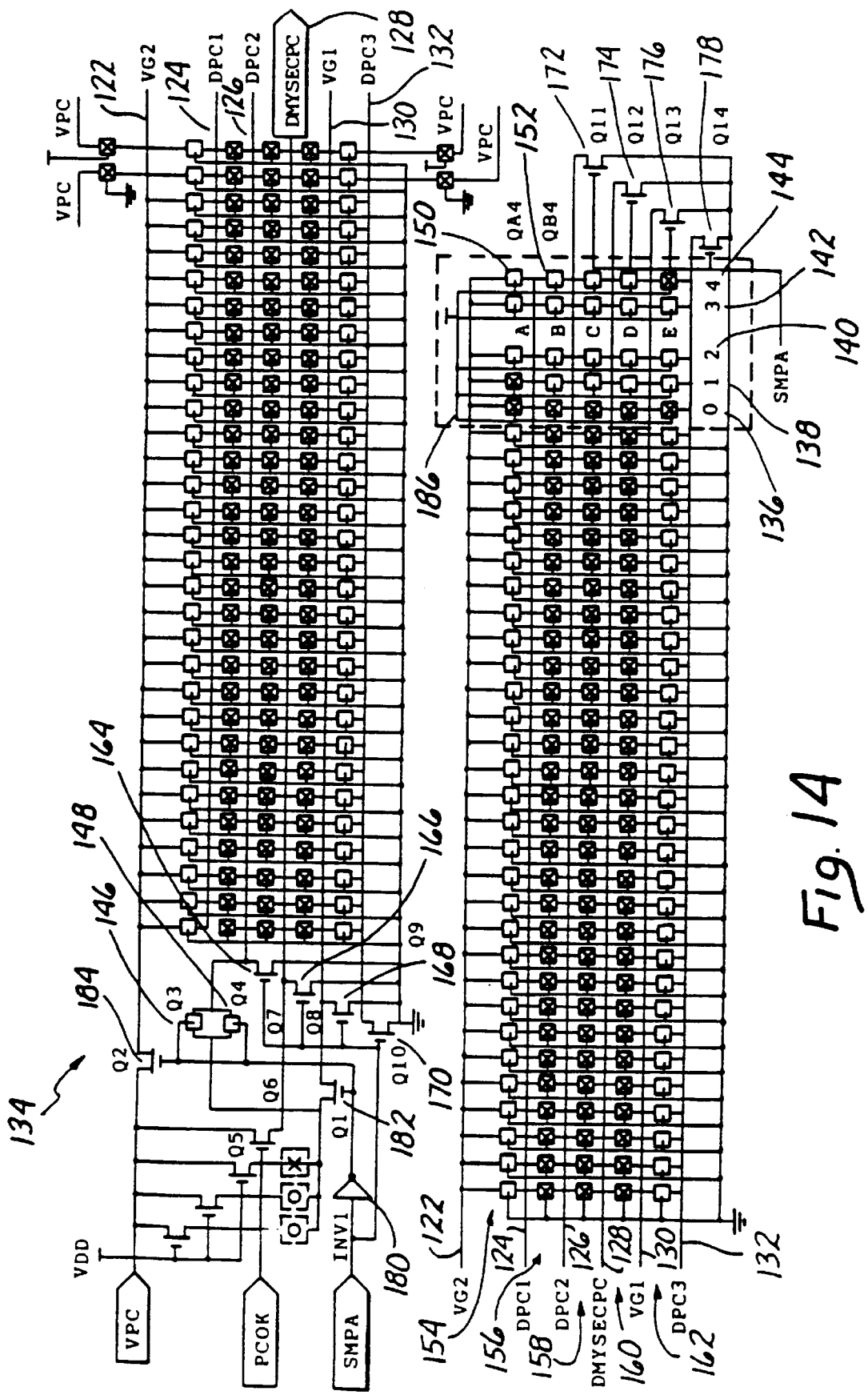
FIG. 14 is a dummy memory array used in combination with the timing circuit of FIG. 13 to provide a programmable, simulative delayed trigger circuit for the generation of PCOK.

The invention as illustrated in FIGS. 13–14 is particularly designed for use in a CMOS circuit The pulse generator uses a small array of ROM cells to generate a dummy secondary precharge signal, DMYSECPC, with the dummy array sized to match a sector of ROM memory core coupled to one bit line. The precharge time for the dummy array and that required for the ROM memory core:

(a) track process variations in the memory field effect transistor (hereinafter FET) threshold voltage in junction capacitance, diffusion resistance, etc.;
(b) track the temperature and internal supply voltage, VPC, used for the ROM core; and
(c) is under program control so that it can be matched to the time required for precharging the ROM core.

Figure 12:
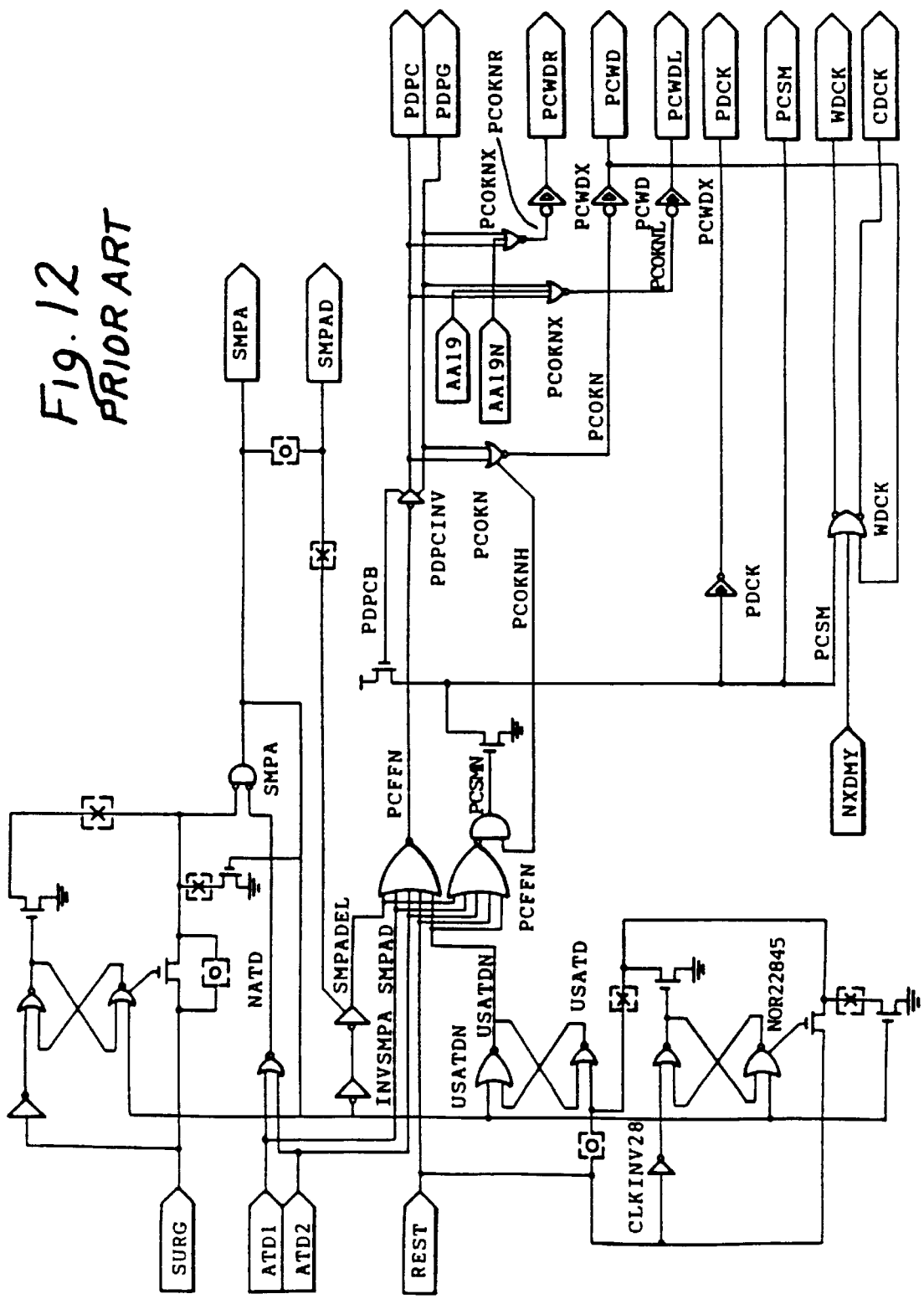
FIG. 12 is a schematic diagram of a timing control circuit of the prior art showing generation of a delayed precharged signal PCOK.

The delay time from the start of the ROM cycle can be adjusted as described below by programming the memory cells in the dummy memory array to provide an optimum precharge time for the ROM core. The precharge time varies more accurately than achieved by the prior art device in FIG. 12. This more accurate control is needed for a good performance in the face of process variations, temperature and supply voltage variations.

The precharge circuit, depicted schematically in FIG. 14, is used in combination with the dummy memory array 134 diagrammatically shown in FIG. 14. Turn first, however, to the schematic diagram of FIG. 13 which shows the PCOK level detection circuit. The function of the circuitry of FIG. 13 is to detect when the input, DMYSECPC, has risen, typically at a relatively slow rate, from 0 volts to about 0.3 volts below the precharge voltage, VPC. This level is defined as the DMYSECPC trigger level. The circuitry of FIG. 13 is comprised of two cascaded differential amplifiers 100 and 102 each having two inputs. The output of second amplifier 102 is twice inverted by a CMOS inverter comprised of FETs 104 and 106 and then by NOR gate 108. The output of NOR gate 108 is the precharge OK signal, PCOK.

A feature of the circuit of FIG. 13 is the use of a first amplifier with a current source to ground through FET 110 as controlled by the precharge voltage, VRN2. The two outputs of amplifier 100 are connected directly to second amplifier 102 which similarly has a current source to VDD through FET 112 as controlled by the signal VRP2. FET 110 is a NFET while FET 112 is a PFET and is so depicted in the Figure. Since the design is complementary, a device will simply be referenced as a FET with the understanding that it may be an NFET or PFET depending on the design chosen.

The technique of cascading two complementary differential amplifiers allows the outputs of first amplifier 100 to be directly connected to the inputs of the second amplifier 102 without voltage level shifting circuitry between them. Furthermore, it permits a direct connection of the output of second amplifier 102, the signal PREPCOK, to the gate of FET 106.

The complementary differential amplifiers 100 and 102 are defined as complementary because the NFETs and PFETs are reversed from the corresponding NFETs and PFETs in the other coupled differential amplifier. For example, as shown in FIG. 13, the input FETs 114 and 116 to differential amplifier 100 are NFETs, while the input FETs 118 and 122 of second differential amplifier 102 are PFETs. Current source of FET 110 in first amplifier 100 is an NFET while the corresponding current source FET 112 in second amplifier 102 is a PFET and so forth on a device-for-device comparison between the two differential amplifier circuits 100 and 102. The type could be reversed if desired, namely a PFET exchanged for every NFET and vice versa.

Another feature of the circuitry FIG. 13 is the use of a larger width-to-length ratio for the size of input FET 114 than for input FET 116 and similarly for the device size of input FET 118 as compared to input FET 120. When the input signal, DMYSECPC, is at the same voltage level as the input precharge signal, VPC, provided to the gate of input FET 116, the imbalance between the FETs 114 and 116 on one hand and between FETs 118 and 120 on the other result in the amplifiers driving the output PCOK to a logical one. In the illustrated embodiment, the width-to-length ratio of input FET 114 is 12/1.5 as compared to 5/1.5 for FET 116 and similarly for FET 118, it is 10/1.5 as compared to 5/1.5 for FET 120.

The magnitude of the imbalance in the width-to-length ratio determines the differential voltage below the precharge voltage signal, VPC, the trigger signal, at which DMYSECPC causes the PCOK output to switch to a logical zero. Increasing the width-to-length ratio, W/L, of input FET 114 and/or input FET 118 reduces the voltage level or trigger level required for DMYSECPC to switch the PCOK signal from the logical zero to logical one. In the preferred embodiment, FETs 114 and 118 have a greater channel width than those of the corresponding FETs 116 and 120. However, a shorter channel length may be preferred in some applications.

The trigger level of the input signal, DMYSECPC, can also be shifted by changing the width-to-length ratio of the NFET 106 or the PFET 104 in the CMOS inverter connected to the output, PREPCOK, of the second differential amplifier 102. The input trigger level is defined as that input voltage which switches the specified output voltage to one-half of the supply voltage VDD. The CMOS inverter can have NFET and PFET channel sizes chosen to set the input trigger voltage of the inverter low, which decreases the trigger level of DMYSECPC, or set high which would increase the trigger level of DMYSECPC.

Consider now the dummy memory array circuit of FIG. 14. The dummy array circuit is a small array of ROM cells along with control logic 164–178 to rapidly discharge the internal nodes of the array and control logic 146, 148, 182, 186, 188 to allow the nodes in the array to precharge in a manner which emulates the precharge of the main ROM memory core. The array is sized and structured to match a sector of the ROM core which is coupled to one bit line in the main core.

Referring now specifically to FIG. 14, the nodes coupled to the signals VG2, DPC1, DPC2, DMYSECPC, VG1 and DPC3 are each memory diffusion lines which connect to the source or drains of the five rows of memory FETs or cells 134 in the dummy array. Consider for example five columns on the right end of dummy array 134 which are labeled by the reference numerals 136–144. In array 134, cells 146, 148, 150, 152 and so forth shown in the Figure as blank cells are low threshold voltage memory FETs, while the cells which are filled with an X throughout the array, are high threshold voltage memory FETs. The number of memory FETs connected to diffusion line 128 carrying DMYSECPC is the same as the number connected to a single sector bit line in the main ROM core. The purpose for this is to match the capacitance loading and diffusion resistance in the dummy array 134 with the corresponding core sector.

The memory cells in columns 136–144 and in rows 154–162 are also in the precharge path in the main memory core. These cells comprise the subarray of cells 186 within the dotted line block and are programmed as high or low threshold voltage cells to change the charging current to DMYSECPC. By this means, the precharge time of the node or diffusion line 128 carrying DMYSECPC can be programmed to be less than or greater than the precharge time of the main memory core.

The general organization of the PCOK circuit of FIG. 13 and the dummy array circuit of FIG. 14 now having been described, consider the operation of the PCOK circuit. The PCOK circuit of FIG. 13 operates in four phases which are comprised of the steps of:

(a) discharging the DMYSECPC signal and presetting PCOK low, (b) precharging DMYSECPC toward the precharge voltage VPC;

(c) triggering the PCOK circuit to switch the output high; and (d) powering down the PCOK signal if the control signal not chip enable, NCE, is switched high.

Consider first the step of discharging the DMYSECPC signal and presetting PCOK low. At the beginning of the memory cycle in the main ROM, the sample address signal, SMPA, strobes high. In FIG. 14, the FETs 164–178 are gated by SMPA and discharge lines 122–132 and the nodes coupled to lines 122–132 to zero. Memory FETs are used for gates 146 and 148 because they match part of the precharge path which also is provided in the main ROM core sector. The output of inverter 180 is driven low by SMPA to switch off FETs 182, 184, 146 and 148. This opens all paths to the supply voltage VDD and allows the internal array nodes discharge to zero volts before SMPA switches low.

Referring now to the PCOK circuit of FIG. 13, SMPA turns on FETs 186, 188 and 190. FETs 186–190 unbalance the internal nodes of the PCOK circuit to preset the output PCOK signal to a logical zero. Also, SMPA drives one input of NOR gate 108 to quickly switch PCOK to zero while SMPA is still high. PCOK remains low until DMYSECPC precharges to the trigger level voltage. PCOK then switches high.

DMYSECPC lines now having been discharged and PCOK having been preset low, DMYSECPC is precharged towards the precharge voltage VPC. When SMPA switches low, the output of inverter 180 in FIG. 14 switches high and FETs 182, 184, 146 and 148 begin to precharge the array nodes coupled to diffusion lines 122, 130, and 126 respectively. The memory cells in columns 136–144 and rows 154–162 in the subarray 186 that are programmed with a low threshold voltage will provide a charging current to the DMYSECPC array nodes. The memory cells having a low threshold voltage may exceed the number of those used in the ROM core sector because DMYSECPC has more interconnection and gate load capacitance in the dummy array than exists on the corresponding nodes in the main ROM core sector.

The precharging of DMYSECPC towards the precharge voltage VPC now having been initiated, consider the step of triggering the PCOK to switch the PCOK output high. Refer again to FIG. 13 and note that DMYSECPC and VPC are connected to input FET 114 and to FETs 116 and 192 respectively. As DMYSECPC precharges toward the trigger level voltage, the output of second differential amplifier 102, PREPCOK, increases from 0 volts. When PREPCOK has a voltage level greater than the switching voltage of FET 106, the output node NPCOK begins switch toward ground. When PREPCOK has a voltage level equal to that of the trigger voltage of the CMOS inverter 104 and 106, PCOK will then switch quickly to a logical one.

The PCOK output signal is thus characterized by a very fast rise time to a logical one when DMYSECPC reaches the proper trigger voltage below VPC. This is due to:

(1) the high gain of differential amplifiers 101 and 102; and (2) the threshold effect caused by inverter 104/106.

The PCOK output does not switch high until PREPCOK has increased from zero volts to the trigger level voltage of the inverter 104/106. In the illustrated embodiment, the differential input trigger level to cause the PCOK output to switch high is about 0.3 volts below VPC.

Having now considered the triggering of the PCOK signal high, consider the power-down of the circuit if the inverter chip enable signal, NCE, is switched high. When NCE is high, FETs 194 and 196 are turned off. NPCOK is switched to ground by FET 198 which is gated by NCE. NPCOK and SMPA are low and PCOK is driven high by NOR gate 108. There are no current paths from VDD to ground so that the power dissipation in PCOK circuit shown in FIG. 13 is zero.

CMOS Trigger Circuit

In a read-only memory core improved generation of a trigger signal, TRIG, is achieved through the use of a pair of cascaded CMOS differential amplifiers which are directly interconnected and directly coupled to a CMOS inverter from which the trigger signal, TRIG, is derived. The cascaded differential amplifiers have trigger points set by varying the channel widths of the input FETs to the CMOS differential amplifiers, or by adjusting the gains of the CMOS differential amplifiers to match the trigger point of the CMOS inverter coupled to its output. The trigger circuit is powered down to zero power dissipation whenever it is inactive.

Figure 15:
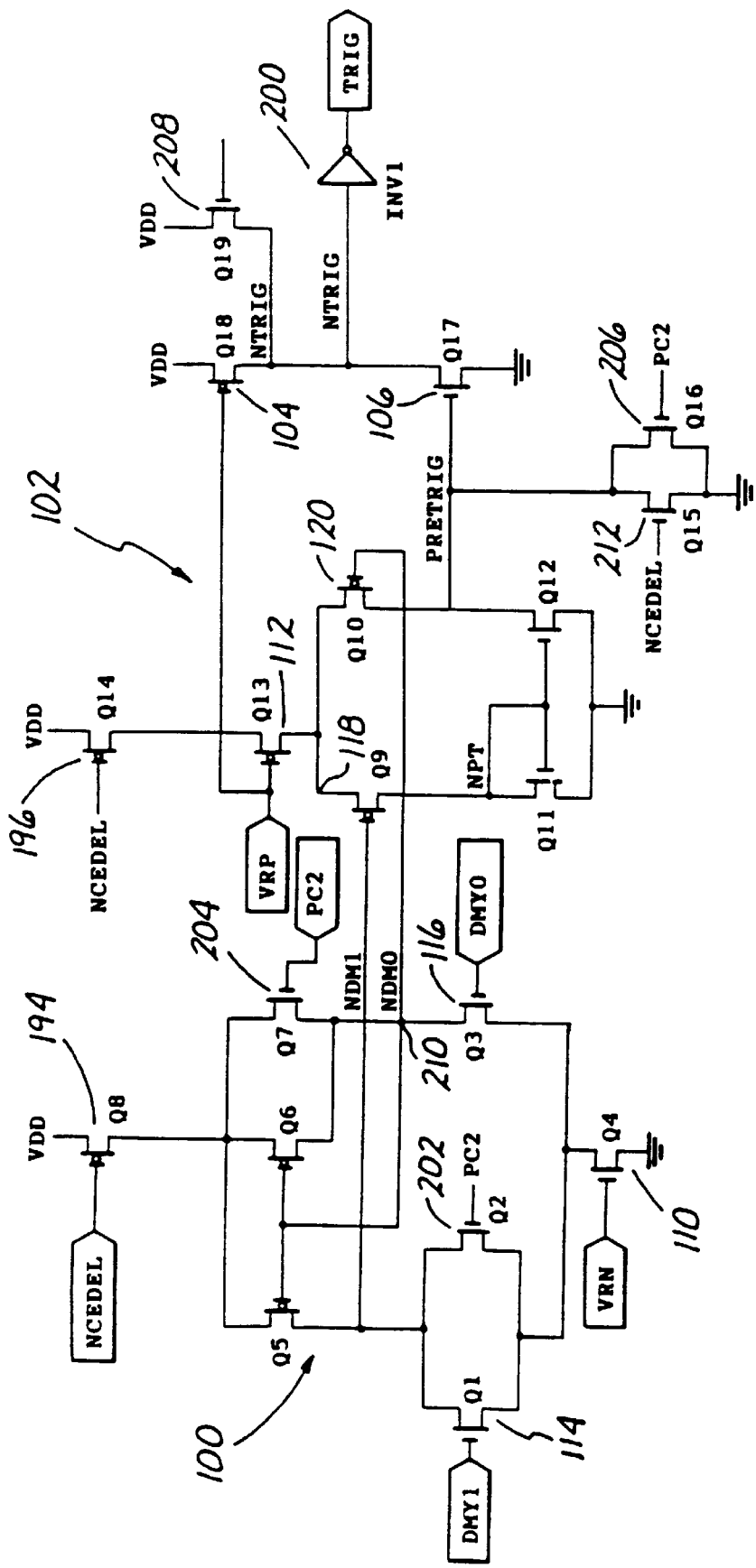
FIG. 15 is a schematic diagram of one embodiment of a trigger circuit similar that used in tiring circuitry of FIG. 13.
Figure 16:
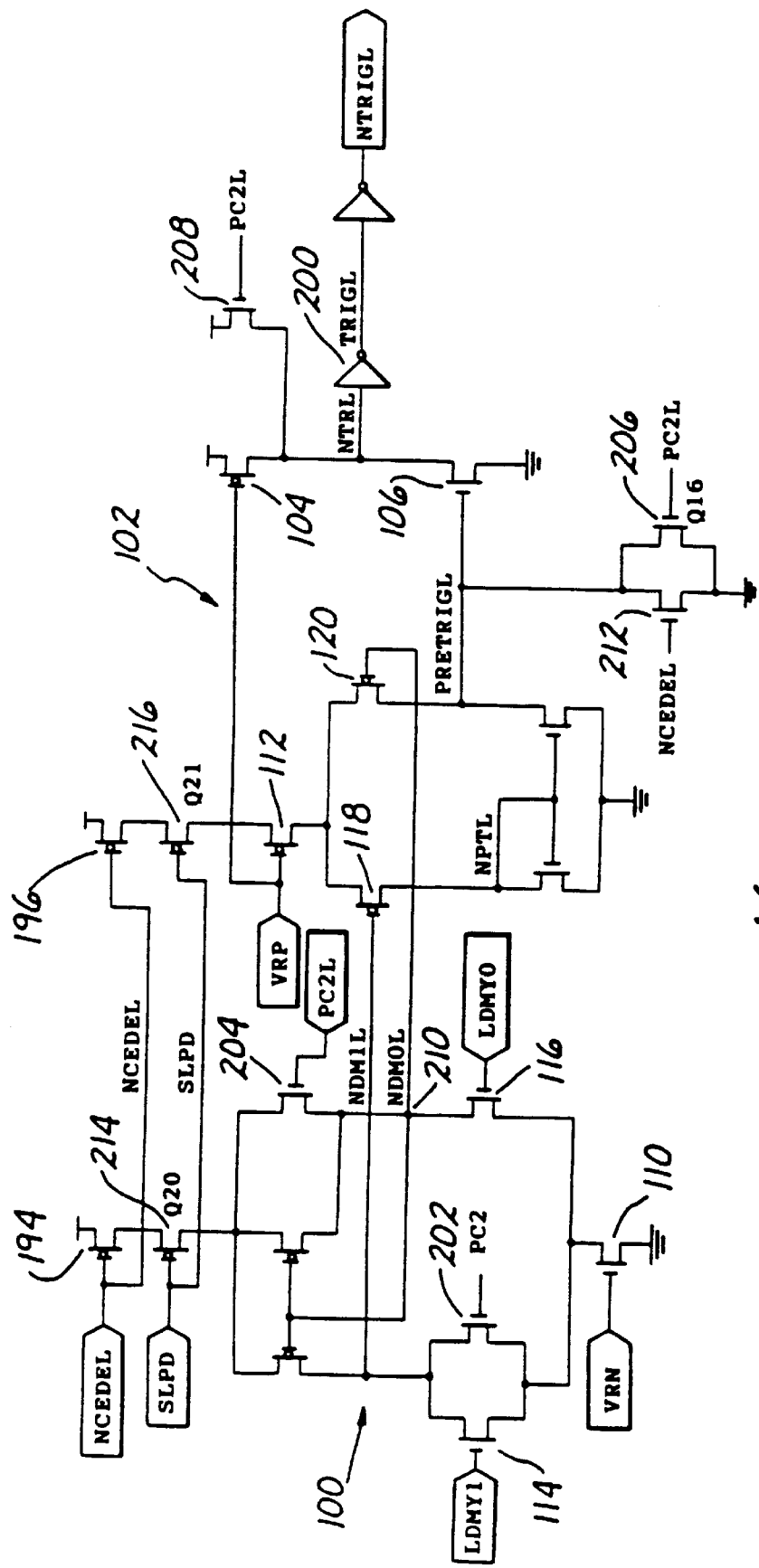
FIG. 16 is a schematic diagram of another embodiment of the trigger circuit of FIG. 15 including an enhanced power down capability.

FIG. 15 is a schematic very similar to the trigger circuit of FIG. 13 with the exception that certain of the transistors in FIG. 13 are not needed for the trigger circuits shown in FIGS. 15 and 16, and to further show that certain input signals differ between the particular application of the trigger circuit 16 and the trigger circuit shown in FIG. 15. The trigger circuit shown in FIG. 15 is used for an application requiring only one trigger circuit for the ROM. The trigger circuit shown in FIG. 16 is one of two circuits used in an application, like shown in FIG. 7, where a left trigger circuit and a right trigger circuit (not shown) are used. However, to the extent that the devices are closely analogous both in structure and in input signals, the same reference numerals are used in common between FIGS. 13 and 16. The trigger circuit of FIG. 15 will be described only to the extent that it differs from the description previously provided in connection with FIG. 13.

The trigger figure circuit of FIG. 15, as well as the one shown in the particular application of FIG. 16, is comprised of two cascaded differential amplifiers 100 and 102 each having two inputs. The output of second amplifier 102 is twice inverted, once by CMOS inverter 104, 106 and secondly by an inverter 200 to form the output signal trigger, TRIG.

As described above, the trigger circuit of FIGS. 15 and 16 uses the first differential amplifier 100 with a current source to ground through transistor 110 as gated by VRN, an internal reference voltage for the differential amplifier. The two outputs of first amplifier 100 are directly connected to the second amplifier which has a current source coupled to VDD through transistor 110 gated by VRP, another internal reference voltage for the differential amplifier circuit. Two complementary differential amplifiers are, therefore, cascaded by direct connection without level shifting circuitry between them. There is also a direct connection to the output of the amplifier, signal PRETRIG, to the gate of transistor 106 of the CMOS inverter.

Another important feature as previously described and shown in FIG. 15 is the use of different ratios for input transistors 114 and 116 of first amplifier 100. When input signal DMY1 to transistor 114 is at the same voltage level as the input signal DMY0 to transistor 116, the unbalance in the FETs 114 and 116 results in the amplifiers 100 and 102 driving the output TRIG to logical zero. DMY0 is a dummy bit line in a ROM core with ROM cells programmed to prevent DMY0 from discharging during a read cycle. DMY0 is precharged to the precharge voltage VPC. It has a capacitive load and coupled noise voltage similar to that of the bit line and the DMY1 line. DMY0 is used as the logical zero reference voltage for the eight sense amplifiers and for the sense trigger circuit as shown in FIG. 15. Similarly, the signal DMY1 is identical to DMY0 except that the ROM cells on DMY1 are programmed to discharge DMY1 to a voltage level about 0.2 volts below the precharge voltage VPC and is used to define the logical one. DMY1 is a logical one reference voltage for the eight sense amplifiers in the trigger circuit.

The magnitude of the imbalance in the width-to-length ratio in the FET input transistors 114 and 116 determines the differential voltage below DMY0 at which DMY1 will cause the TRIG output to switch to a logical one. Increasing the width-to-length ratio of input transistor 114 reduces the voltage level required for DMY1 to switch the TRIG output to a logical one.

In the illustrated embodiment, FET 114 has a slightly greater channel width than that of FET 116. However, a slightly greater channel length for FET 116 may S be preferred in some applications. The logical one level of DMY1 can also be shifted by changing the width-to-length ratio of NFET 106 and PFET 104 in the CMOS inverter which has PRETRIG as input. The CMOS inverter can have the NFET and PFET width-to-length sizes chosen to set the input trigger voltage of the inverter low, which increases the logical one level of DMY1 or high which reduces the logical one level. As before, the input trigger level is defined as the input voltage which switches the output voltage of the inverter 104, 106 to one half of VDD.

The operation of the trigger circuit of FIG. 15 comprises three steps:

(a) Precharging the ROM core DMY0 and DMY1;

(b) sensing the ROM core to discharge DMY1 for generating a TRIG output signal; and (c) powering-down the TRIG circuit.

Consider first the operation of precharging the ROM core DMY0 and DMY1. Near the beginning of the ROM cycle, the precharge clocks PC0, PC1 and PC2 are either high from the end of the previous cycle or they are switched high to precharge the ROM. The time duration of the precharge is controlled by a ROM circuit, which is called PCOK, and is previously described in connection with FIG. 13. Clock PC2 precharges DMY0, DMY1 and the eight bit lines to the precharge voltage VPC. The transistors 202, 204, 206 and 208 in FIG. 15 are turned on by the PC2 clock. These four FETs unbalance the internal nodes of the TRIG circuit of FIG. 15 to preset the TRIG output signal to a logical zero. The node 210, NDM0, is preset high, the signal PRETRIG is preset low and its inverse NTRIG is high.

The ROM core is then sensed and the TRIG signal is then generated as follows. Upon completion of the ROM core precharging, the clocks PC0, PC1 and PC2 are sequentially switched low respectively. Address decoding is completed during the precharge phase to select:

(1) the sector of the ROM core to be sensed;

(2) the word line within the sector; and (3) the bit and virtual ground lines within the sector.

After PC1 is switched low, eight selected virtual ground lines in the memory and the virtual ground line for DMY1 are switched low by an internal ROM clock SELV. DMY1 then starts discharging relatively slowly toward ground while DMY0 remains at about the voltage precharge level, VPC. As DMY1 ramps down node 210, NDM0, also ramps down and signal PRETRIG increases from 0 volts. When PRETRIG has a voltage level greater than a threshold level of FET 106, NTRIG begins switching toward ground. When PRETRIG has a voltage level equal to the input trigger of the CMOS inverter 104, 106, the output signal TRIG switches relatively quickly to a logical one.

The TRIG output signal has a very fast rise time to a logical one when DMY1 reaches a proper trigger voltage below DMY0. This is due to:

(1) the high gain of the differential amplifiers 100 and 102; and (2) the threshold effect caused by the CMOS inverter 104, 106.

The output TRIG does not switch high until the signal PRETRIG has increased from 0 volts to approximately the trigger level of the CMOS inverter 104, 106. In the present invention, the differential input trigger level is about 0.15 volts below DMY0.

The powering-down of the trigger circuit is performed as follows. First, the inverted chip enable delayed signal, NCEDEL, is high thereby switching off PFET 194 and 196. PRETRIG is switched to ground by NFET 212 gated by NCEDEL. With PRETRIG low, NFET 106 is also switched to off and there is no current path from VDD to ground so that power dissipation is zero.

Second, in another embodiment of the invention as shown in FIG. 16, there is an automatic power-down when NCEDEL is low. A signal SLPD is provided which is low during precharge, sensing and generation of the TRIG output signal and thereafter switches high. As will be shown, the high level reduces power dissipation in the TRIG circuit of FIG. 16 to zero. When SLPD switches high, PFETs 214 and 216 are switched off. The precharge clock PC2 then switches high. PRETRIG is driven low by PC2 through FET 206 as previously described. With PC2 and SLPD high, there is no current path from VDD to ground so the power dissipation is zero for the remainder of the memory circle cycle.

One-shot Pulse Generator for VLSI Memory Timing Control

An improved precharge timing control is provided for triggering the first one of a series of precharge clocks PC0 by means of discharging a single dummy word line. The dummy word line is comprised of a plurality of dummy word line segments wherein each of the segments are charged in parallel, but discharged in series. The discharge time required of the plurality of word line segments is sufficient to allow discharge of an end of a selected word line in the read only memory to ground. Improved timing with good performance is achieved by triggering the earliest precharge clock PC0 among a series of precharge clocks PC0 and PC1, for example, so that an improved precharge time for the ROM core for a fast process parameter is realized.

The time delay from the start of a ROM cycle to the time when the first of the precharge signals, PC0, is switch low, must provide: (a) sufficient precharge time for the ROM core; and (b) sufficient time to discharge the end of the previously selected word line to ground. Using a dummy word line to control PC0 instead of PC1 as was the case in the copending parent application, provides improved precharging as needed for good performance with fast process parameters. Delaying PC0 automatically delays PC1 since the ROM is designed to require PC0 to switch low first.

For slow process parameters, the PCOK circuit of FIG. 13 in the ROM is needed to provide sufficient time for precharging the ROM core. By utilizing both the circuitry of FIG. 17 and the PCOK circuitry of FIGS. 13 and 14 to delay PC0 from switching low, the delay time requirements for both precharging the ROM core and discharging the end of the previously selected word line to ground are both met for all process parameter variations.

Using one dummy word line instead of two reduces the silicon die area required for the circuit and allows for higher density circuitry as well as ease of design. Therefore, what is described in connection with FIG. 17 is a timing circuit particularly adapted for CMOS processing which uses a single dummy word line instead of two, which offers zero power dissipation when the output is either high or low, and which controls the time to switch PC0 low instead of the PC1 precharge clock as was the prior practice.

Figure 17:
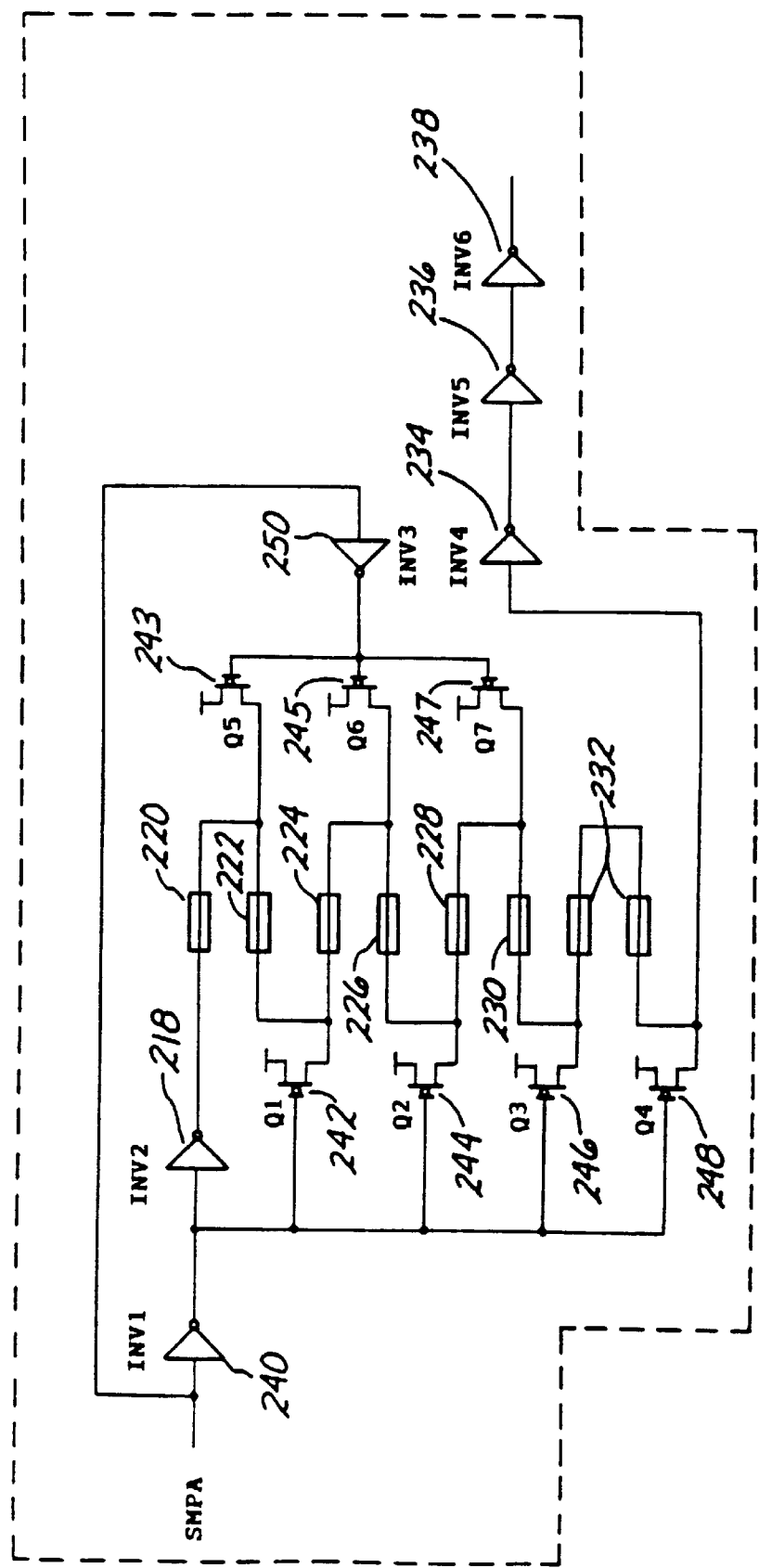
FIG. 17 is a schematic diagram of the one-shot pulse generator for VLSI memory timing control according to the invention.
Figure 18:
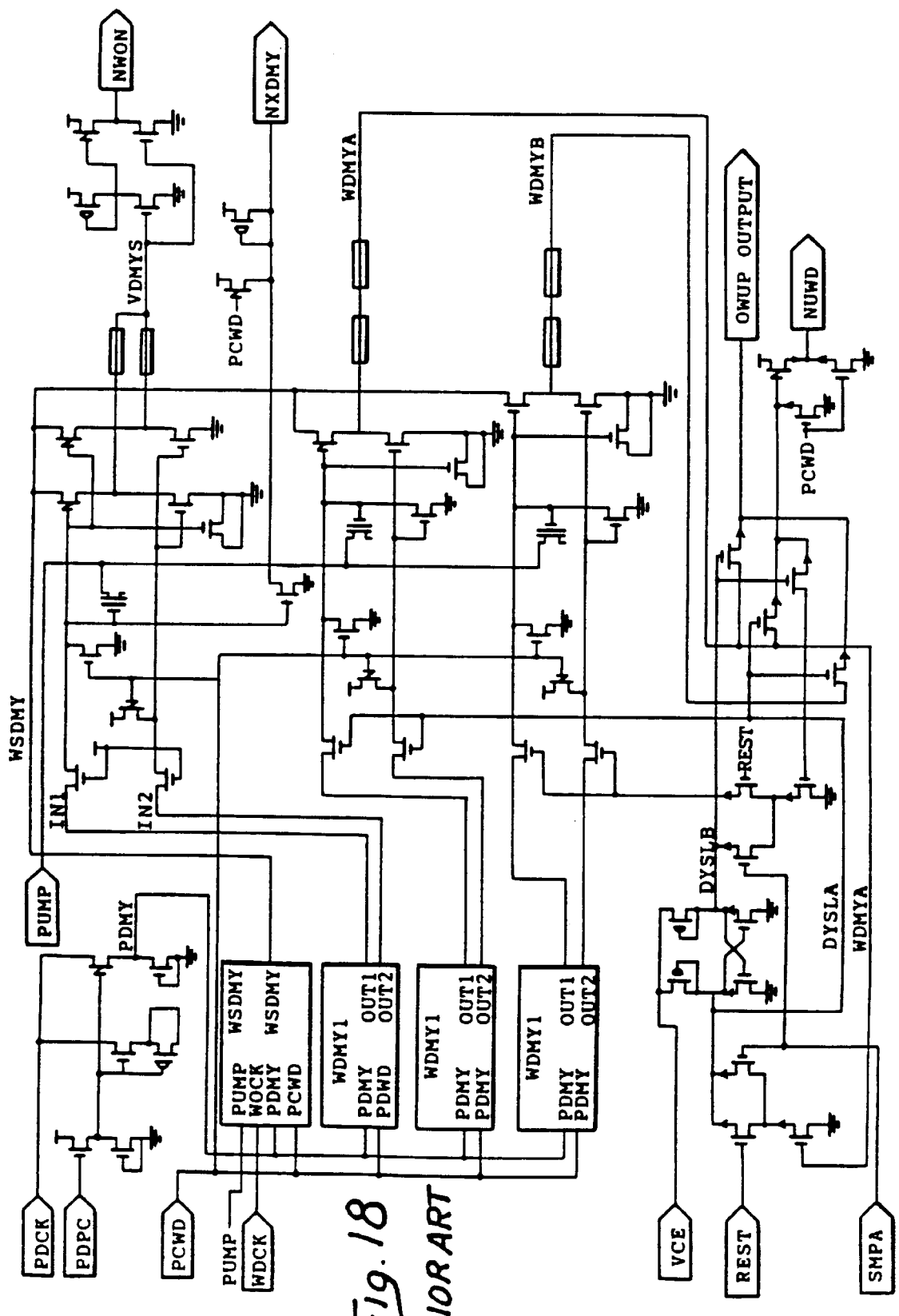
FIG. 18 is a schematic diagram of a timing control circuit of the prior art including a one-shot pulse generator with the output, OWUP.

Turn now to FIG. 17 which shows the improved one-shot pulse generator used for VLSI memory timing control. The propagation delay time of a pulse applied to one end of a word line is due to the distributed resistance and capacitance of the polysilicon word line connected to the row of ROM cells across the ROM core. The purpose of the circuit in FIG. 17 is to provide a delay time which is about the same as that required to discharge the end of the previously selected word line, hereinafter called the old word line, at a relatively slow rate to 0 volts. The sensing of the ROM core array of cells must be delayed until the old word line is down or low enough to prevent sensing old data instead of new data.

The old word line down (OWDN) circuit of FIG. 17 is comprised of six inverters, seven PFETs and one dummy word line folded into seven segments. Each word line segment is one eighth the length of the word line in the ROM core. The number of segments can be increased or decreased according to the amount of delay needed. In the illustrated embodiment, only seven segments were required.

The output of an inverter 218 is connected to the beginning of a dummy word line 220. The seven dummy word line segments 220–232 are connected in series to achieve a relatively long delay line for the discharge to ground. This delay simulates a discharge time of the old word line in the ROM core. The end of the dummy word line is connected to the input of inverter 234. The three inverters 234, 236 and 238 are cascaded to provide a high voltage gain from the input of inverter 234 through the output of inverter 238. This significantly increases the delay-time-to-rise time ratio of the output signal, old word down, OWDN. The delay time is measured from the failing or trailing edge of the sample address signal, SMPA, which is provided as an input to inverter 240 whose output in turn is coupled to inverter 218.

The purpose of folding the dummy word line into seven segments 220–232 is to allow FETs 242–248 and inverter 218 to rapidly precharge the full length of the dummy word line. Clearly, a different number of segments could be used if desired. In the presently illustrated embodiment, the precharge time is about 16 times less than the discharge time of the dummy word line collectively comprised of segments 220–232.

The general structure of the old-word-down circuit of FIG. 17 now having been described, consider its operation. The operation is comprised of the steps of:

(1) precharging the dummy word line high and presetting the old word down signal OWDN low;

(2) discharging the dummy word line toward ground; and (3) switching the old word down signal, OWDN, output high.

OWDN is low during precharge and switches high. The high level switches PC0 to zero if PCOK is high. If OWDN is high at the start of a ROM cycle, it is switched to zero when SMPA switches high.

Consider the first step of precharging the dummy word line high and presetting OWDN low. At the beginning of the ROM cycle, the sample address signal, SMPA, strobes high. In FIG. 17, inverters 240 and 250 are gated by SMPA. The output of inverter 240 is coupled to the gates of PFETs 242–248 which discharge them to 0 along with the input of inverter 218. By this means, both ends of each of the seven dummy word line segments 220–232 are quickly precharged to VDD. The output of inverter 234 is driven low by PFET 248 precharging the input of inverter 234. Inverter 234 drives OWDN low by means of the cascaded inverters 236 and 238.

OWDN now having been set low and the dummy word line segments set high, consider the step of discharging the dummy word line. When SMPA switches low, the outputs of inverters 240 and 250 switch high thereby turning off PFETs 242–248. Inverter 240 drives the output of inverter 218 low which starts the discharge of the beginning segment 222 of word line segments 220–232. Since the seven segments are connected in series, the segments are discharged sequentially to provide a relatively long delay time.

Finally, consider the step of switching the output OWDN high. When the end of dummy word line 220–232, in particular segment 232, discharges to the input trigger threshold voltage of inverter 234, the OWDN signal is quickly switched from ground to VDD by means of cascaded inverters 236 and 238. Input trigger level is again defined as the input voltage which will switch the specified output voltage to one half of the supply voltage, VDD.

RC Delay Circuit To Block Address Transition Detection

Improved delay and control of the pulse width of an address transition detection blocking signal, SURG, is achieved by providing an integrated RC circuit used to vary a control gate signal to determine the width of the address transition detection block signal, SURG. SURG is applied to the address transition detection circuitry to protect that address transition detection circuitry when output drivers are switched at the end of a read cycle. The beginning of the address transition detection block signal, SURG, is triggered on a logic gate delay signal, while pulse width of the SURG signal is determined by the RC integrated circuit, whose capacitive portion is quickly precharged and then discharged in response to the delayed signal.

Figure 19:
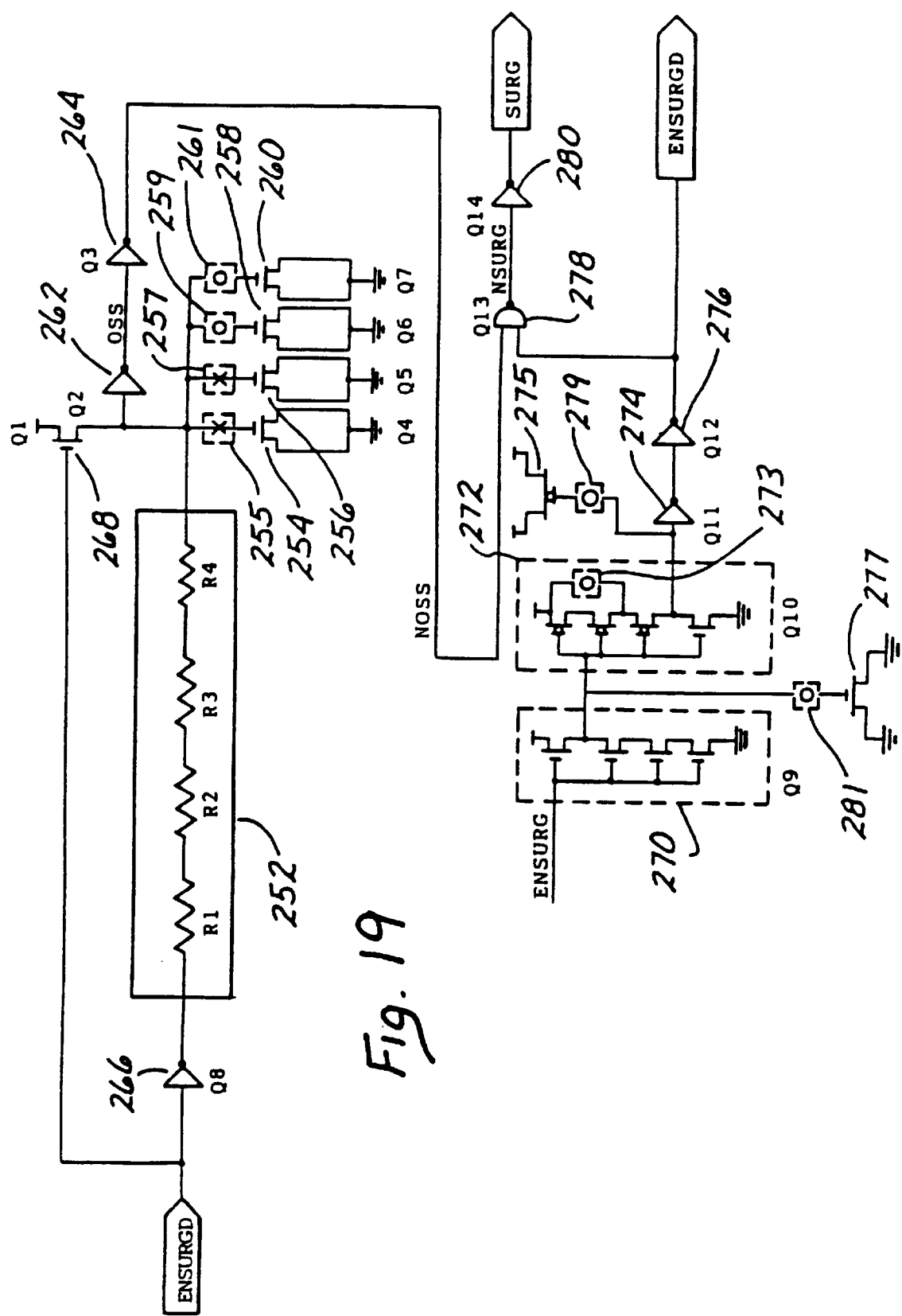
FIG. 19 is a schematic of the RC delay circuit of the invention for generating a delayed SURG circuit which compensates for process and voltage supply variations.

FIG. 19 is a schematic showing an improvement in an RC delay circuit to block address transition detections. A plurality of transistors, collectively denoted by reference numeral 252, form an N+ resistor. Transistors 254–260 are a plurality of FETs which act as gate capacitors which can be selectively added or subtracted from the N+ resistor 252. Inverters 262 and 264 amplify the RC delay signal. Inverter 266 discharges or precharges the N+ resistor 252 and gate capacitors 254–260. PFET 268 quickly precharges the RC delay circuit. Inverters 270, 272, 274 and 276 are used to delay the rising edge of the output signal, enable surge delay, ENSURGD.

The basic structure of the circuitry of FIG. 19 having now been outlined, consider its operation. N+ resistor 252 is precharged high at the start of a memory read cycle and is discharged at the end of a read cycle. N+ resistor 252 and gate capacitors 254–260 form an RC delay circuit. When the signal ENSURGD goes low at the start of a new read cycle, the PFET in inverter 266 precharges N+ resistor 252 and gate capacitors 254–260. PFET Q1 is added to precharge N+ resistor 252 and gate capacitors 254–260 at a higher rate.

When ENSURGD goes high at the end of the read cycle, the RC delay circuit is discharged. The discharge of this RC delay circuit plus some gate delay determines the width of the output pulse, SURG.

SURG disables the address transition detection circuitry. When SURG is high, no address transitions will be accepted by the read only memory. When SURG is low, address transitions are accepted and a new read cycle can be started. SURG is set high as the output drivers switch at the end of the read cycle. These output drivers generate ground noise and this noise may be falsely detected as an address detection if the address transition detection circuitry is not otherwise disabled.

If the operating voltage of the circuit, VDD, increases for any reason, the RC delay increases, but the gate delay decreases. This balance of RC and gate delays produces a pulse width that does not substantially vary as a function of combined process and operating voltage variations or drift.

The rising edge of ENSURGD is delayed by inverters 270–276 so that the rising edge of the SURG pulse which is output from NAND gate 278 and inverter 280 disables the address detection circuitry elsewhere in the memory circuit just before noise from the output drivers can generate a false sample address pulse, SMPA. The input to NAND 278 in turn is the output of inverter 276, ENSURGD, and the output of inverter 264, NOSS.

Figure 20:
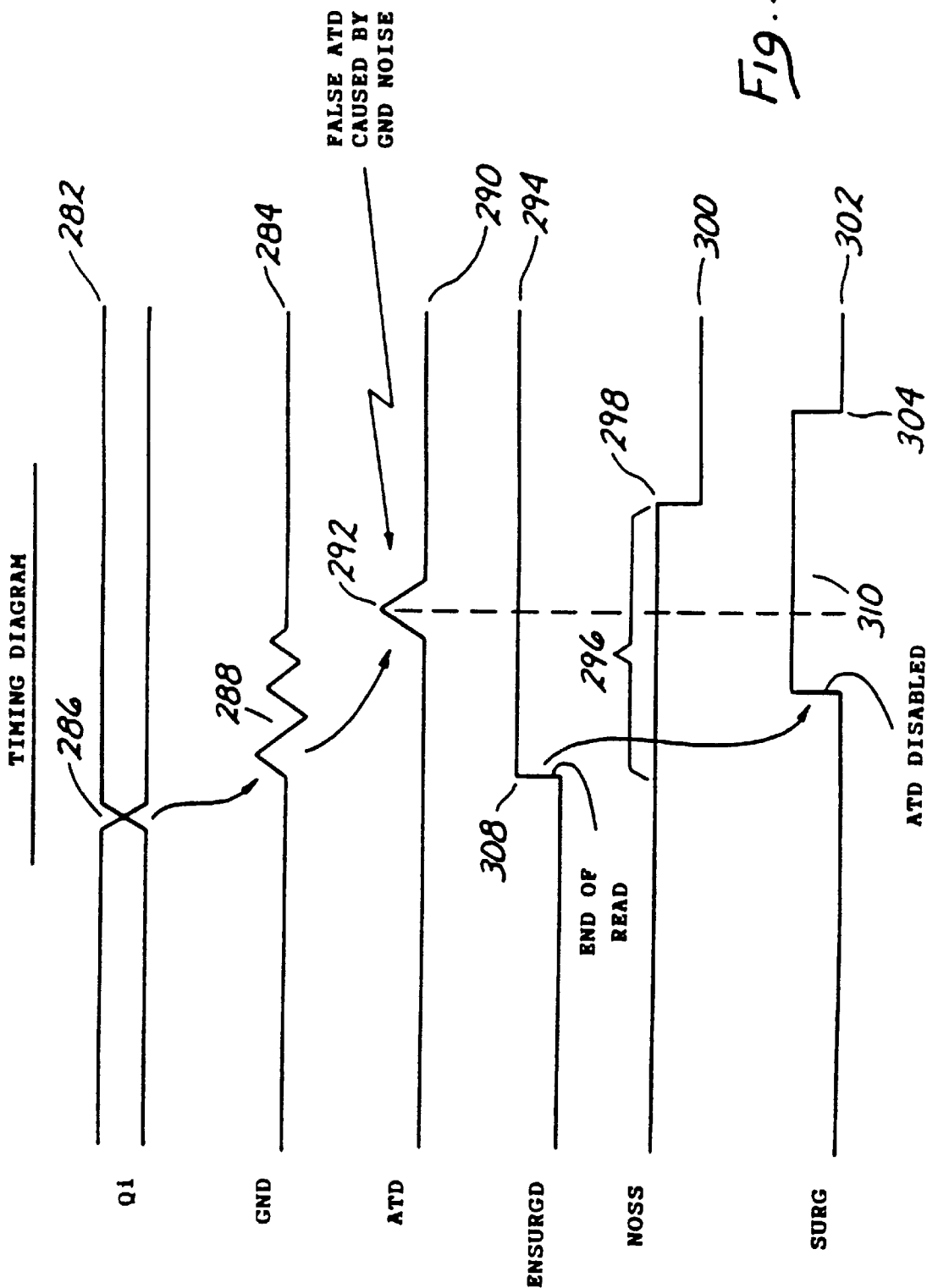
FIG. 20 is a timing diagram of the operation of the circuitry of FIG. 19.

Reference to the timing diagram of FIG. 20 will illustrate the point more clearly. Line 282 of FIG. 20 represents an output signal while line 284 represents the ground voltage. A change of output signal at time 286 can cause some noise on ground line 284 during a later time interval 288. The noise during interval 288 in turn can cause a false address transition detection as depicted on the address transition detection signal 290 at time 292. When ENSURGD as shown on line 294 goes active to the input of inverter 266, at an RC time delay later as depicted by interval 296, the output of inverter 264, NOSS, transitions low at time 298, thereby causing SURG as depicted on line 302 to go low at edge 304.

When the SURG pulse is high, the address input receivers are disabled. This time is added to the read cycle, so it is very desirable to minimize it. Metal cut and open options 255, 257, 259, and 261 are added to the RC delay circuit to adjust the SURG pulse width to be as small as possible consistent with the present teachings. Additionally, metal cut and open options vary the delay from the rising edge of ENSURG to the rising edge of SURG. These metal cut and open options can accurately position the rising edge of SURG. By changing the metal mask, the SURG pulse width and the position of its rising edge may be easily varied.

CMOS Sense Amplifier/Latch Circuit for a Single Data Input Signal

A sense amplifier for use in a read-only memory circuit for sensing the data bits having improved latching and sensing capabilities is provided through the use of a four input differential amplifier. Two of the inputs are coupled to the data bit signal, BIT, while the other two inputs are coupled to dummy bit lines, DMY0 and DMY1. The conductance of the input FETs coupled to the data bit signal can be less than the inputs coupled to the dummy bit lines if greater negative noise voltage needs to be tolerated at some sacrifice in the switching speed of the sense amplifier. Further, the differential amplifier has its outputs isolated from the inputs during a precharge period until such time as after the inputs become less noisy. Still further, the outputs of the sense amplifier are precharged to an equalized voltage to allow for a quicker response once the inputs are coupled through the differential amplifier to the outputs. Data is latched into the differential amplifier after it is reliably sensed and the outputs again disconnected from the inputs so that the inputs may then change in response to the next read cycle without affecting the latched data outputs. After the data is sensed and latched, the sense amplifier is then powered-down so that no power is consumed in the circuit.

The CMOS differential amplifier of the invention utilizes two inputs, a current source and a current mirror. Only one of the inputs is a data input with the second being a reference voltage. The data input voltage may be within approximately 0.1 volts of the reference voltage. The problem of such small voltage differences is solved by utilizing four inputs. The data input, defined as BIT, is connected to two inputs to the differential amplifier and the other two inputs are connected to two reference voltages called DMY0 and DMY1. The effective reference voltage is between the DMY0 voltage and the DMY1 voltage. The effective reference voltage level can be shifted by changing the width-to-length ratio of the FETs connected to DMY0.

In the present invention, reducing the width-to-length ratio increases the bit input negative noise immunity with some decrease in voltage gain of the amplifier. The high gain in the CMOS differential amplifier is used for increased memory speed and can be sacrificed to some extent for the greater immunity to the bit input noise voltage. Automatic power-down to zero power while retaining the data is also achieved.

Figure 21:
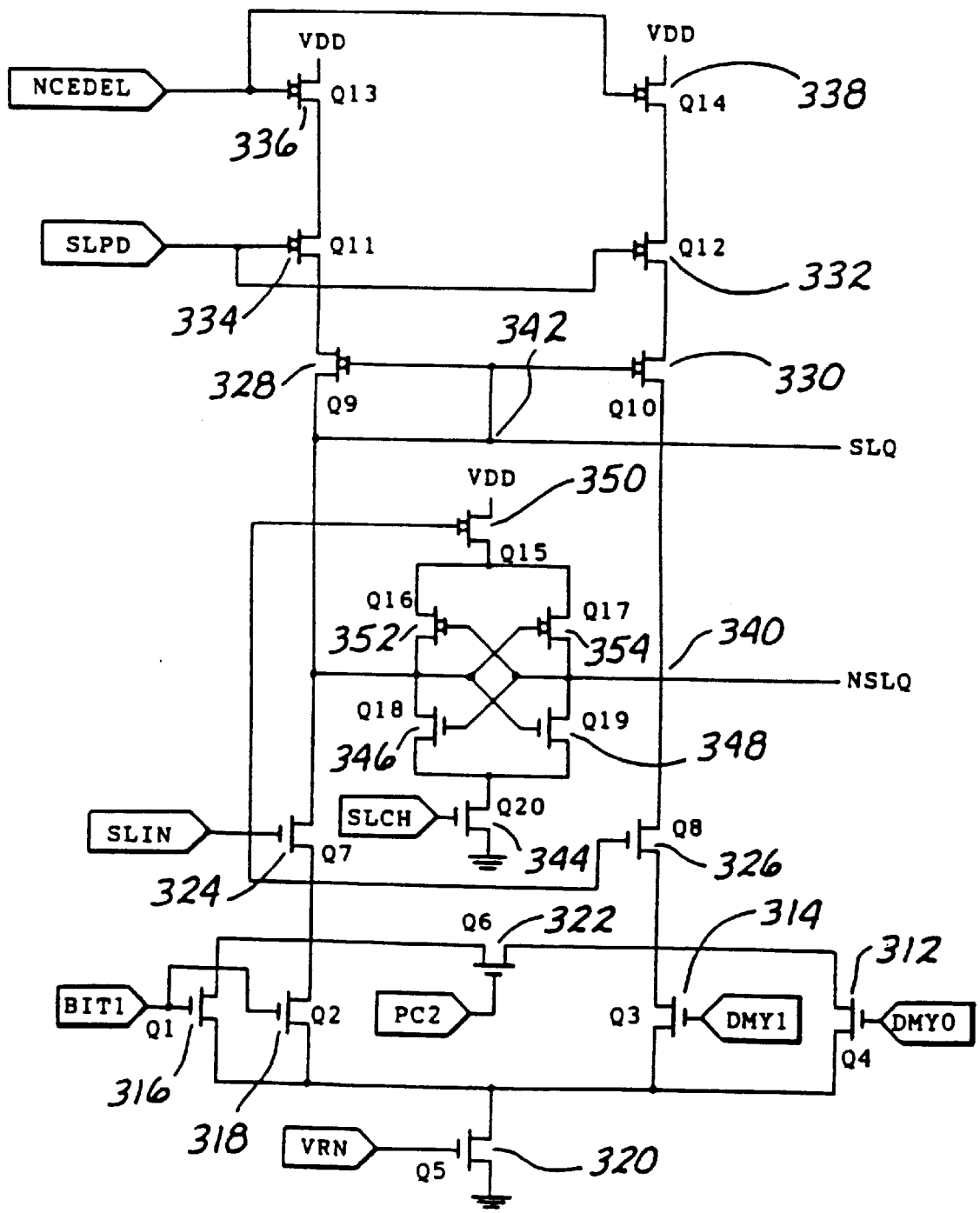
FIG. 21 is a schematic diagram of the CMOS sense amplifier/latch circuit for a single data input signal according to the invention.

Refer now to FIG. 21 which shows a schematic of the sense amplifier. The signal DMY0 is a dummy bit line in a ROM core as described above which has been programmed to prevent DMY0 from discharging during a read cycle. DMY0 is precharged as are all the bit lines to the precharge voltage, VPC. Again, DMY0 has a PN junction leakage current and coupled noise voltages which simulate those of a bit line in the main memory core and in the DMY1 line. DMY1 is similar to DMY0 except that the ROM cells coupled to the DMY1 line are programmed to discharge DMY1 to a voltage level of about 0.2 volts below the precharge voltage, VPC. DMY0 is connected to the gate of FET 312 while DMY1 is coupled to the gate of FET 314. DMY0 serves as a logical zero reference voltage and DMY1 serves as a logical one reference voltage. The effective reference voltage is a level between the DMY0 and DMY1 levels.

The signal, BIT, is coupled to the gates of both FETs 316 and 318. The differential amplifier is comprised of the transistors 312–338. The differential amplifier compares the parallel conductance (resistance) of FETs 316 and 318 to that of FETs 312 and 314. FET 320 provides a constant current source for the differential inputs of FETs 312–318. PFETs 328 and 330 provide a current mirror function for the basic differential amplifier.

In one embodiment, FET 312 has a slightly longer channel length than that of FETs 314–318 and therefore a lower channel width-to-length ratio. The input signal bit may have some negative noise voltage on it and still balance the amplifier since FETs 316 and 318 have a combined width-to-length ratio greater than that of FETs 312 and 314. This feature is novel to the present application. In the preferred embodiment, FETs 312–318 all have the same channel dimensions to achieve the best memory speed with adequate negative noise immunity.

The overall structure of the differential amplifier having now been described in the schematic of FIG. 21, turn now to its operation which can be described in four phases. The method of operation is comprised of the steps of:

(1) precharging the ROM core, DMY0, DMY1, and the eight lines carrying the signals BIT;

(2) sensing the ROM core to discharge DMY1 and, depending upon the program data, the bit lines;

(3) latching the data; and (4) automatically powering-down the sense amplifier of FIG. 21 and retaining the latched data.

Consider first the step of precharging the ROM core including the DMY0, DMY1 and BIT lines. Near the beginning of the read-only cycle, the precharge clocks PC0, PC1 and PC2 in the memory circuit are either high from the previous read cycle or have been switch high to precharge the ROM. The time duration of precharge is controlled by a circuit in the ROM called PCOK described above. The clock PC2 precharges DMY0 and DMY1 and the eight bit lines to the precharge voltage, VPC. FET 322 is gated by PC2. Since FETs 324 and 326 are turned on by a signal, SLIN, the nodes 340, NSLQ, and 342, SLQ, are equalized to the same voltage level while PC2 is high by means of FETs 322, 324 and 326. As long as the PC2 clock is high, the output nodes 340, NSLQ, and 342, SLQ, remain at the equalized voltage level and do not respond to the inputs of the signals bit, DMY0 and DMY1.

The signal, SLIN, is high during precharge and while sensing the signals BIT, DMY0 and DMY1 inputs. When the data is latched by the signal, SLCH, as described below, SLIN switches low to disconnect the Y decode in ROM core from the sense amplifier. The signal, SLCH, is a signal which is low during precharge and sensing, and then is switched high to latch the data defined by the voltage levels on nodes 340, NSLQ, and 342, SLQ, at the start of the latch operation.

One feature of the invention is the maintenance of the input clock PC2 high until the input BITS, DMY0 and DMY1 are free of noise and/or have reached an appropriate voltage level for sensing. By this means, the outputs at nodes 340, NSLQ, and 342, SLQ, are preset to equal voltage levels from which they can quickly respond to the input signals.

The ROM core, DMY0, DMY1 and BIT now having been precharged and a sense amplifier similarly preconditioned to receive these inputs, consider now the step of sensing the ROM core. Upon completion of ROM core precharging, PC0, PC1, and PC2 are sequentially switched low in the order stated. Address decoding is completed during the precharge phase to select: (1) the sector of ROM core to be sensed; (2) the word line within the sector; and (3) the bit virtual ground lines within the sector which will be selected. After PC1 is switched low, the eight selected virtual ground lines, and the virtual ground line for DMY1, are switched low by an internal clock signal, SELV. DMY1 then starts discharging relatively slowly toward ground, while DMY0 remains at about the precharge voltage level, VPC. The eight bit lines, connected from the Y decoder to the eight sense circuits, will discharge in a manner similar to the discharge rate of DMY1 or remain at about the DMY0 voltage level depending upon how the selected ROM cells are programmed.

Consider now what happens when the bit signal remains at the DMY0 level. At the start of the sensing phase, DMY0, DMY1 and BIT are at or near the voltage precharge level, VPC. With FETs 318 and 316 having a combined width-to-length ratio greater than that of FETs 312 and 314, the input signal BIT will drive the node 342, SLQ, to a lower voltage than node 340, NSLQ. As DMY1 ramps relatively slowly downward to about 0.2 volts, the parallel conductance of FETs 312 and 314 becomes less, node 340, NSLQ, is driven higher, and node 342, SLQ, is driven to a lower voltage level. At the time of the starting of the data latching operation, the node 340, NSLO, is typically more than 1 volt higher than the voltage level at node 342, SLQ.

On the other hand, consider now what happens when the signal, BIT, discharges in a manner similar to DMY1. Both the signals BIT and DMY1 ramp relatively slowly from the initial precharge voltage, VPC, to about 0.2 volts below DMY0. With the input bit coupled to both FETs 316 and 318, the parallel conductance of these FETs is initially greater than FETs 312 and 314. Therefore, as bit ramps downward with DMY1, the conductance of 316 and 318 becomes less than that of FETs 312 and 314. FETs 312 and 314 then drive node 340, NSLQ, to a level below node 342, SLQ. In the illustrated embodiment, node 340, NSLQ, is driven to a voltage level lower than node 342, SLQ, by approximately more than one volt at the time when the data latching operation begins.

Consider now the step of latching the data. A circuit, TRIG, described above, detects when DMY1 is about 0.2 volts below DMY0. When this occurs, another circuit, called output control, OUTCNTL, described elsewhere in this specification, sequentially and quickly switches the signal, SLCH, high, then the signal SLIN low, and then the signal, SLPD, high. SLPD is low during precharge, sensing and latching of the data and then switches high. The high level reduces the dissipation of the sense amplifier to zero, as will be described below, while the latched data is retained.

As SLCH switches high, FET 344 which is gated by SLCH, drives the source terminals of FETs 346 and 348 toward ground. For a logical one, node 342, SLQ, is at a higher voltage level than node 340, NSLQ, at this time. Therefore, FET 348 conducts more current than FET 346. FET 348 therefore drives node 340, NSLQ, toward ground faster than FET 346 drives node 342, SLQ, toward ground. The result is that FET 346 is turned off and node 340, NSLQ, is driven low by FET 348.

Next, as a signal SLIN switches low, PFET 350, which is gated by SLIN, drives the source terminals of FETs 352 and 354 high. Since node 340, NSLQ, is held low by FET 348, FET 352 conducts a higher current than FET 354. FET 352 then drives node 342, SLQ, to the supply voltage level, VDD. Also, as a signal SLIN switches low, FETs 324 and 326 are turned off which isolates the input FETs 312–318 from the latch circuit. This prevents the subsequent precharging of the signals bit, DMY0 and DMY1 from effecting the latched data.

For a logical zero, node 340, NSLQ, is initially at a higher voltage level than node 342, SLQ, and node 340, NSLQ, will remain higher than node 342, SLQ, after completion of these latching operation. Since the latch circuit comprised of FETs 344–348 and 350–354 is symmetrical, the latching operation is reversed for logical zero as compared to that of a logical one as described above.

However, one difference in the latching of the logical zero from that of a logical one is that node 342, SLQ, does not switch to a good ground level until the signal SLPD switches high and turns off PFET 334. The current path to the supply voltage VDD exists through FETs 328, 334 and 336 before FET 334 is turned off by the control signal SLPD.

Consider now the step of powering-down the sense amplifier. The inverter chip enable signal, NCE, when low allows the sense amplifier circuit to be connected to VDD for operation. However, when NCE is high, most of the ROM is powered-down along with the sense amplifier. Specifically, when NCE is high, FETs 336 and 338 are switched off. There is no current path from the supply voltage VDD to ground so that power dissipation is zero.

When NCE is low, there is an automatic power-down as follows. When the signal SLPD switches high, FETs 332 and 334 are switched off. The latch circuit comprised of FETs 344–354 drives nodes 342, SLQ, and 340, NSLQ, to VDD or ground depending upon the data latched. With the control signal SLIN low, and the control signal SLPD high, there is no current path from the supply voltage, VDD, to ground so that power dissipation is zero for the remainder of the memory cycle.

A Low Noise X Decoder Circuit for Use in a Semiconductor Memory

In a very large scale memory undesired accumulated voltages can build up on dynamic nodes from capacitive coupled noise in a multiplicity of devices coupled to the clocked nodes even when almost all of the devices are nominally off. By providing a transistor which discharges the dynamic node to a logical zero on every read cycle and a clamping transistor to maintain this zero for unselected devices, such undesired stray voltage buildups can be avoided.

Figure 23:
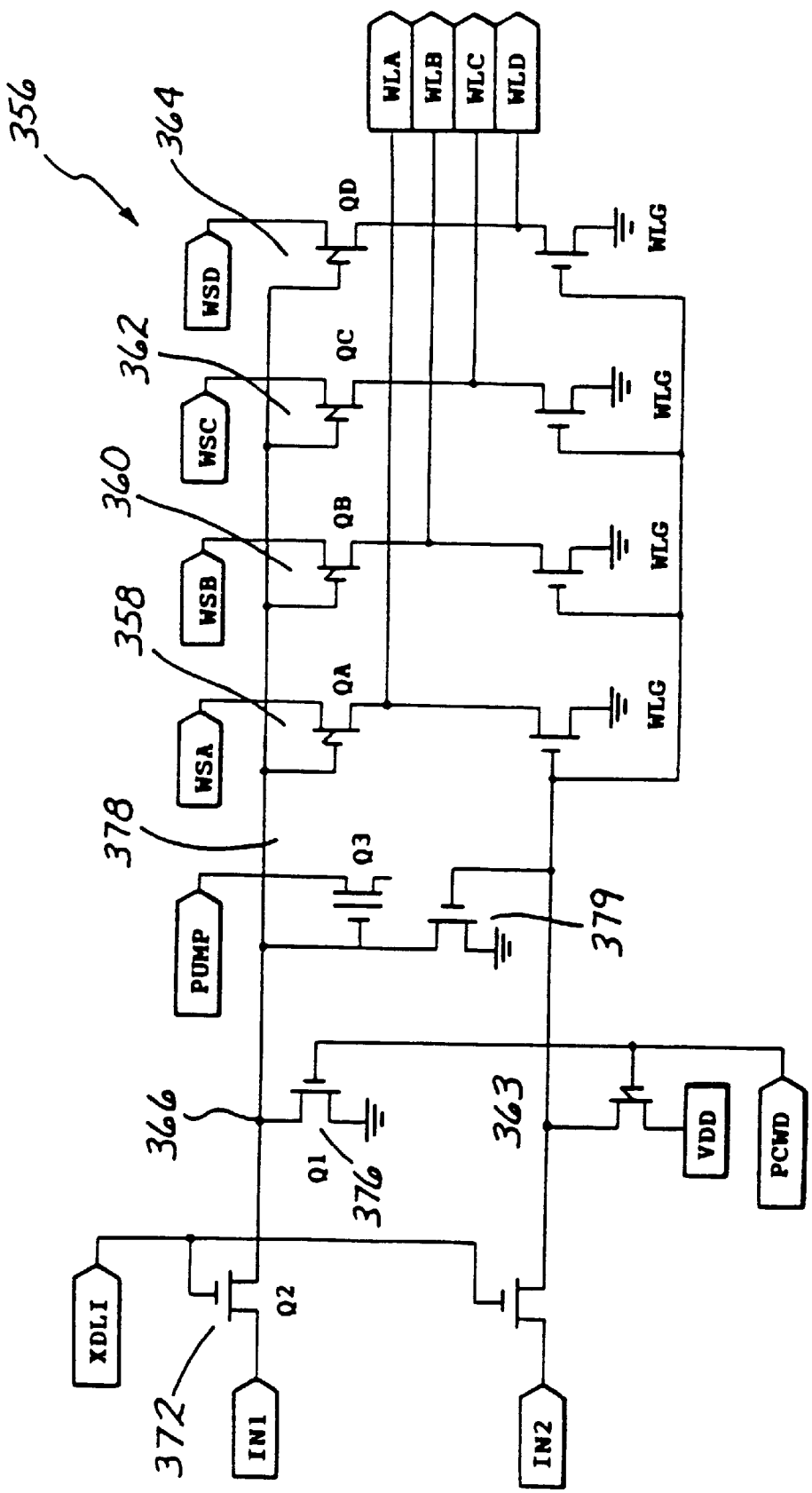
FIG. 23 is a schematic of one of the word line drivers in FIG. 22.
Figure 24:
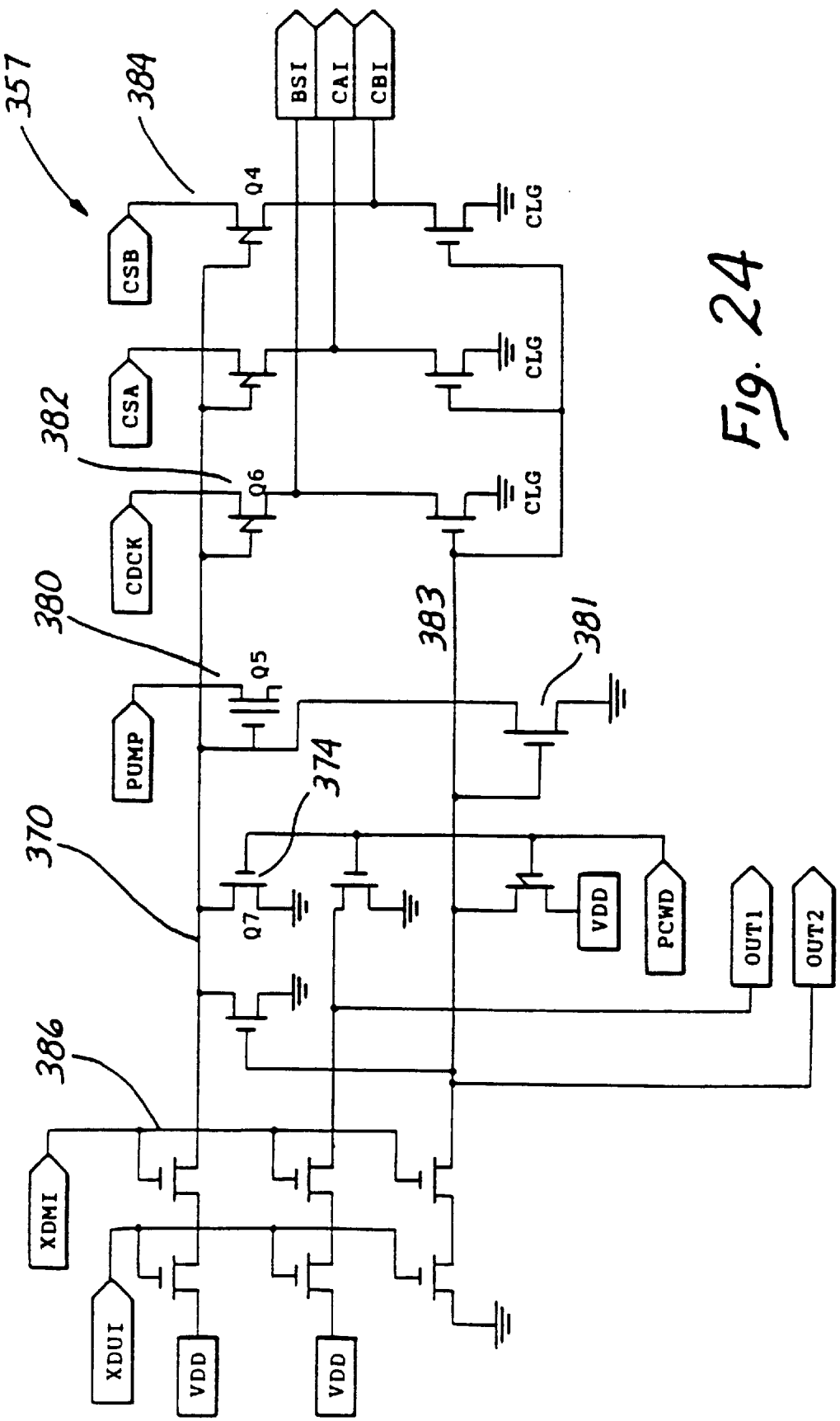
FIG. 24 is a schematic which shows a column select driver for the clocks PUMP, WSA, WSB, WSC or WSD in FIG. 22.

The present invention suppresses a noise which arises from the dynamic nature of the X decoder circuit in combination with a large number of cells tied to a particular clock or series of clocks which are illustrated in FIG. 23 as clock signals WSA, WSB, WSC, WSD and PUMP as well as to lessor degree clock signals of the type shown in FIG. 24 illustrated by signals CDCK, CSA and CSB. The nature of these clock signals will become apparent in the description that follows. The noise problem becomes particularly acute in very large memory arrays, generally over two megabits in size. These clocks are all connected in a similar way to the cells, that is, they are all tied to the source of a normally off field effect transistor.

Figure 22A:
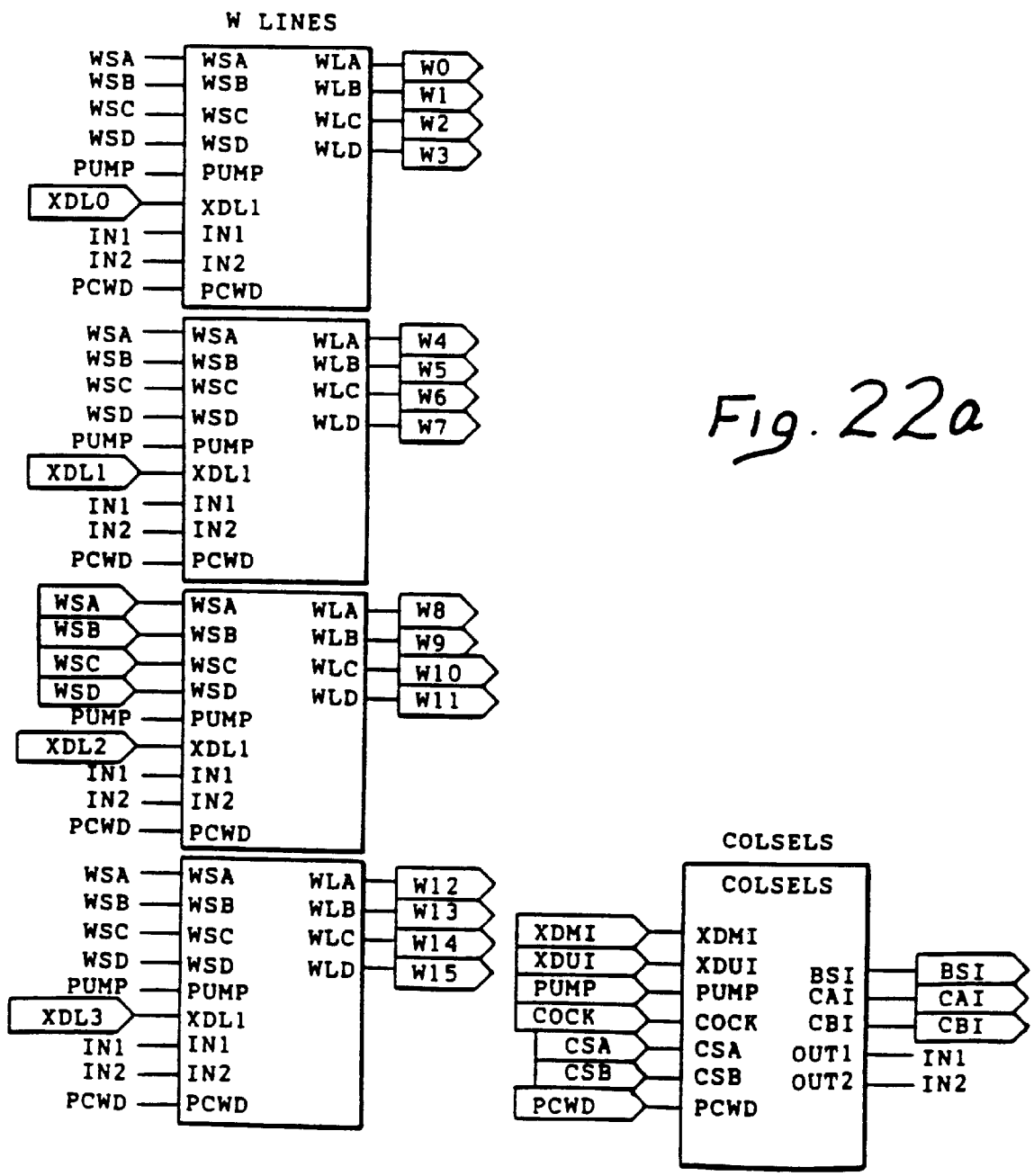
FIGS. 22A and B are a block diagram which illustrates the word lines, W0 through W31, decoded by decoders having the clock signals WSA-WSD, and PUMP as inputs.
Figure 22B:
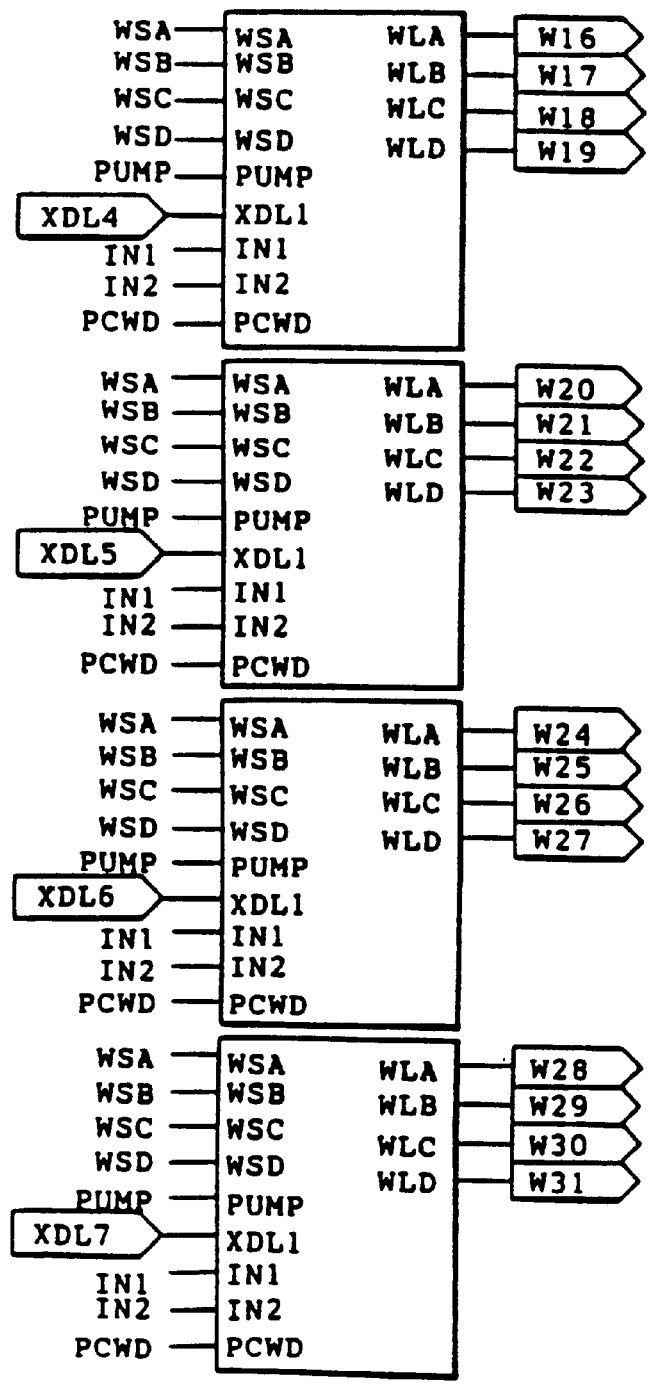

In the nature of large scale memory designs, it is typical that only one sector among many sectors will be on. Also, only one block of the cells, such as the W0–W3 lines in FIG. 24, of eight possible blocks is accessed. Therefore, each clock, for example WSA–WSD, in a four megabit read-only memory which has 32 sectors, has 255 unselected NFET switches shown as FETs 358–364 in FIG. 23. In FIG. 22A and B, a block diagram is illustrated which shows the word lines, W0 through W31, decoded by decoders 356 having the clock signals WSA–WSD, and PUMP as inputs. Thus, only one of the blocks 356 in a four megabit ROM will be accessed.

The schematic of one of the blocks 356 in FIG. 22A and B is illustrated in schematic diagram of one of the word line drivers 356 in FIG. 23. Each of these word line drivers 356 includes FETs 358, 360, 362, and 364 having their sources coupled to the clocks WSA–WSD. If the word line driver happens not to be the one which is accessed, then there will be 255 such unaccessed NFET switches 358 in the block diagram of FIG. 22A and B and one only accessed NFET switch 358. So for example for the WSA clock, FET 358 has a high gate voltage on only one of the total of 256 FETs 358 tied to it, that is in 32 sectors of eight blocks which are tied to WSA. The other 255 FETs 358 will have a low gate voltage. The problem that arises from this is that when a large number of FETs 358–364 from various sector blocks are connected to the clocks WSA–WSD in NMOS decoders, the off level or low voltage is precharged onto the selection node 366 and the on level is precharged onto the deselection node 363. These dynamic nodes are sensitive to noise.

In particular, if any positive noise voltage is encountered on the 255 unselected selection nodes 366, small but significant parasitic leakage paths are opened to the clock signal simply due to the large number of FETs involved, though the contribution of each FET may be relatively small. This noise is induced onto nodes 366 through gate-to-source overlap capacitance and interconnection overlap capacitance with the clocks, PUMP, CDCK, and CSA or CSB as depicted in FIG. 24, which shows a column select driver, or for the word line driver of FIG. 23 for the clocks PUMP, WSA, WSB, WSC or WSD.

Even if the noise is not sufficient enough to turn the unselected FETs in question on, a considerable increase in leakage is developed via subthreshold currents when the voltage on node 366 is coupled positive toward the threshold voltage from its precharge level at ground. Again, although these subthreshold currents are very small, they become significant due to the large number of cells coupled in parallel. The result is the clocks have longer rise times as well as reduced amplitudes.

Turning to FIG. 23, according to the invention, transistor 376 is included in the circuit of the word line driver 356 while transistor 374 is included in the circuit of column select driver of 357 shown in FIG. 24. The addition of these two discharging FETs ensures that all nodes 366 and 370 will be discharged to ground at the start of each memory read cycle.

To illustrate this, consider a memory cycle. In the unaccessed sectors, node 366 and node 370 will be precharged low through FETs 376 and 374 by the precharge word control signal, PCWD. After PCWD goes low, a time period is allowed for one node 366 and one node 370 in the array to be driven high through FET 372 and FET 386 respectively while all the other 255 nodes 366 and 31 nodes 370 remain low strictly due to the stray capacitance on these nodes if FETs 379 and is 381 were not included in the design of these circuits. After that period has transpired, one of the WS clocks, one of CS clocks, CSA or CSB in FIG. 24, clock signal CDCK and a clock signal PUMP will go from an off state to an on state. Assume for example that it is WSA, CB, CDCK and PUMP that goes high. Due to the source-drain overlap capacitances of FET 358 and FET 378 in FIG. 23 as well as FETs 380–384 in FIG. 24, nodes 366 and 370 will experience noise coupling thereby causing them to rise above their ideal zero voltage level. Because of the large quantity of these FETs tied to each clock, even a small voltage increase at the gate will cause increased leakage across these ideally off switches and will have a significant detrimental effect upon the clock rise time and amplitude due to the leakage.

Now consider FET 379 in FIG. 23 and FET 381 in FIG. 24. These FETs act as noise clamps on all unselected devices and discharge any positive noise on the nodes 366 and 370. For unselected devices, node 363 and 383 are logic high and positive noise on nodes 366 and 370 can be discharged through FETs 379 and 381. For selected devices, node 363 and 383 are logic low and FETs 379 and 381 are not active.

Because of the discharging FET 376 added to word line driver 356 shown in FIG. 23 and FET 374 added to column select driver 357 in FIG. 24, the build up of charge is dissipated on every read cycle. The noise clamping FET 379 added to word line driver 356 shown in FIG. 23 and FET 381 added to word line driver 357 shown in FIG. 24 discharge the noise from the switching of the clocks WSA–WSD, PUMP, CDCK, CSA and CSB from the dynamic nodes 366 and 370 for unselected devices. These four FETs ensure that no accumulation of charge or substantial leakage current collectively arises.

Improved Time Constant Generation Circuit

A stable timing signal can be generated using less costly and inherently less stable integrated circuit RC delay elements by generating the timing signal from a node, which is discharged through the range of the voltage supply coupled to the output of the RC delay element. By basing the generation of the time signal on the basic timing node in a timing control circuit on the time when the basic timing node achieves a voltage in a discharge state, increases in the supply voltage of the RC delay element can be used to offset changes in switching speeds of corresponding circuit elements coupled to the RC delay element and other nodes within the timing circuit. The supply voltage may in fact be directly offset by one or more device threshold voltages by coupling the basic timing node to the voltage supply, VDD, through a threshold voltage of one device and to ground through a second device.

The invention is comprised of an RC timing element in conjunction with a set of transistors to control the RC timing ramp voltage progression and to detect the end of a timing progression in such a way to cancel out variations in the circuit elements and to generate a stable time period which is more insensitive to voltage and temperature variations than any of the individual elements in the circuit. The result is an accurate tiring signal available at a fraction of the cost of other more expensive approaches considered in the prior art.

The conventional approach to providing an RC based time constant circuit is to use the most linear portion of the RC time charging curve in combination with the most accurate circuit references or thresholds to obtain the most accurate time period possible.

Figure 25:
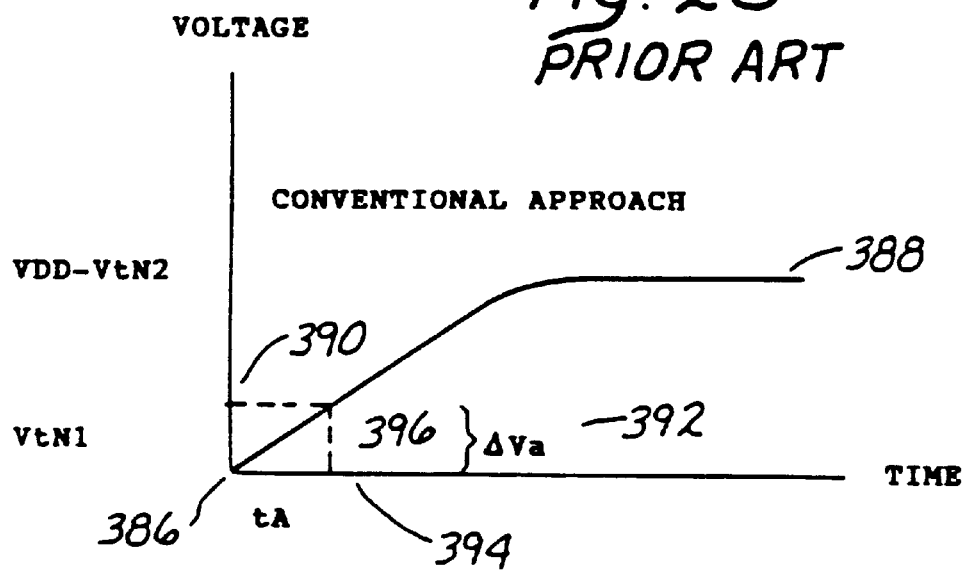
FIG. 25 is a time graph of the voltage at a signal or output node in a prior art timing circuit in a semiconductor memory.
Figure 26:
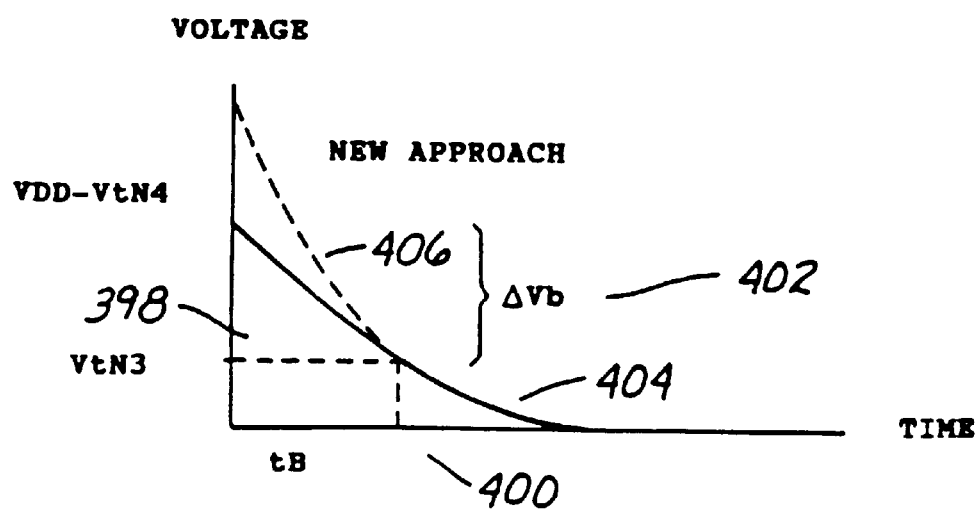
FIG. 26 is a time graph of the voltage at a signal or output node in a timing circuit in a semiconductor memory according to the invention.

Comparison of FIGS. 25 and 26 will make the differences in the approach of the invention clear. FIG. 25 is a time graph of the voltage at a signal or output node in a prior art timing circuit in a semiconductor memory. The voltage varies from ground or zero at what has been defined as the zero time shown as time point 386 in FIG. 25 and charges up through a time delay to a saturation voltage level 388 which is typically at the supply of voltage level, VDD, less the threshold voltage necessary to turn on a driving transistor, which is used to drive the lines toward the supply voltage, VDD. The output will typically trigger at a threshold voltage VTN1 shown as voltage level 390 in FIG. 25 at voltage level 392 above ground at time 394. As a variation supply voltage arises, typically the speed of the circuit elements increases too so that slope of the linear portion 396 of the curve of FIG. 25 increases causing the threshold time TA, 394, to move toward the origin or shorten.

FIG. 26 graphically illustrates the approach of the invention. The nonlinear portion of the decay curve of FIG. 26 begins from the supply voltage VDD minus a threshold voltage VTN4 and decreases until the threshold voltage 398 is reached, which threshold voltage is defined as the trigger point for the timing circuit output at a time TB 400. In this case, the voltage difference 402 which must occur is the difference between the supply voltage VDD and two threshold voltages VTN3 and VTN4.

As the supply voltage, VDD varies upwardly, for example, the slope of the decay curve will tend to increase, but since the beginning voltage is higher, the threshold point VTN3 398 is reached approximately at the same time TB 400 as before, this is represented by a first curve 404 in solid outline in comparison to a second curve 406 shown in dotted outline.

Figure 27:
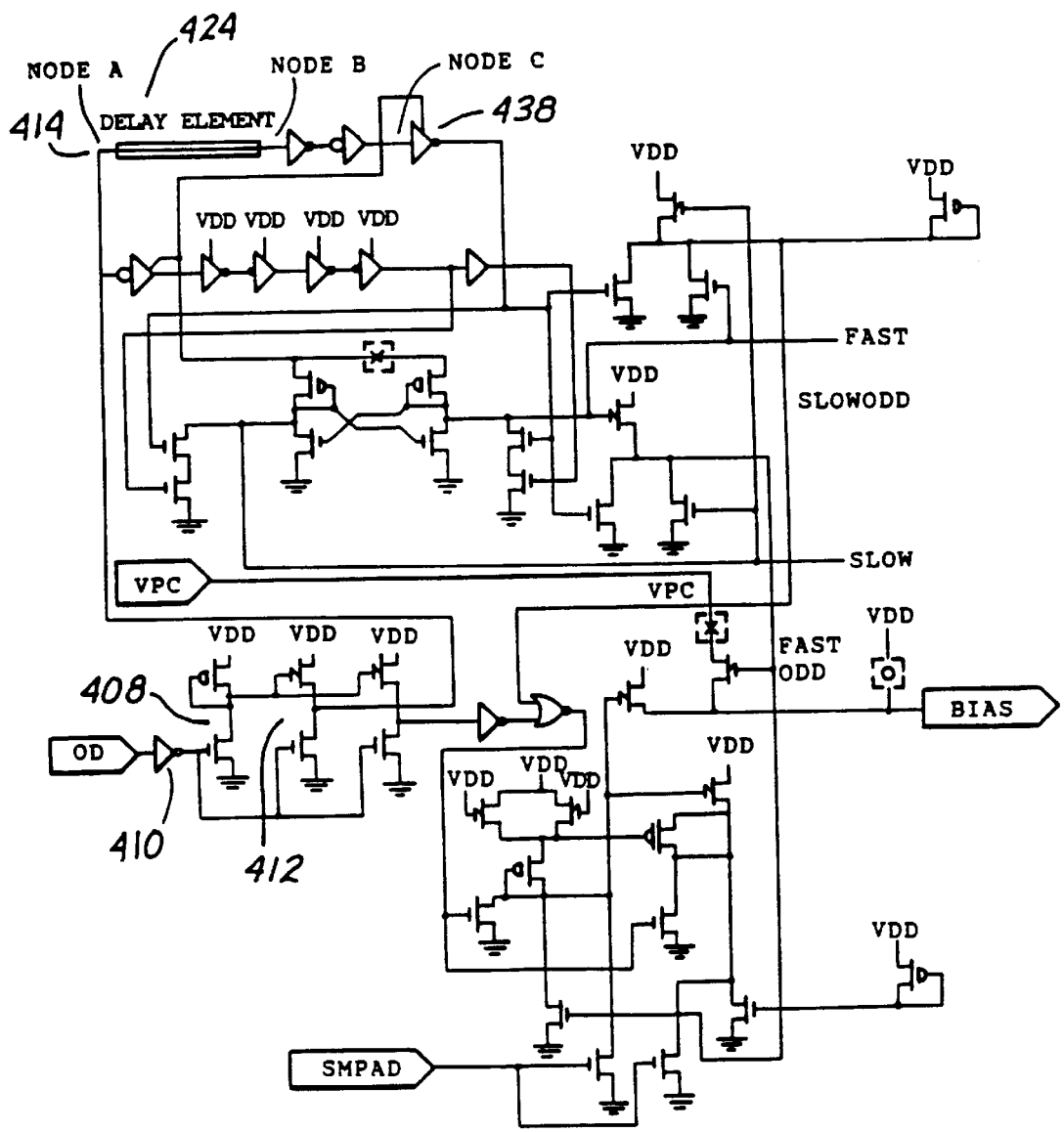
FIG. 27 is a prior art timing circuit.
Figure 28:
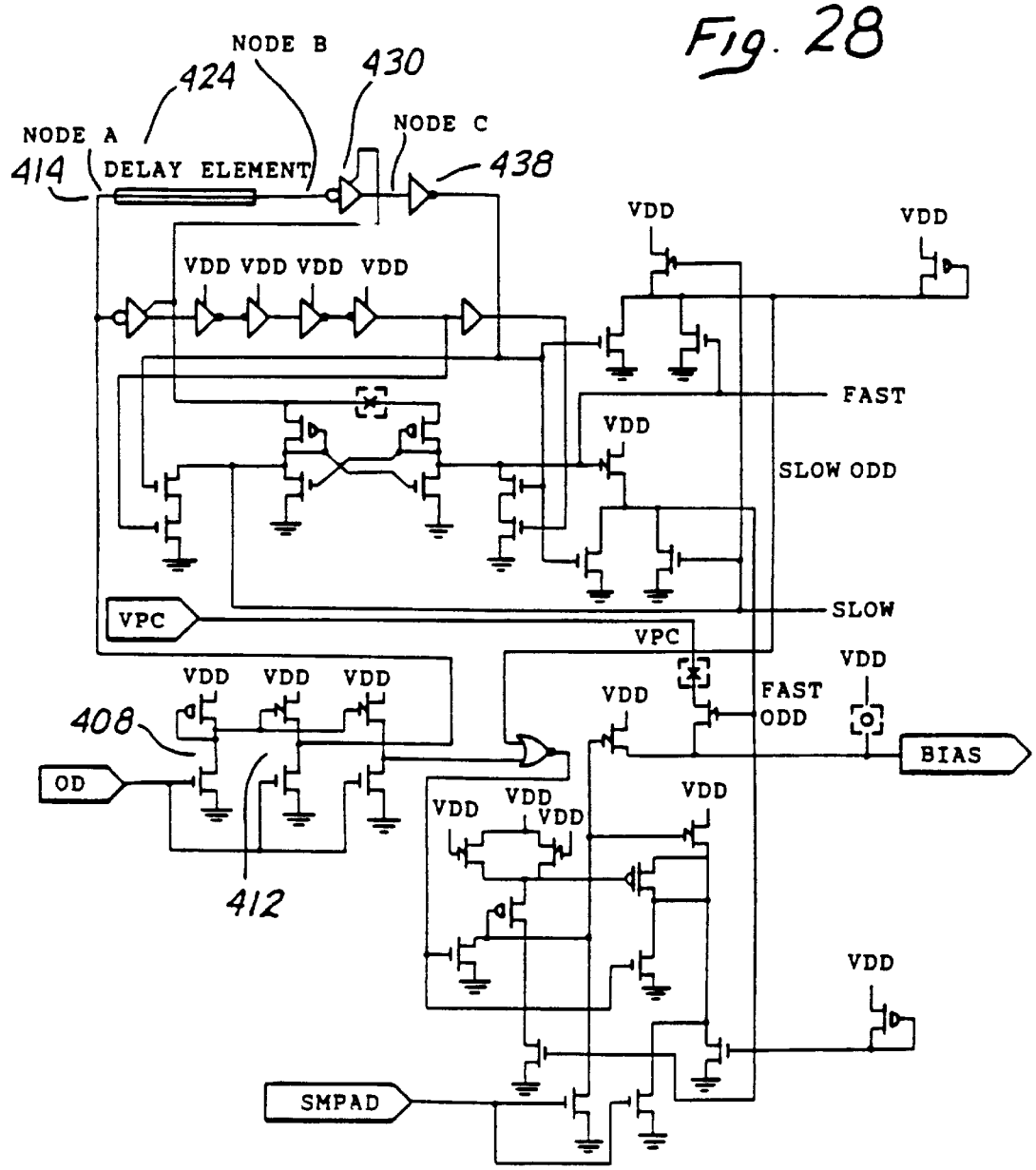
FIG. 28 is a timing circuit operated according to the invention and is compared to the operation of the prior art timing circuit of FIG. 27.

The invention is illustrated in one example by the comparison of the method operated according to the prior art circuit of FIG. 27 as opposed to the current invention as operated in the circuit of FIG. 28, each having the respective timing diagrams shown in FIGS. 29 and 30 respectively. The initiating timing signal, OD, is input to a first inverter 408 in embodiment of FIG. 28 and through an input inverter 410 to first inverter 408 in the prior art methodology described in connection with FIG. 27. The output of a second inverter 412 in FIGS. 27 and 28 is provided to a node A, 414 illustrated in FIGS. 27 and 28.

When initiating signal OD goes active high as shown on curves 416 in FIGS. 29 and 30 at a time T0, 418, node A, 414, will go low at a later time indicated by curve 420 in FIG. 30, while node A, 414, in FIG. 27 will go high as depicted by curve 422 in FIG. 29. The signal at node A is then propagated through an integrated circuit RC delay element 424 in FIGS. 27 and 28 whose output is designated as node B and is illustrated by curve 426 in FIG. 30 for the circuit of FIG. 28 and by curve 428 in FIG. 29 for the circuit of FIG. 27. Thus, as is evident from FIG. 30, curve 426 shows an RC time decay. Curve 428 of FIG. 29 shows an RC charging curve.

In the circuit of FIG. 28, inverter 430 will be triggered at a time TB indicated by time 432 in curve 426 of FIG. 30 when the voltage decays to the trigger point. In the prior art, the circuit of FIG. 27 inverter 434 will be triggered when the voltage reaches a threshold point at time TA 436 shown on curve 428 of FIG. 29.

The identical output point, node C, 438, in the circuitry of FIGS. 27 and 28 will thereby trigger high in response to trigger point 432, TB, as illustrated by curve 440 in FIG. 30 corresponding to circuit of FIG. 28 or as illustrated by curve 442 in FIG. 29 which is triggered high by trigger point TA 436 of curve 428 for the circuit in FIG. 27.

Therefore, as can be seen by comparing FIGS. 29 and 30, the identical input signal shown by curve 416 is processed in different ways as shown by the intermediate steps to generate the same result as shown by curves 440 and 442 in FIGS. 30 and 29 respectively, and in a substantially different manner with the result that the methodology as discussed in connection with the circuitry of FIG. 28 and depicted in FIGS. 26 and 30 provides a stable time signal based on conventional integrated circuit RC time delay elements whereas the prior art does not.

In the prior art, the voltage differential 392 shown in FIG. 25 increases as the circuit parameters due to temperature and process variations cause the circuits to become slower. This increases the time period of decay for the RC delay since the charging time constant of the charging curve of FIG. 25 is directly proportional to the voltage difference 392.

According to the invention, as temperature and process parameters cause the devices to slow, the voltage difference 402 varies even more greatly than voltage 392, but in such a way as to cancel the time variation of the integrated circuit parameters. In the slow case, the threshold voltage VTN4 and VTN3 will be at their maximum while VDD will be at its minimum. Therefore, the voltage 402 will be at its minimum.

In a situation where temperature variations and process variations cause the device speeds to increase, VTN4 and VTN3 will be at their minimum and VDD will be at its maximum so that the voltage difference 402 will be at its maximum Therefore, a time delay period will be small in slow circuits and larger in fast circuits. The reduction in time delay of the RC network then adds to the increase in time delay for the slower circuits to cancel each change in delay.

Table II summarizes the general relationship between supply voltage levels, threshold voltage levels, temperature and process variations between situations where the circuit elements are fast as opposed to when they are slow. The total circuit time is therefore the circuit time of the connected auxiliary circuits together with the circuit delay arising from the RC timing circuit as exemplified in FIGS. 27 and 28. The equations below show how the times add for fast and slow circuits in the prior art approach of FIGS. 29 and 27 as opposed to the approach of the current invention shown in FIGS. 30 and 28. The variation in the RC delay according to the invention is therefore opposite to the variation in time caused by fast or slow parameters in the associated amplifying and other circuits. With good device models and simulators, the timing circuit can be tuned to cancel a substantial portion of the oppositely varying time performance in the associated circuits, therefore, resulting in a much more stable and constant timing circuit.

TABLE II

| circuit condition | Vdd | Vth | temp | tic |
| --- | --- | --- | --- | --- |
| FAST | max | min | min | min |
| SLOW | min | max | max | max | where tic is the time delay of the integrated circuit.

Total circuit time=tic+K/RC (Vdd−Vth4−Vth3);
as compared to the conventional circuit of
Total prior art circuit time=tic+K/RC (Vth1);
Therefore,
total circuit time=(min)+K/RC (max−min−min) for the fast case; or
total circuit time=(max)+K/RC (min−max−max) for the slow case.
This compares to the prior art circuit as:
total circuit time=(min)+K/RC (min) for the fast case; or
total circuit time=(max)+K/RC (max) for the slow case.

FIG. 31 represents another circuit for producing SURG described above in which the same methodology is used. For purposes of comparison, same nodes A, B and C have been referenced in FIG. 31 whose operation is identically described by the timing diagram of FIG. 30. Note that in this case the falling edge of OD and an extra inverter are used to produce the same nodes A, B, and C. The methodology of the invention can be employed both in NMOS circuits such as shown in FIGS. 27 and 28 as well as CMOS circuits.

Memory Circuit Yield Generator and Timing Adjustor

Incremental values of a plurality of capacitors are programmably coupled through ROM core FETs with selective threshold voltages, EPROM core FETs, RAM cells, ROM fuse links or antifuse ROM links to a dummy bit line. The dummy bit line carries a bit line voltage to simulate either the worst case logical one or worst case logical zero within a read-only memory array of memory cells. The dummy bit line voltage is used as a control signal to a trigger circuit. The trigger circuit generates at the appropriate threshold a triggering signal used to control sense amplifiers coupled to the memory circuit. Therefore, by programmably altering the delay time on the dummy bit line, the read cycle of the memory can be programmably altered to either minimize the read time cycle to provide a fast, high quality memory product, or to maximize the read time cycle to provide for a slower but higher yield memory product at less expense.

The use of programmable capacitors incrementally included within a circuit is well known and has been used in circuits such as analog to digital converters. However, never before has programmable capacitors been used to adjust or tune the critical timing functions within a memory circuit to a customer's requirement so that the sense timing period is particularized. The sense timing period is defined as the time after which all conditions are set up for memory operation and before the sense amplifier is instructed to attempt to resolve the presented voltages to determine whether one or zero was read. Previously, these time elements were adjusted or traded off manually when the circuit was initially designed and thereafter only rarely in any attempt to fine tune a circuit to particular specification. There was no prior art attempt to program or adjust a specific product to an application in any fashion that allowed its universal or automated adjustment.

The circuit uses graduated capacitor sizes to vary the sense time period in a memory circuit in order to adjust the time allotted in the memory cycle for the bit line voltage drive either to minimize this time to provide a fast, high quality memory product, or to increase the time for a slower memory product which has higher yield and, therefore, less cost.

The circuit allows for adjustment in a particular memory application, but also uses the device through which the programmability is implemented, such as the ROM core FET, EPROM core FET, or RAM cell ROM fuse link or antifuse ROM element, to allow the speed and yield tradeoff to be made at the time of manufacture or even in a final product inside the application device so that the customer's product may be more optimally matched without any increase in the number of memories which need to be inventoried.

The invention is a means through which chip manufacturers may add or subtract specific increments of time to or from a memory sense cycle to improve the sense amplifier resolution and, therefore, the device yield by providing more settling time, or may improve the speed specification of the product with less settling time and consequently less yield depending upon the specifications of the circuit and cost requirements. The circuit thereby provides a programmable automated adjustment to tailor the memory cycle periods to the particular specifications or customer's needs for the memory product.

Figure 32:
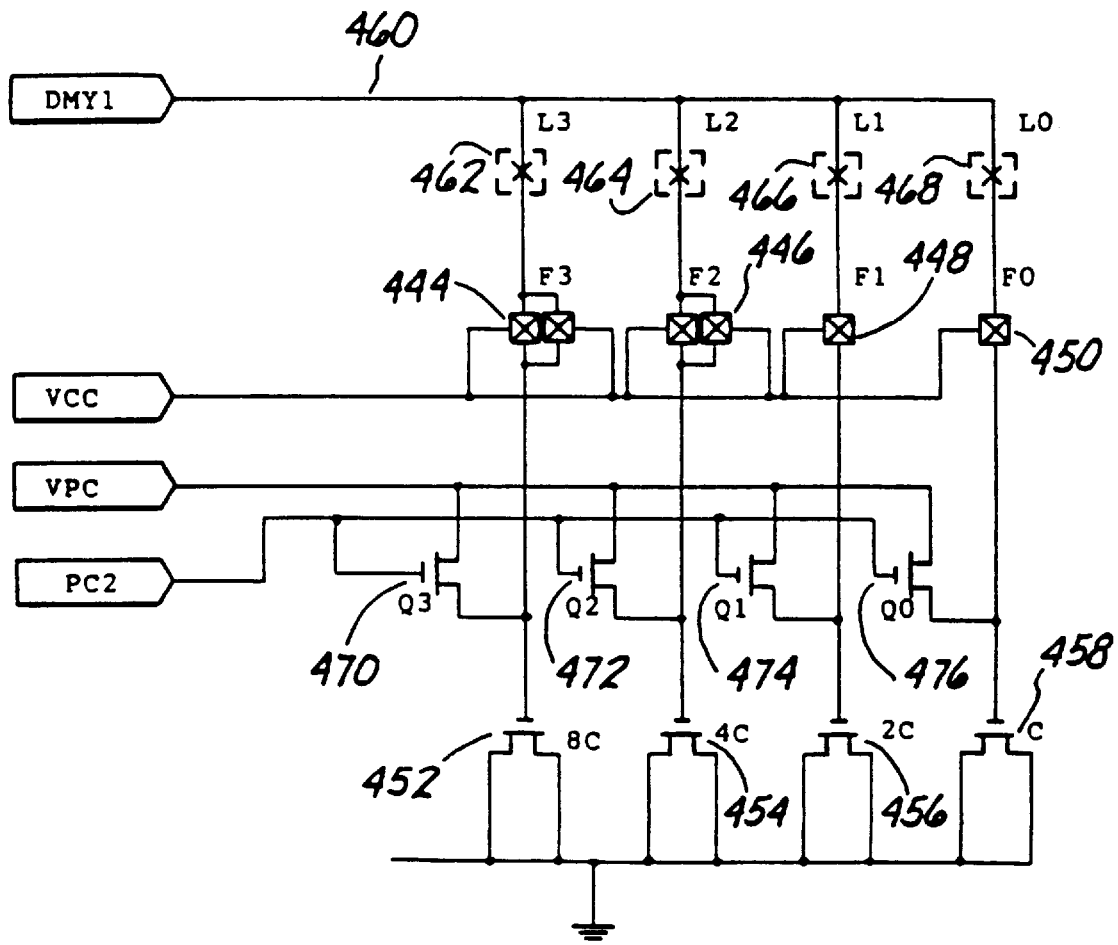
FIG. 32 is a schematic of Y-delay generating circuit for programmably inserting variable capacitances and, therefore, delays on selected nodes within the memory circuit.

Turn now to FIG. 32 which is a schematic of a circuit used in the invention. The circuit of FIG. 32 provides for varying sizes of capacitors of incremental values such as doubling multiples of a base value, C, shown in FIG. 32 as capacitances C, 2C, 4C, 8C. The method provides a means of programmably coupling the capacitances into a portion of the circuit which determines the delay time. The methodology depicted in FIG. 32 may be employed either using fusible or laser cuttable metal straps, or programmable transistors along with circuitry to set the capacitor voltage level to an optimum starting point for circuit operation.

The specification of the maximum memory access time of a semiconductor memory must be made by the customer at the time the memory is ordered or specified. Choice of memory access times is performed in the art by choosing from a variety of access time specification ranges which are compatible with other portions of the circuitry. The largest maximum access time possible with that which would reliably allow the final product to operate to the customer's specification is selected. However, the maximum access time selected must not be so excessively long as to increase production costs which typically varies inversely with the specified maximum memory access time of the memory product. The amount of additional time beyond a minimum set time for a particular memory product is determined and added to the sense period of the memory cycle. Also the access time must not be so long as to exceed the specification for typical operating conditions given allowable process tolerance variations and operating drift. The various combinations of capacitances are selected and coupled to the time sensitive node within the circuitry to establish the sense time.

In other embodiments, the memory time period may be varied by varying the sizes of certain field effect transistors in the time generating circuit or trigger circuit. However, variation of FET sizes do not have the advantage of being programmable as is proposed in the preferred embodiment.

The general approach to the problem now having been described, turn specifically and consider the operation of the circuit of FIG. 32. FETs 444–450 are transistors which allow for programming the memory of integrated circuit capacitive elements 452–458. The capacitances of these elements are coupled to, for example, a memory node 460, denoted as DMY1. Links 462–468 are shown as an alternative embodiment as comprising laser cuttable or fusible links to perform a function similar to FETs 444–450 respectively. FETs 444–450 and/or links 462–468 allow selective connection of the insertable elements to the desired node by either implanting at threshold voltages to a high voltage level or off, or not implanting them and leaving their threshold voltages low or on. The combination of different programmable elements can be used in the circuit of FIG. 32 although in any practical embodiment, only one single type will be chosen. In a read-write (RAM) memory, FETs 444–450 would typically not be programmable, but would be driven by the output of an addressable RAM register latch or links 462–468 would be used without FETs 440–450.

Transistors 470–476 are preconditioning transistors coupled to the capacitor plate voltages prior to the memory cycle operation. Transistors 470–476 are controlled through their gates by precharge control voltage PC2 to couple the precharge voltage, VPC, to the capacitive elements 452–458. FETs 444–450, in turn, are coupled to the supply voltage Vcc and are held either in the off or on state depending upon their programmed threshold voltage.

Table III below shows the delay times which can be set on node 460 depending upon the programmed states of FETs 444–450.

TABLE III

| F3 | F2 | F1 | F0 | time delay |
|----|----|----|----|------------|
| X  | X  | X  | X  | 0 RC + RCo |
| X  | X  | X  | 0  | 1 RC + RCo |
| X  | X  | 0  | X  | 2 RC + RCo |
| X  | X  | 0  | 0  | 3 RC + RCo |
| ... | | | | |
| ... | | | | |
| ... | | | | |
| 0  | 0  | 0  | X  | 14 RC + RCo |
| 0  | 0  | 0  | 0  | 15 RC + RCo | where
0 = programmed as a short;
X = programmed as an open circuit;
R is the resistance of the charging path of the node DMY1; and Co is the inherent capacitance on the node DMY1.

Figure 33:
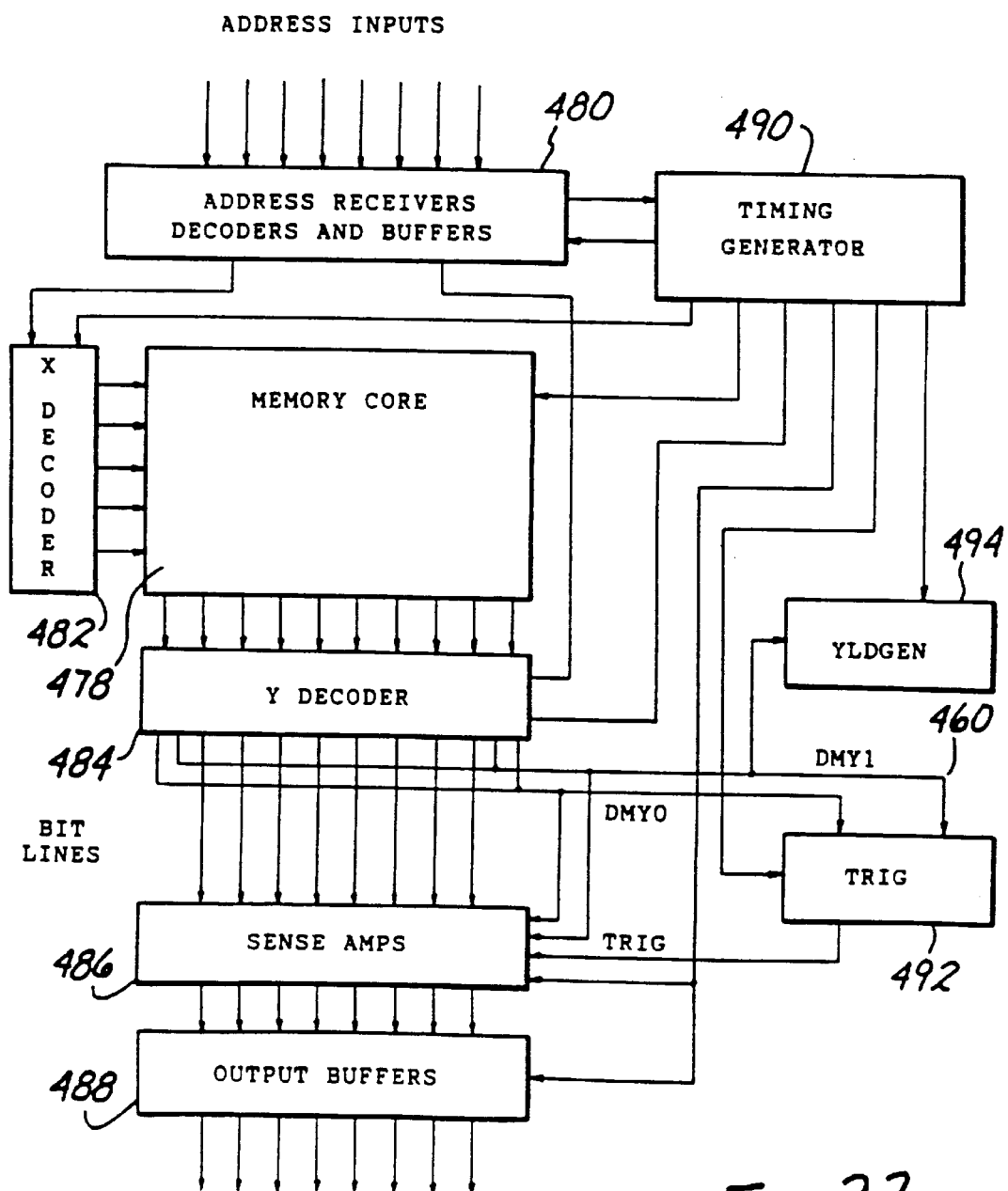
FIG. 33 is an overall block diagram of a memory circuit utilizing the Y-delay circuit of FIG. 32.

FIG. 33 is an overall block diagram of a memory circuit utilizing the invention of FIG. 32. The memory includes a memory core 478 which is accessed through address receivers, decoders and buffers 480. The address inputs from circuits 480 are coupled to an X-decoder 482 and Y-decoder 484. Data accessed in memory core 478 is output to a sense amplifier 486 and then to output buffers 488. Timing of the memory access cycle is determined through a plurality of timing control signals generated by a timing generator 490 whose various outputs are coupled to each of the circuit elements in FIG. 33.

Memory core 478 is appropriately sensed or read out by utilizing at least two dummy lines, DMY0 and DMY1, to accommodate for device leakage, capacitor loading, transistor characteristics and other artifacts which occur in a real integrated circuit memory. The dummy lines or nodes are coupled to a trigger circuit 492. The output of the trigger circuit, in turn, provides an appropriately timed trigger output signal to sense amplifier 46 to indicate when the memory 478 can be properly read.

As shown in FIG. 33, one of the dummy lines, in this case chosen as DMY1, is coupled to memory device circuit 494 so that the capacitance and hence time delay which is seen by trigger circuit 492 is programmably determined by means described in connection with the circuit of FIG. 32. Yield generator circuit 494 inserts a programmable amount of capacitance onto the DMY1 node 460. The voltage difference between DMY1 and DMY0 nodes represents the best approximation of the worst possible voltage differential between a logically programmed one and a logically programmed zero in memory array 478. Trigger circuit 492 generates a sense amplifier trigger pulse, TRIG, when this voltage differential reaches a predetermined magnitude. This predetermined magnitude provides a yield enhancing noise margin to the sense amplifier operation. The worst bit line voltages for a logical one will be below the DMY1 line, while worst bit line voltage for a logical zero will be above the DMY0 line. The sense amplifier is constructed such that the resultant demarcation point is approximately half way between the DMY0 and DMY1 voltages.

The original memory design of the prior art only provided the predetermined minimum voltage margin for adequate sense amplifier resolution between a one and zero. However, the present invention adds small capacitances to DMY1 so that the apparent worst logical one is delayed by an additional time, dT, so that an additional voltage margin, dV, between the worse case programmed one and programmed zero is generated with most of the margin favoring a programmed one.

Figure 34:
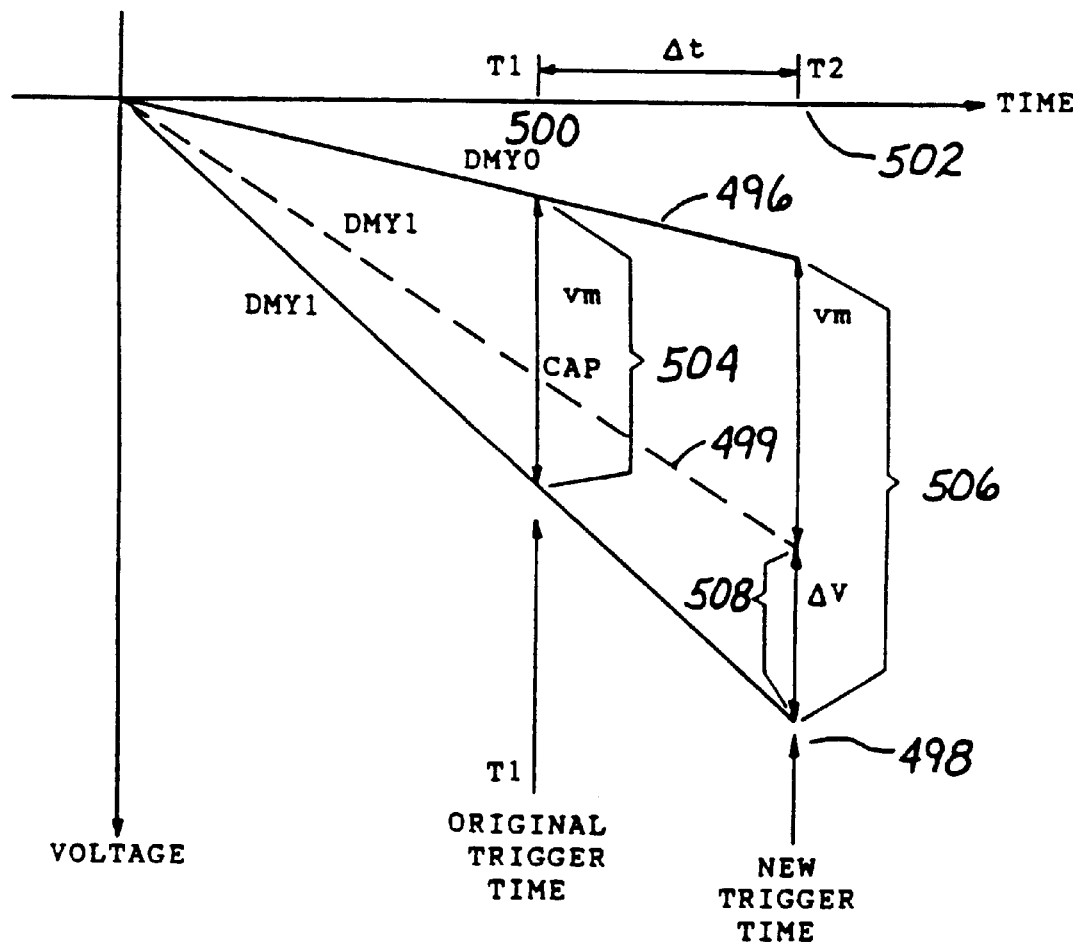
FIG. 34 is a voltage timing diagram illustrating the effect when additional capacitance is added to the dummy line DMY1.

This point is best illustrated in the graph of FIG. 34 wherein voltage is plotted against time. The DMY0 line as a function of time is graphed as line 496. The DMY1 node is graphed on line 498. The original trigger point is at the time T1 denoted by point 500. By delaying a time period of dT to the time period T2, labelled as point 502, the voltage differential between the DMY0 and DMY1 lines increases from the differential denoted by the interval 504 to the larger interval denoted by reference numeral 506.

In the circuit of FIG. 33, DMY1 and DMY0 represent as accurately as is practical, the worst (highest voltage) programmed logical one and the worst (lowest voltage) programmed logical zero, respectively. It can thus be understood that the additional time dT allows the bit line which is programmed for logical one to have an additional voltage margin similar to the added voltage margin indicated by the reference numeral 508 in FIG. 34 for the DMY1 node.

To improve circuit matching and balancing, a similar device is added to the DMY0 node and is programmed identically by yield generator 494 in FIG. 33. This improvement not only provides for better balancing of the circuit, but also provides a means to add noise damping capacitance to the DMY0 node which can be very noise sensitive.

FIG. 35 is a time graph of voltage similar to that of FIG. 34 wherein the effect of providing a similar programmable capacitance to the DMY0 node is illustrated. In this situation, curve 510 represents the delay curve for the DMY0 line after additional capacitance has been added to the node. This causes a shortening of the delay time to a time T3 indicated by point 512 which improves the read access time of the ROM by the same amount. The margin for a logic one is indicated by dV1. Adding capacitance on DMY0 reduces the voltage margin for a logic one by dV–dV1 and reduces the margin for a logic zero by the amount dV2 shown in FIG. 35.

Therefore, the invention must be understood as being usable to insert variable capacitances to any memory circuit nodes to adjust time or dampen noise as may be required by the circuit demands.

Many modifications and alterations may be made by one having ordinary skill in the art without departing from the spirit and scope of the invention. Therefore, it must be understood that the described embodiment has been set forth only for the purposes of illustration and example and should not be read to limit or restrict the invention which is defined by the following claims. The claims are to be construed not only to include the reasonable scope of the literal meaning of the words and terms used therein, but also to include elements not literally included if those elements are in whole or in part equivalent to the claims as a whole, elements in the claims, or subcombinations of elements in the claims. The claims are thus to be interpreted as equitably including all other embodiments which in essence incorporate the novel concept of the claims.

We claim:

1. An improvement in a semiconductor memory having a dummy bit line, DMY1, having memory cells, having a sense time when said memory cells will be read, and simulating the worst case within said memory for reading a logical one, comprising:

means for providing a plurality of selectable capacitors; and programmable means for selectively coupling said capacitors to said dummy bit line DMY1 so that sense time within said semiconductor memory is programmably varied, said dummy bit line, DMY1, being coupled to said semiconductor memory to determine said sense time when memory cells within said semiconductor memory will be read, wherein said programmable means comprises a plurality of links, said links having a programmably determined conductivity, one of said programmable links being coupled to each one of said capacitors to selectively couple said corresponding capacitor to said dummy bit line, DMY1.

2. An improvement in a semiconductor memory of the type having a dummy bit lines simulating worst cases for reading a logical one and for reading a logical zero, the improvement comprising:

means for adjusting a rate of voltage change in a logical one dummy bit line;

means for dampening noise in a logical zero dummy bit line; and means for controlling a read time cycle of the semiconductor memory in response to a comparison between the logical one dummy bit line and the logical zero dummy bit line.

3. The improvement of claim 2, wherein the means for adjusting comprises:

means for providing a plurality of selectable capacitors; and programmable means for selectively coupling said capacitors to said logical one dummy bit line.

4. The improvement of claim 2, wherein the means for dampening comprises:

means for providing a plurality of selectable capacitors; and programmable means for selectively coupling said capacitors to said logical zero dummy bit line.

* * * * *